(12) United States Patent
Fujimori

(10) Patent No.: US 7,235,341 B2
(45) Date of Patent: Jun. 26, 2007

(54) POSITIVE RESIST COMPOSITION

(75) Inventor: Toru Fujimori, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/388,408

(22) Filed: Mar. 17, 2003

(65) Prior Publication Data

US 2003/0224287 A1    Dec. 4, 2003

(30) Foreign Application Priority Data

Mar. 18, 2002    (JP) .............................. 2002-074565

(51) Int. Cl.
*G03C 1/73*    (2006.01)
*G03F 7/039*    (2006.01)

(52) U.S. Cl. ................... 430/270.1; 430/326; 430/907; 430/910

(58) Field of Classification Search ............ 430/270.1, 430/326, 905, 907, 910, 914
See application file for complete search history.

(56) References Cited

U.S. PATENT DOCUMENTS

| | | | | |
|---|---|---|---|---|
| 5,369,095 | A | * | 11/1994 | Kee et al. ..................... 514/24 |
| 6,071,670 | A | * | 6/2000 | Ushirogouchi et al. .. 430/270.1 |
| RE37,179 | E | * | 5/2001 | Yamachika et al. ......... 430/191 |
| 6,309,795 | B1 | * | 10/2001 | Abe et al. ................ 430/285.1 |
| 6,410,802 | B1 | * | 6/2002 | Dasseux et al. ............ 568/680 |
| 2001/0026901 | A1 | | 10/2001 | Maeda et al. |

FOREIGN PATENT DOCUMENTS

| | | |
|---|---|---|
| EP | 1 099 983 A1 | 5/2001 |
| EP | 1 136 885 A1 | 9/2001 |
| JP | 07-225480 A | 8/1995 |
| JP | 9-222724 A | 8/1997 |
| JP | 2000-298349 A | 10/2000 |
| JP | 2001-083709 A | 3/2001 |
| JP | 2002-006492 A | 1/2002 |
| JP | 2002-023369 A | 1/2002 |

OTHER PUBLICATIONS

European Search Report dated Jun. 11, 2003.
High Performance Acrylic Polymers for Chemically Amplified Photoresist Applications—Robert D. Allen, Gregory M. Wallraff and William D. Hinsberg—J. Vac. Sci. Technol. B 9 (6). Nov. Dec. 1991 pp. 3357-3361.

* cited by examiner

*Primary Examiner*—Sin Lee
(74) *Attorney, Agent, or Firm*—Sughrue Mion, PLLC

(57) ABSTRACT

A positive resist composition comprising: (A) a compound capable of generating an acid on exposure to active light rays or a radiation; (B) a resin which is insoluble or sparingly soluble in an alkali and becomes alkali-soluble by an action of an acid; and (D) an acyclic compound having at least three groups selected from a hydroxyl group and a substituted hydroxyl group.

13 Claims, No Drawings

POSITIVE RESIST COMPOSITION

FIELD OF THE INVENTION

This invention relates to a positive resist composition used in fabrication of semiconductor devices, e.g., ICs, fabrication of circuit wiring boards for liquid crystals, thermal heads, etc., and other photofabrication techniques. More particularly, it relates to a positive resist composition which is adapted to be exposed to far ultraviolet rays of 250 nm or shorter wavelengths, electron beams, and the like.

BACKGROUND OF THE INVENTION

A chemically amplified positive-working resist composition is a patterning material which generates an acid on exposure to an radiation, such as far ultraviolet light, undergoes acid-catalyzed reaction to create a change in solubility in a developing solution between the exposed area and the non-exposed area thereby to form a pattern on a substrate.

A photosensitive system designed to be exposed to light from a KrF excimer laser mainly comprises a resin having a polyhydroxystyrene skeleton which exhibits a small absorption primarily at 248 nm. It is a better system than a conventional naphthoquinonediazide/novolak resin system, enjoying high sensitivity, high resolution, and satisfactory patterning performance.

When a light source of shorter wavelength, e.g., an ArF excimer laser (193 nm), is used as an exposure source, however, the above-described chemically amplified system is insufficient because the compound having an aromatic group essentially exhibits a large absorption at 193 nm.

Use of poly(meth)acrylate as a polymer having a small absorption at 193 nm is reported in J. Vac, Sci. Technol., B9, 1991, 3357. This polymer is disadvantageous in that it has lower resistance to dry etching generally involved in semiconductor device fabrication than conventional phenolic resins having an aromatic group.

To cope with the ever increasing demands for finer patterning and higher throughput, it has now come to be important to reduce exposure errors. Conventional resists have narrow exposure latitude and considerable line edge roughness (LER), which have been a bar to increase the throughput. Further, with the recent trend toward finer dimensions of resist patterns, collapse of a resist pattern has become problematic due to a high aspect ratio of height to width of resist lines. The pattern collapse problem is particularly conspicuous with resists designed for ArF, electron beam (EB), vacuum ultraviolet (UVU) or extreme ultraviolet (EUV) radiations. The term "pattern collapse" as used herein is intended to include any pattern collapse phenomena irrespective of the causes, for example, insufficient adhesion and insufficient film strength.

SUMMARY OF THE INVENTION

An object of the present invention is to provide a positive resist composition capable of providing a resist pattern with reduced LER.

Another object of the present invention is to provide a positive resist composition capable of providing a resist pattern with minimized collapse, particularly a pattern that does not collapse even with variations of focus and exposure in micro-patterning.

The above objects are accomplished by the following positive resist composition provided by the present invention.

(1) A positive resist composition comprising (A) a compound capable of generating an acid on exposure to active light rays or a radiation, (B) a resin which is insoluble or sparingly soluble in an alkali and becomes alkali-soluble by the action of an acid, and (D) an acyclic compound having at least three groups selected from a hydroxyl group and a substituted hydroxyl group.

The present invention embraces the following compositions as preferred embodiments of the composition set forth in (1) above.

(2) A positive resist composition according to (1), wherein the resin (B) has at least one phenolic hydroxyl group structure and decomposes by the action of an acid to increase its solubility in an alkali developing solution.

(3) A positive resist composition according to (1), wherein the resin (B) has a monocyclic or polycyclic alicyclic hydrocarbon structure and decomposes by the action of an acid to increase its solubility in an alkali developing solution.

(4) A positive resist composition according to (1), wherein the resin (B) has a structure containing a fluorine atom substituting at least one of the main chain and the side chain of the polymer skeleton and decomposes by the action of an acid to increase its solubility in an alkali developing solution.

(5) A positive resist composition according to any one of (1) to (4), wherein the acyclic compound (D) is an acyclic saccharide derivative.

(6) A positive resist composition according to any one of (1) to (5), which further comprises (C) a basic compound.

(7) A positive resist composition according to any one of (1) to (6), which further comprises (E) a surface active agent containing at least one of fluorine and silicon.

(8) A positive resist composition according to any one of (1) to (7), which further comprises (F) a mixed solvent comprising a solvent having a hydroxyl group and a solvent free from a hydroxyl group.

DETAILED DESCRIPTION OF THE INVENTION

The positive resist composition of the invention contains a compound capable of generating an acid on exposure to active light rays or a radiation (hereinafter referred to as a photo-acid generator) as component (A).

The photo-acid generator as component (A) is appropriately selected from known compounds and mixtures capable of generating an acid on exposure to active light rays or radiations, which have been used as photo initiators for photo-cationic polymerization, photo initiators for photo-radical polymerization, photobleaching agents for dyes, photo-discoloring agents, compounds used in microresists, and the like. Examples of useful photo-acid generators include onium salts, such as diazonium salts, ammonium salts, phosphonium salts, iodonium salts, sulfonium salts, selenonium salts, and arsonium salts; organic halogen compounds; organometallic/organohalogen compounds; photo-acid generators having an o-nitrobenzyl type protective group; compounds generating sulfonic acid on photolysis which are represented by iminosulfonates; and disulfone compounds.

Polymers having the acid generating compound recited above or an acid-generating group derived therefrom in the main or side chain thereof are also useful as component (A). Examples of such polymeric photo-acid generators are given in U.S. Pat. No. 3849,137, German Patent 3914407, JP-A-63-26653, JP-A-55-164824, JP-A-62-69263, JP-A-63-

146038, JP-A-63-163452, JP-A-62-153853, and JP-A-63-146029. The photo-acid generating compounds disclosed in U.S. Pat. No. 3,779,778 and EP 126,712 are also useful.

Of the above-recited photo-acid generators (A), the following four groups of compounds (A1) to (A4) are particularly effective.

(A1) Iodonium salts represented by formula (PAG1) and sulfonium salts represented by formula (PAG2):

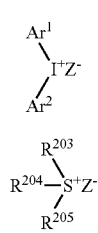

wherein $Ar^1$ and $Ar^2$ each represent a substituted or unsubstituted aryl group; $Ar^1$ and $Ar^2$ may be connected via a single bond or a substituent; $R^{203}$, $R^{204}$, and $R^{205}$ each represent a substituted or unsubstituted alkyl group or a substituted or unsubstituted aryl group; two of $R^{203}$, $R^{204}$, and $R^{205}$ may be connected via a single bond or a substituent; Z represents a counter anion.

Preferred substituents of the substituted aryl group as $Ar^1$ and $Ar^2$ include an alkyl group, a haloalkyl group, a cycloalkyl group, an aryl group, an alkoxy group, a nitro group, a carboxyl group, an alkoxycarbonyl group, a hydroxyl group, a mercapto group, and a halogen atom.

$R^{203}$, $R^{204}$, and $R^{205}$ each preferably represent an aryl group having 6 to 14 carbon atoms or a substituted derivative thereof or an alkyl group having 1 to 8 carbon atoms or a substituted derivative thereof. Preferred substituents of the substituted aryl group include an alkoxy group having 1 to 8 carbon atoms, an alkyl group having 1 to 8 carbon atoms, a nitro group, a carboxyl group, a hydroxyl group, and a halogen atom. Preferred substituents of the substituted alkyl group include an alkoxy group having 1 to 8 carbon atoms, a carboxyl group, and an alkoxycarbonyl group.

The counter anion $Z^-$ includes, but is not limited to, $BF_4^-$, $AsF_6^-$, $PF_6^-$, $SbF_6^-$, $SiF_6^{2-}$, $ClO_4^-$, perfluoroalkanesulfonate anions (e.g., $CF_3SO_3^-$), pentafluorobenzenesulfonate anion, condensed polynucleic aromatic sulfonate anions (e.g., naphthalene-1-sulfonate anion), an anthraquinonesulfonate anion, and sulfonic group-containing dye anions.

Illustrative examples of the group (A1) compounds are shown below.

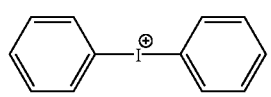
(PAG1-1)

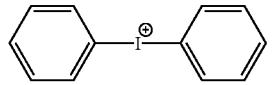

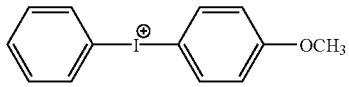
(PAG1-3)

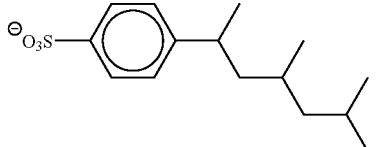

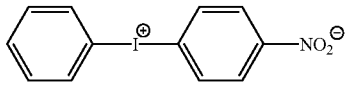
(PAG1-4)

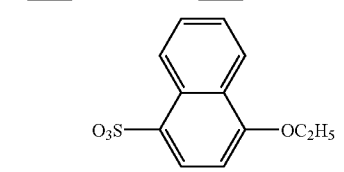

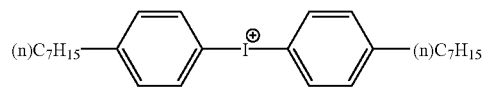
(PAG1-5)

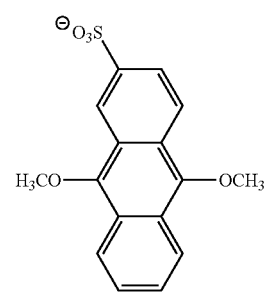

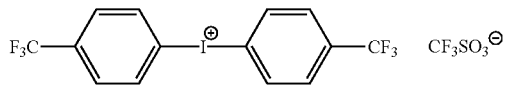
(PAG1-6)

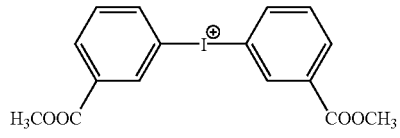
(PAG1-7)

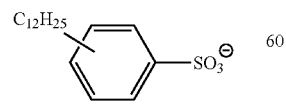

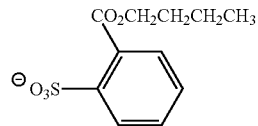
(PAG1-8)

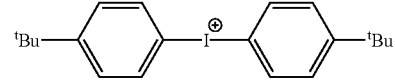

-continued (PAG1-9), (PAG1-10), (PAG1-11), (PAG1-12), (PAG1-13), (PAG1-14), (PAG2-1), (PAG2-2), (PAG2-3), (PAG2-4), (PAG2-5), (PAG2-6), (PAG2-7), (PAG2-8), (PAG2-9), (PAG2-10), (PAG2-11)

-continued
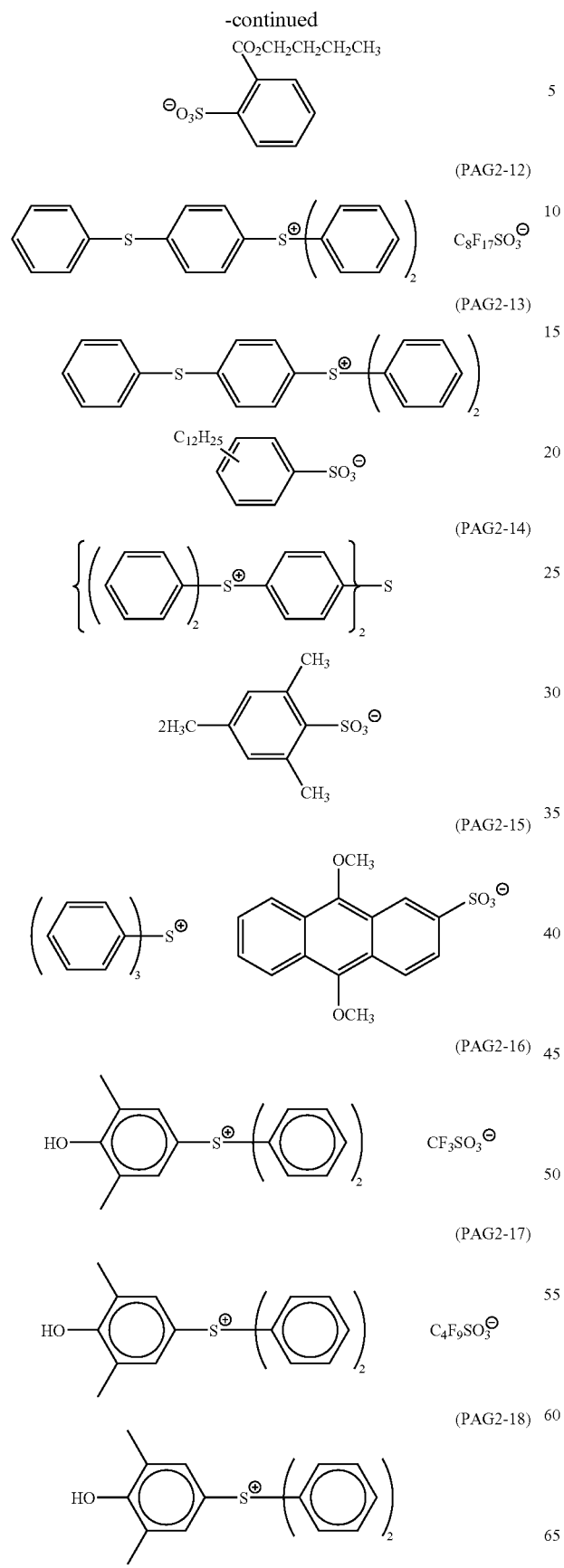
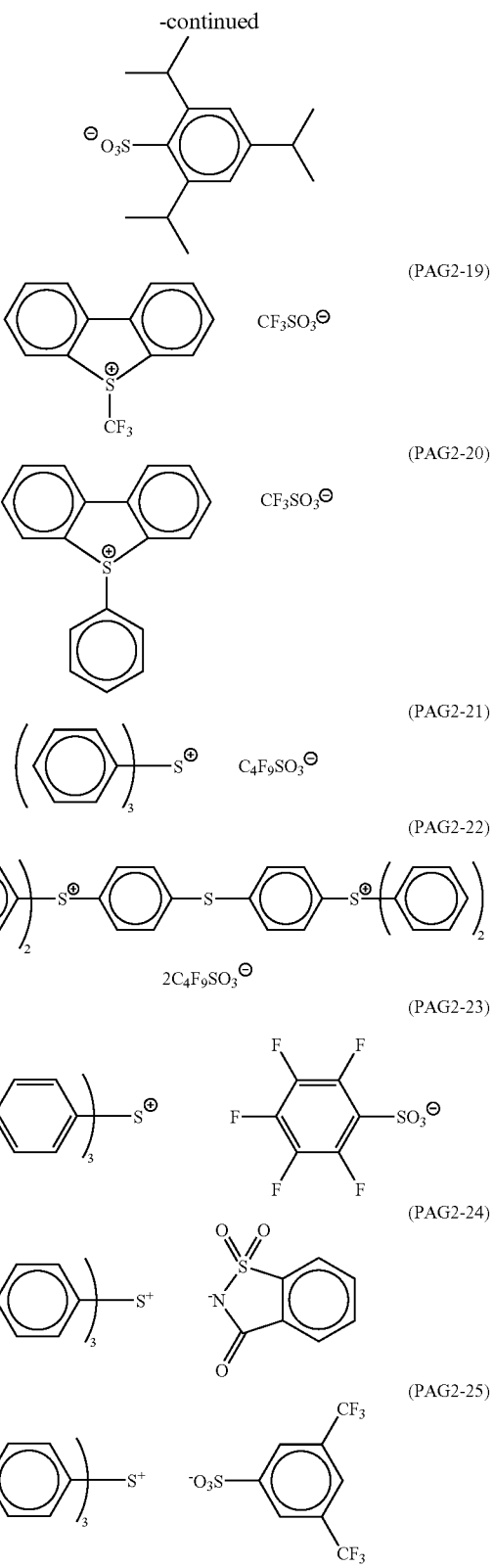
The onium salts represented by formulae (PAG1) and (PAG2) are known compounds, which can be synthesized by the processes taught in U.S. Pat. Nos. 2,807,648 and 4,247,473 and JP-A-53-101331.

(A2) Disulfonic acid derivatives represented by formula (PAG3) and iminosulfonate derivatives represented by formula (PAG4):

$$Ar^3-SO_2-SO_2-Ar^4 \quad (PAG3)$$

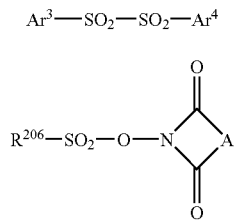
(PAG4)

wherein $Ar^3$ and $Ar^4$ each represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Illustrative examples of the group (A2) compound are listed below.

(PAG3-1)
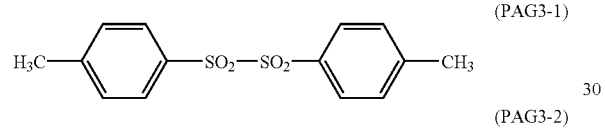

(PAG3-2)
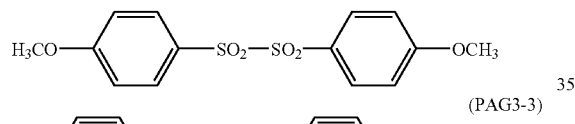

(PAG3-3)
(PAG3-4)
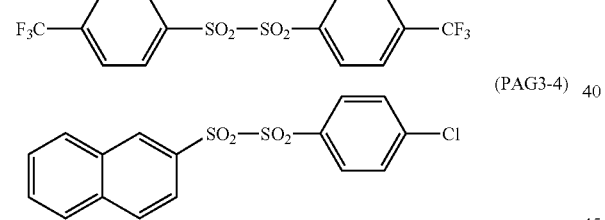

(PAG3-5)

(PAG3-6)
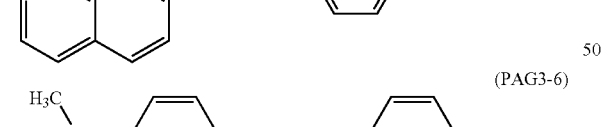

(PAG3-7)
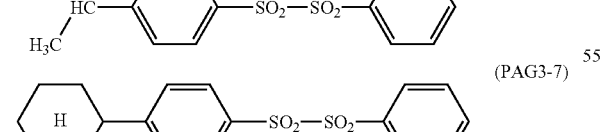

(PAG4-1)
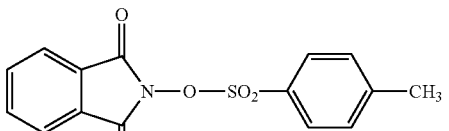

(PAG4-2)

(PAG4-3)

(PAG4-4)

(PAG4-5)

(PAG4-6)

(PAG4-7)
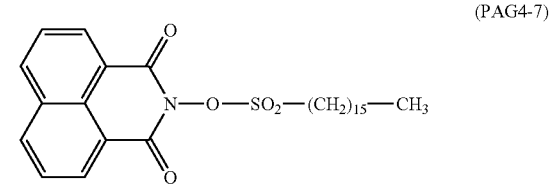

(A3) Diazodisulfone derivatives represented by formula (PAG5):

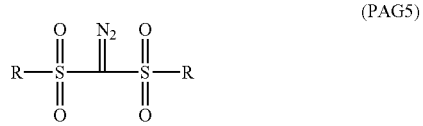
(PAG5)

wherein R represents a straight-chain, branched or cyclic alkyl group or a substituted or unsubstituted aryl group.

Illustrative examples of the group (A3) compounds are shown below.

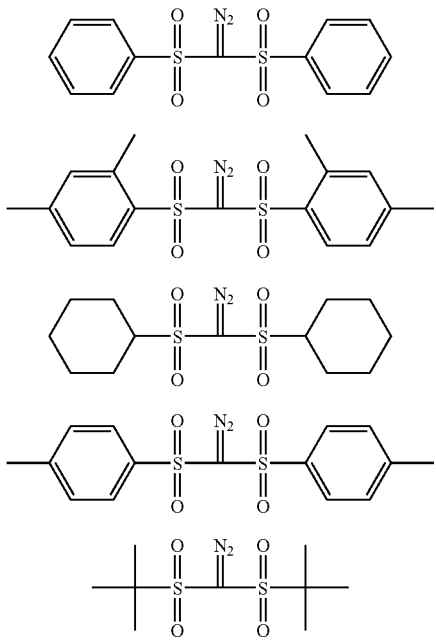

(PAG5-1)
(PAG5-2)
(PAG5-3)
(PAG5-4)
(PAG5-5)

(A4) Compounds represented by formula (PAG6):

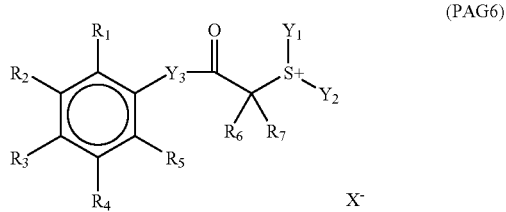

(PAG6)

wherein $R_1$, $R_2$, $R_3$, $R_4$, and $R_5$ each represent a hydrogen atom, an alkyl group, an alkoxy group, a nitro group, a halogen atom, an alkoxycarbonyl group or an aryl group; at least two of $R_1$ to $R_5$ may be taken together to form a cyclic structure; $R_6$ and $R_7$ each represent a hydrogen atom, an alkyl group, a cyano group or an aryl group; $Y_1$ and Y2 each represent an alkyl group, an aryl group, an aralkyl group or an aromatic group containing a hetero atom; $Y_1$ and $Y_2$ may be taken together to form a ring; $Y_3$ represents a single bond or a divalent linking group; $X^-$ represents a non-nucleophilic anion; provided that at least one of $R_1$ to $R_5$ and at least one of $Y_1$ and $Y_2$ are connected to form a ring, or at least one of $R_1$ to $R_5$ and at least one of $R_6$ and $R_7$ are connected to form a ring.

The compound of formula (PAG6) includes a compound having two or more structures represented by formula (PAG6) linked at any one of $R_1$ to $R_7$ or either $Y_1$ or $Y_2$ via a linking group.

The alkyl group as represented by $R_1$ through $R_7$ is a substituted or unsubstituted alkyl group, preferably one having 1 to 5 carbon atoms as unsubstituted. The unsubstituted alkyl group includes methyl, ethyl, propyl, n-butyl, sec-butyl, and t-butyl.

The alkoxy group or the alkoxy moiety of the alkoxycarbonyl group as represented by $R_1$ through $R_5$ is a substituted or unsubstituted alkoxy group, preferably one having 1 to 5 carbon atoms as unsubstituted. Examples of the unsubstituted alkoxy group are methoxy, ethoxy, propoxy, and butoxy.

The aryl group as $R_1$ to $R_7$, $Y_1$, and $Y_2$ is a substituted or unsubstituted aryl group, preferably one having 6 to 14 carbon atoms as unsubstituted. Examples of the unsubstituted aryl group are phenyl, tolyl, and naphthyl.

The halogen atom as $R_1$ to $R_5$ includes fluorine, chlorine, bromine, and iodine.

The alkyl group represented by $Y_1$ or $Y_2$ is a substituted or unsubstituted alkyl group, preferably one having 1 to 30 carbon atoms as unsubstituted. Examples of the unsubstituted alkyl group include straight-chain or branched ones, e.g., methyl, ethyl, propyl, n-butyl, sec-butyl, and t-butyl; and cyclic ones, e.g., cyclopropyl, cyclopentyl, cyclohexyl, adamantyl, norbornyl, and bornyl.

The aralkyl group as $Y_1$ or $Y_2$ is a substituted or unsubstituted aralkyl group, preferably one having 7 to 12 carbon atoms as unsubstituted. Examples of the unsubstituted aralkyl group are benzyl, phenethyl, and cumyl.

The term "aromatic group containing a hetero atom" denotes an aromatic group, such as an aryl group containing 6 to 14 carbon atoms, having a hetero atom, such as a nitrogen atom, an oxygen atom or a sulfur atom. The aromatic group containing a hetero atom as represented by $Y_1$ or $Y_2$ is a substituted or unsubstituted aromatic group containing a hetero atom. Examples of the unsubstituted one include heterocyclic aromatic hydrocarbon groups derived from, e.g., furan, thiophene, pyrrole, pyridine, and indole.

$Y_1$ and $Y_2$ may be connected together with $S^+$ to form a ring. The group formed of $Y_1$ and $Y_2$ includes an alkylene group having 4 to 10 carbon atoms, preferably butylene, pentylene, and hexylene, still preferably butylene and pentylene. The ring formed of $Y_1$, $Y_2$, and $S^+$ may contain an additional hetero atom.

Substituents of the substituted alkyl, alkoxy, alkoxycarbonyl, aryl, and aralkyl groups include a nitro group, a halogen atom, a carboxyl group, a hydroxyl group, an amino group, a cyano group, and an alkoxy group (preferably one having 1 to 5 carbon atoms). Substituents of the substituted aryl or aralkyl group further include an alkyl group (preferably one having 1 to 5 carbon atoms). The substituent of the substituted alkyl group is preferably a halogen atom.

The divalent linking group as represented by $Y_3$ includes a substituted or unsubstituted alkylene group, a substituted or unsubstituted alkenylene group, —O—, —S—, —CO—, —CONR— (wherein R is a hydrogen atom, an alkyl group or an acyl group), and a combination of two or more thereof.

The term "non-nucleophilic anion" as to $X^-$ refers to an anion having very low nucleophilic reactivity and therefore capable of inhibiting intramolecular nucleophilic reaction-induced decomposition with time. The resist exhibits improved stability with time in the presence of such a non-nucleophilic anion. The non-nucleophilic anion as $X^-$ includes sulfonate anions and carboxylate anions.

The sulfonate anions include alkylsulfonate anions, arylsulfonate anions, and camphorsulfonate anions. The carboxylate anions include alkylcarboxylyate anions, arylcarboxylate anions, and aralkycarboxylate anions.

The alkyl moiety in the alkylsulfonate anions is preferably one containing 1 to 30 carbon atoms, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantyl, norbornyl, or bornyl. The aryl moiety in the arylsulfonate anions is preferably one containing 6 to 14 carbon atoms, such as phenyl, tolyl or naphthyl.

The alkyl or the aryl moiety in the alkylsulfonate anions and the arylsulfonate anions may have a substituent. Examples of the substituent are a halogen atom, an alkyl group, an alkoxy group, and an alkylthio group. The halogen atom includes chlorine, bromine, fluorine, and iodine. The alkyl group is preferably one having 1 to 15 carbon atom, such as methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl or eicosyl. The alkoxy group is preferably one having 1 to 5 carbon atoms, such as methoxy, ethoxy, propoxy or butoxy. The alkylthio group is preferably one having 1 to 15 carbon atoms, such as methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio or eicosylthio. These alkyl, alkoxy or alkylthio groups may be substituted with a halogen atom, preferably a fluorine atom.

The alkyl moiety in the alkylcarboxylate anions include those recited above as for the alkyl moiety in the alkylsulfonate anions. The aryl moiety in the arylcarboxylate anions include those recited above as for the aryl moiety in the arylsulfonate anions. The aralkyl moiety in the aralkylcarboxylate anions is preferably one having 6 to 12 carbon atoms, such as benzyl, phenethyl, naphthylmethyl or naphthylethyl.

The alkyl moiety, aryl moiety, and aralkyl moiety in the alkylcarboxylate anions, arylcarboxylate anions, and aralkylcarboxylate anions may have a substituent. The substituent includes the same halogen, alkyl, alkoxy and alkylthio substituents as recited as for the arylsulfonate anions.

Further included in the non-nucleophilic anions are a fluorophosphate anion, a fluoroborate anion, and a fluoroantimonate anion.

In formula (PAG6), at least one of $R_1$ to $R_5$ and at least one of $Y_1$ and $Y_2$ are connected to form a ring, or at least one of $R_1$ to $R_5$ and at least one of $R_6$ and $R_7$ are connected to form a ring. Because the ring structure fixes the steric configuration, the compound of formula (PAG6) exhibits improved photolytic properties.

Two or more structures represented by formula (PAG6) may be linked at any one of $R_1$ to $R_7$ or either $Y_1$ or $Y_2$ via a linking group.

The compound of formula (PAG6) is preferably represented by formula (PAG6A) or (PAG6B):

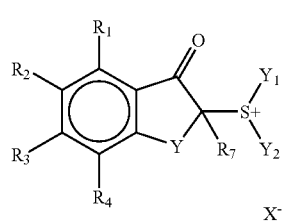

(PAG6A)

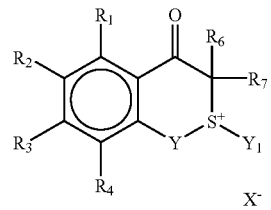

(PAG6B)

wherein $R_1$, $R_2$, $R_3$, $R_4$, $R_7$, $Y_1$, $Y_2$, and $X^-$ are as defined above; and Y represents a single bond or a divalent linking group.

In formulae (PAG6A) and (PAG6B), the divalent linking group as Y preferably includes a substituted or unsubstituted alkylene group, a substituted or unsubstituted alkenylene group, —O—, —S—, —CO—, —CONR— (wherein R is a hydrogen atom, an alkyl group or an acyl group), and a combination of two or more thereof.

In formula (PAG6A), Y preferably represents an alkylene group, an oxygen-containing alkylene group or a sulfur-containing alkylene group, such as methylene, ethylene, propylene, —CH$_2$—O— or —CH$_2$—S—, particularly a linking group forming a 6-membered ring, such as ethylene, —CH$_2$—O— or —CH$_2$—S—. When the Y-containing ring in formula (PAG6A) is a 6-membered ring, the angle between the carbonyl plane and the C—S$^+$ sigma bond is closer to a right angle so that the photolysis efficiency is improved by orbital interaction.

The compound represented by formula (PAG6A) can be synthesized by reacting a corresponding a-halo cyclic ketone and a sulfide compound or converting a corresponding cyclic ketone to a silyl enol ether, which is then reacted with a sulfoxide. The compound of formula (PAG6B) is obtained by reacting an aryl alkyl sulfide with an α- or β-halogenated compound.

Specific but non-limiting examples of the group (A4) compounds are shown below.

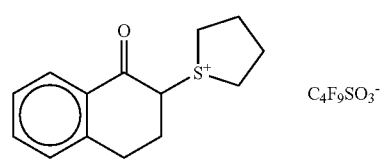

(PAG6A-1)

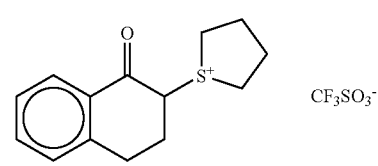

(PAG6A-2)

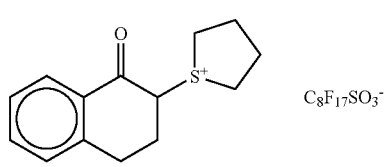

(PAG6A-3)

-continued
(PAG6A-4)
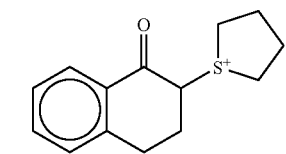 C$_2$F$_5$—O—C$_2$F$_4$SO$_3^-$
(PAG6A-5)
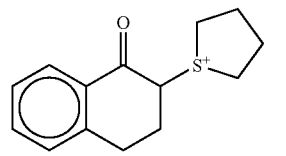 CF$_3$CHFCF$_2$SO$_3^-$
(PAG6A-6)
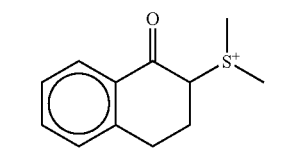 C$_4$F$_9$SO$_3^-$
(PAG6A-7)
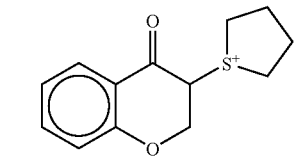 C$_4$F$_9$SO$_3^-$
(PAG6A-8)
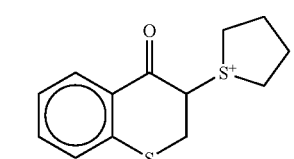 C$_8$F$_{17}$SO$_3^-$
(PAG6A-9)
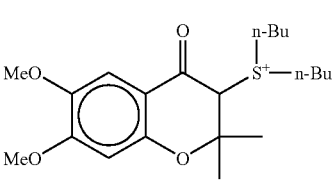 C$_4$F$_9$SO$_3^-$
(PAG6A-10)
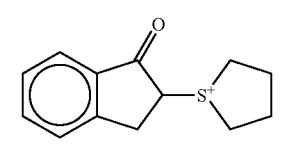 C$_4$F$_9$SO$_3^-$
(PAG6A-11)
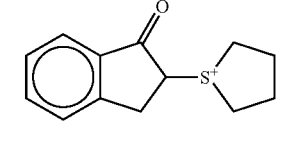 CF$_3$SO$_3^-$
(PAG6A-12)
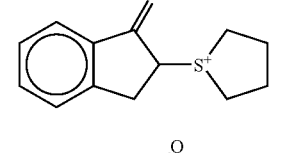 C$_8$F$_{17}$SO$_3^-$
(PAG6A-13)
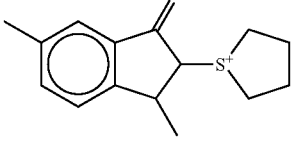 C$_4$F$_9$SO$_3^-$
-continued
(PAG6A-14)
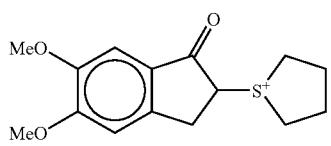 C$_8$F$_{17}$SO$_3^-$
(PAG6A-15)
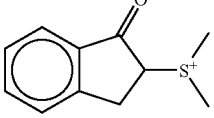 C$_4$F$_9$SO$_3^-$
(PAG6A-16)
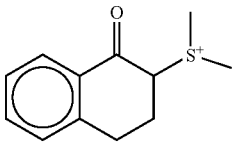 CF$_3$SO$_3^-$
(PAG6A-17)
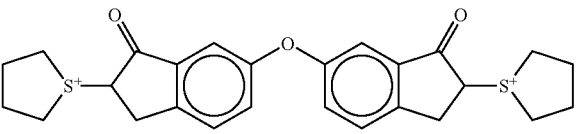
C$_4$F$_9$SO$_3^-$     C$_4$F$_9$SO$_3^-$
(PAG6A-18)
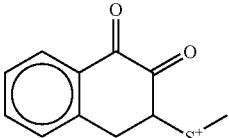 C$_4$F$_9$SO$_3^-$
(PAG6A-19)
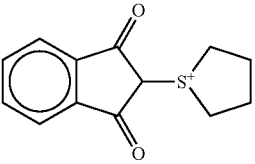 C$_4$F$_9$SO$_3^-$
(PAG6A-20)
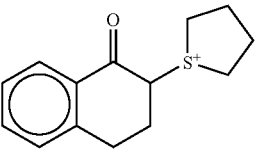 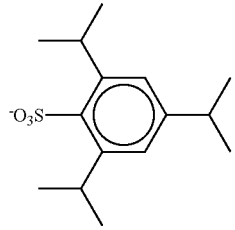
(PAG6A-21)

-continued
(PAG6A-22)
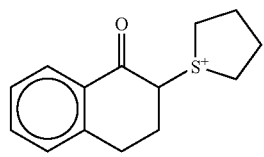 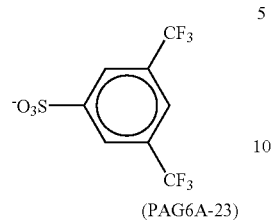
(PAG6A-23)
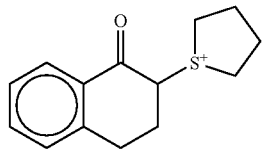 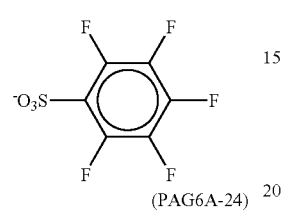
(PAG6A-24)
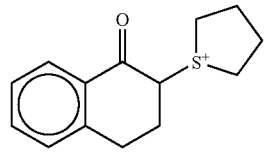 CH$_3$COO$^-$
(PAG6A-25)
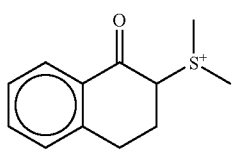 (n)C$_{12}$H$_{25}$SO$_3$
(PAG6A-26)
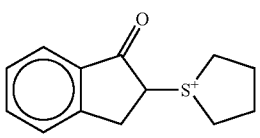 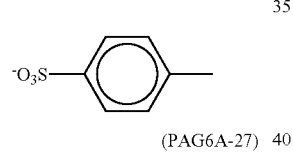
(PAG6A-27)
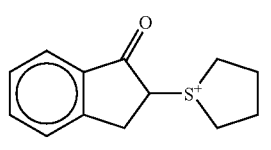 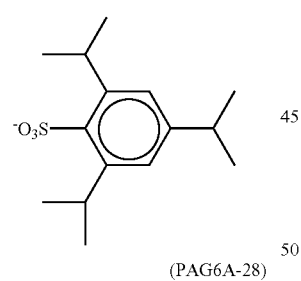
(PAG6A-28)
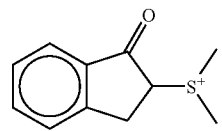 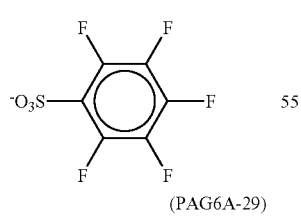
(PAG6A-29)
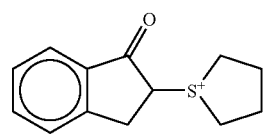 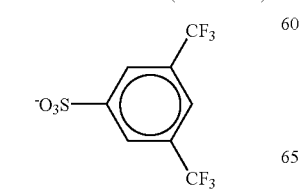
-continued
(PAG6A-30)
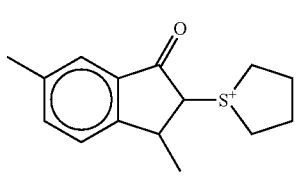 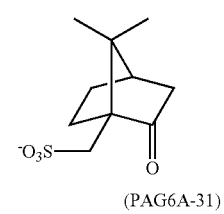
(PAG6A-31)
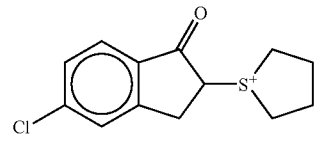 (n)C$_{11}$F$_{23}$COO$^-$
(PAG6A-32)
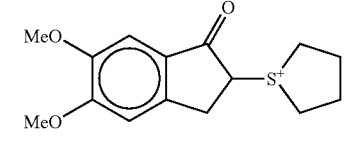 CH$_3$COO$^-$
(PAG6A-33)
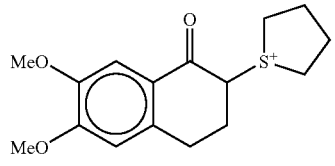 (n)C$_{11}$F$_{23}$COO$^-$
(PAG6A-34)
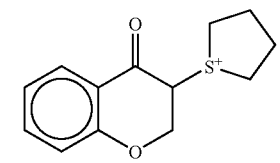 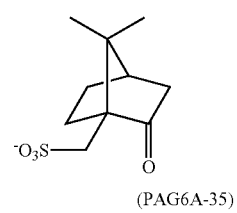
(PAG6A-35)
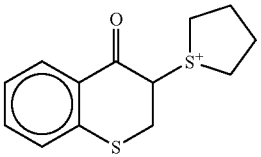 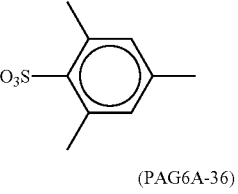
(PAG6A-36)
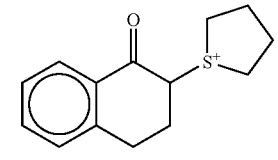 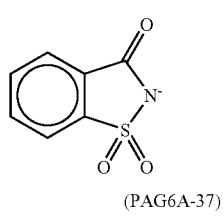
(PAG6A-37)
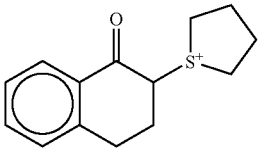 CH$_3$(CH$_2$)$_7$COO$^-$ -continued (PAG6A-38)

(PAG6B-1) C₄F₉SO₃⁻

(PAG6B-2) CF₃SO₃⁻

(PAG6B-3) C₈F₁₇SO₃⁻

(PAG6B-4) C₄F₉SO₃⁻

(PAG6B-5) CF₃SO₃⁻

(PAG6B-6) C₈F₁₇SO₃⁻

(PAG6B-7) C₄F₉SO₃⁻

(PAG6B-8) CF₃SO₃⁻

-continued (PAG6B-9) C₈F₁₇SO₃⁻

(PAG6B-10) C₄F₉SO₃⁻

(PAG6B-11) C₄F₉SO₃⁻

(PAG6B-12) ⁻O₃S-(2,4,6-triisopropylphenyl)

(PAG6B-13) ⁻O₃S-(p-tolyl)

(PAG6B-14) ⁻O₃S-(3,5-bis(trifluoromethyl)phenyl)

(PAG6B-15) ⁻O₃S-(pentafluorophenyl)

(PAG6B-16) CH₃COO⁻

-continued (PAG6B-17) 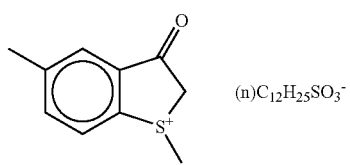

(PAG6B-18) 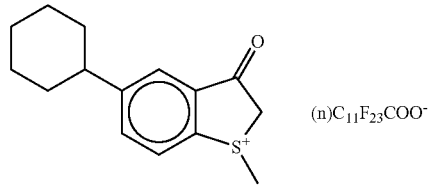

(PAG6B-19) 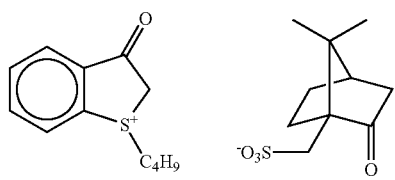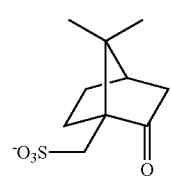

-continued (PAG6B-20) 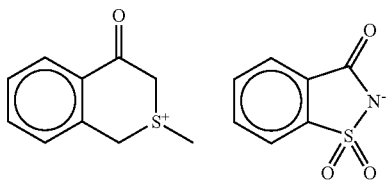

(PAG6B-21) 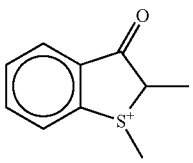 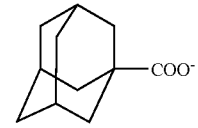

Preferred of these acid-generators of formulae (PAG6A) and (PAG6B) are (PAG6A-1) to (PAG6A-30) and (PAG6B-1) to (PAG6B-12).

The compounds of formula (PAG6) can be used either individually or as a combination of two or more thereof.

The photo-acid generator (A) is preferably used in an amount of 0.1 to 20% by weight, particularly 0.5 to 20% by weight, especially 1 to 15% by weight, based on the total solids content of the positive resist composition.

Of the above-described photo-acid generators as component (A) the following compounds are particularly preferred.

(z1) 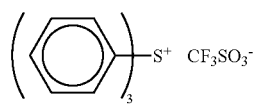

(z3) 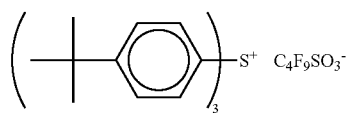

(z5) 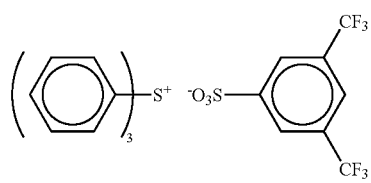

(z7) 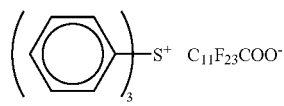

(z2) (z4) 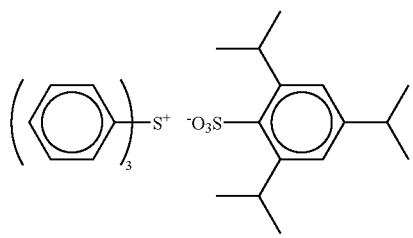

(z6) 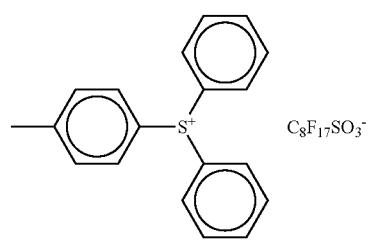

(z8) 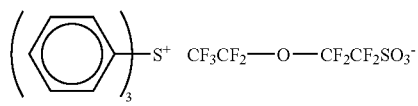

-continued
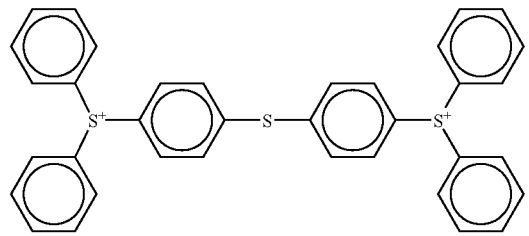
(z9)
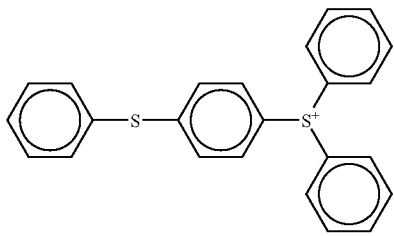
(z10)
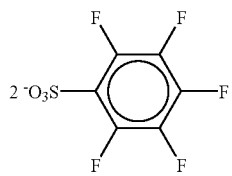
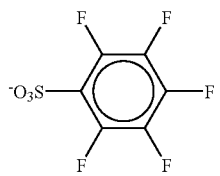
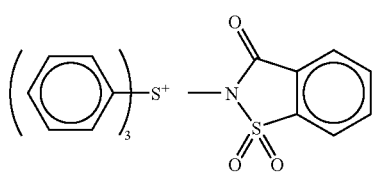
(z11)
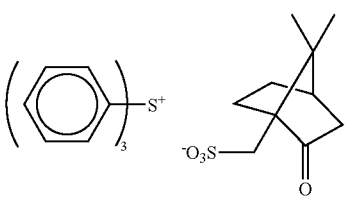
(z12)
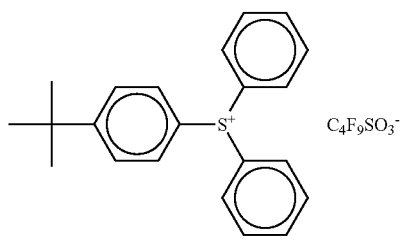
(z13)
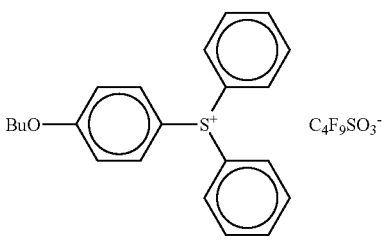
(z14)
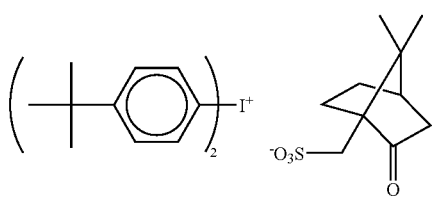
(z15)
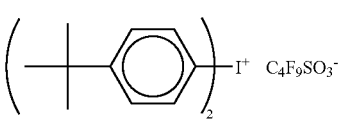
(z16)
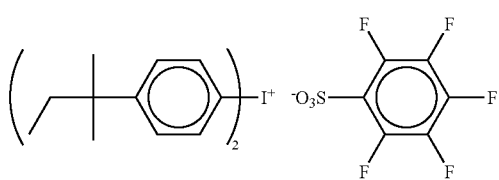
(z17)
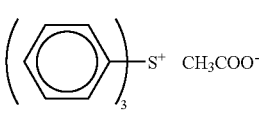
(z18)
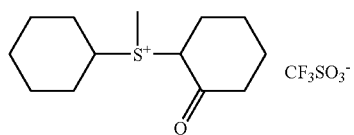
(z19)
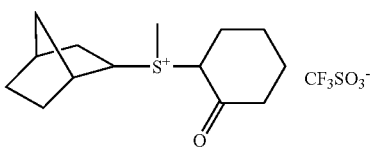
(z20)
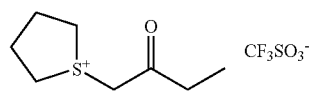
(z21)
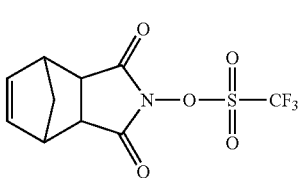
(z22)

-continued
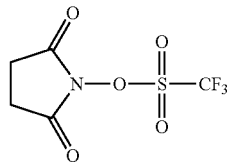 (z23)
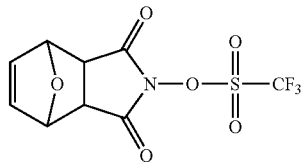 (z24)
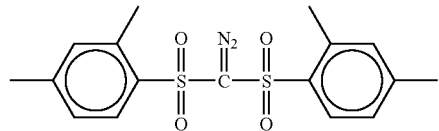 (z25)
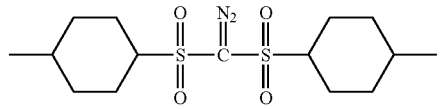 (z26)
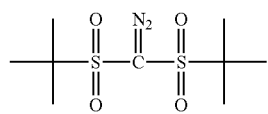 (z27)
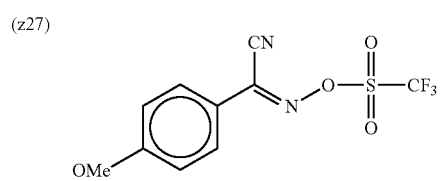 (z28)
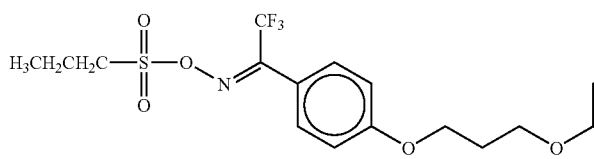 (z29)
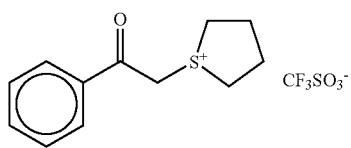 (z30)
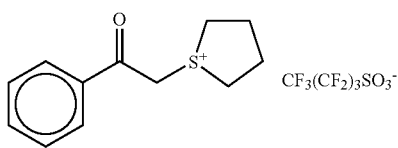 (z31)
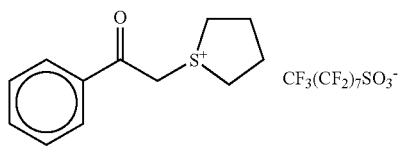 (z32)
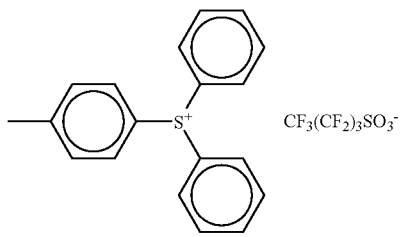 (z33)
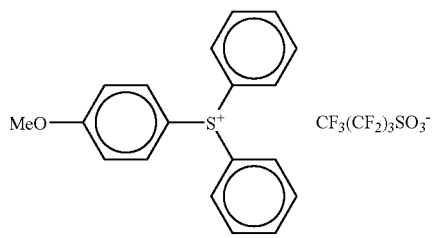 (z34)
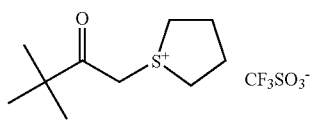 (z35)
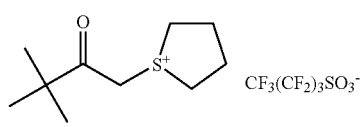 (z36)
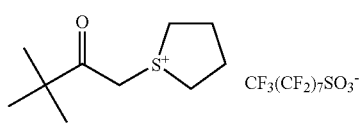 (z37)
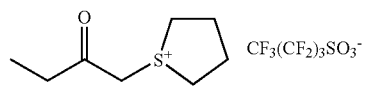 (z38)
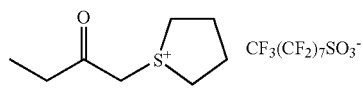 (z39)

-continued (z40)

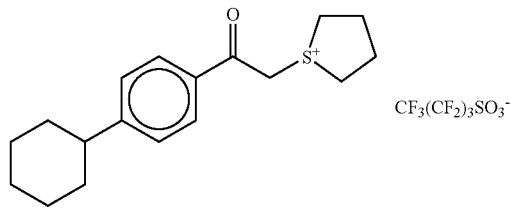

The positive resist composition of the invention contains, as component (B), a resin which is insoluble or sparingly soluble in an alkali and becomes alkali-soluble by the action of an acid (hereinafter referred to as an acid-degradable resin). The acid-degradable resin (B) is not particularly limited as long as the above solubility requirements are fulfilled. The functional group serving for alkali solubility is preferably a phenolic hydroxyl group or a carboxyl group.

A preferred acid-degradable resin (B) is a resin which has at least one phenolic hydroxyl group structure and decomposes by the action of an acid to increase its solubility in an alkali developing solution. Such a resin includes a resin having at least a p-hydroxystyrene unit. Poly-p-hydroxystyrene part of which is protected with an acid-decomposable group, a p-hydroxystyrene/t-butyl acrylate copolymer, or a derivative thereof is still preferred. Useful acid-degradable resins (B) are shown below.

k-1

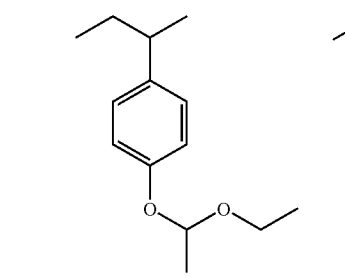 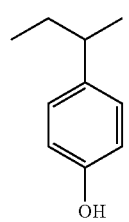

k-2

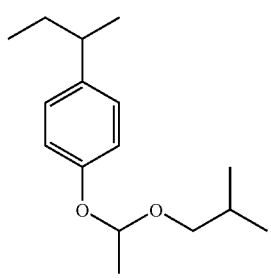 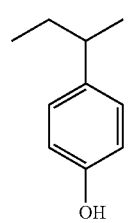

k-3

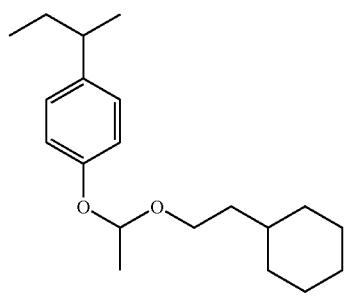 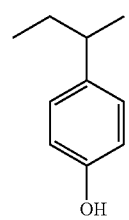

-continued k-4

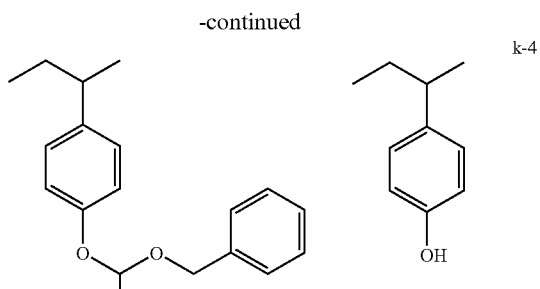

k-5

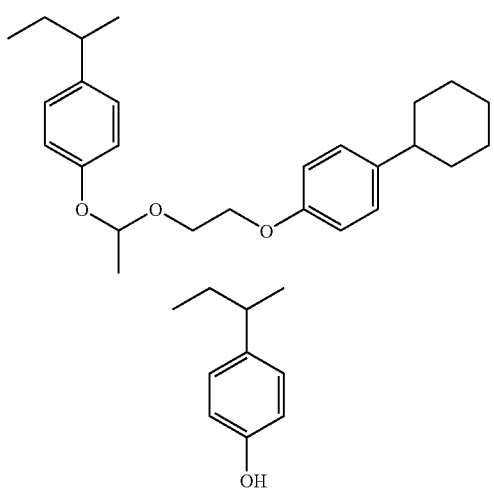 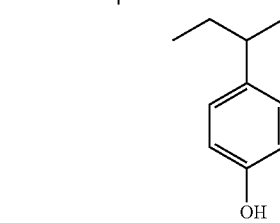

k-6

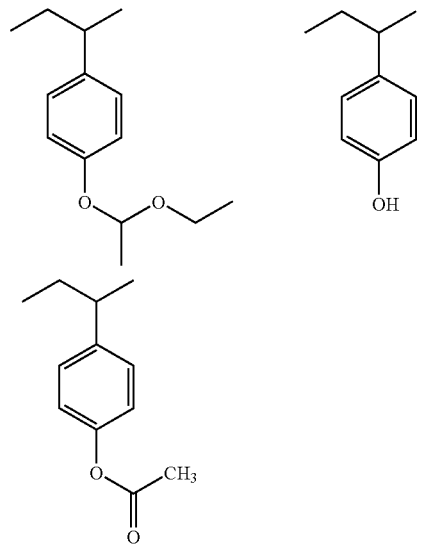 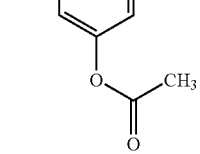

-continued
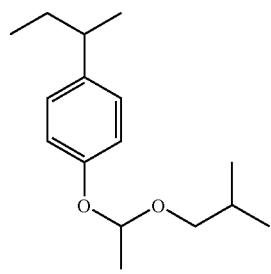 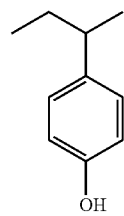
k-7
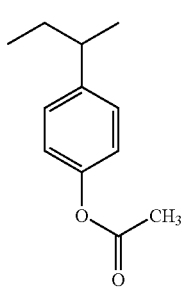
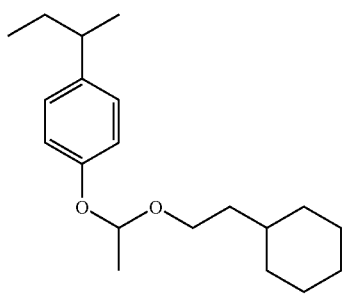 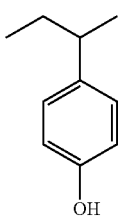
k-8
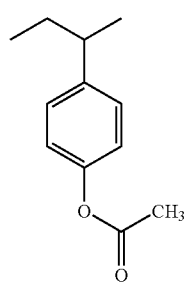
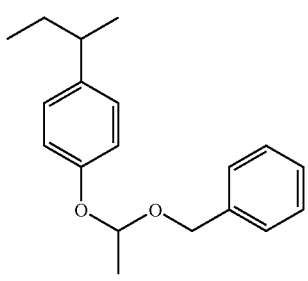 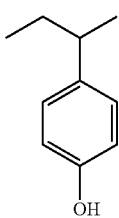
k-9
-continued
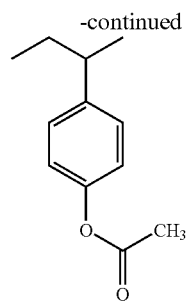
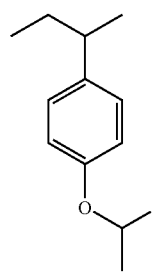
k-10
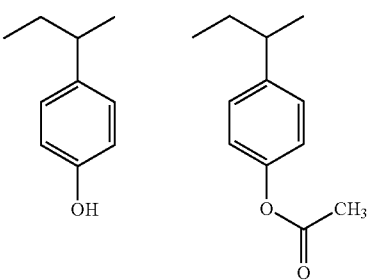
k-11
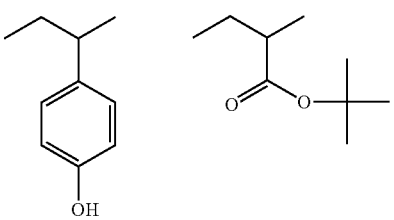
k-12
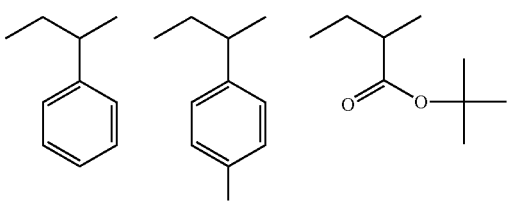
k-13
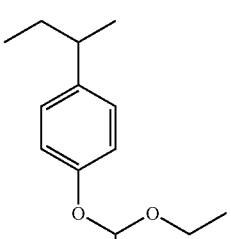 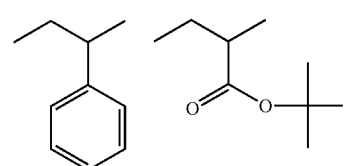

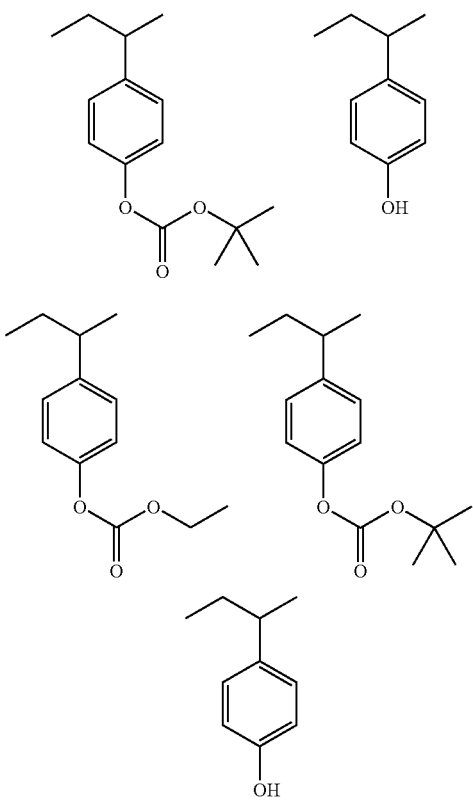

k-14 k-15

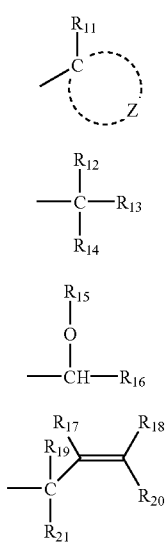

A resin which has a monocyclic or polycyclic alicyclic hydrocarbon structure and increases its solubility in an alkali developing solution by the action of an acid is also preferred as component (B) In particular, a resin having at least one repeating unit selected from the group consisting of a unit having an alicyclic hydrocarbon group-containing partial structure represented by formula (pI), (pII), (pIII), (pIV), (pV) or (pVI) and a unit represented by formula (II-AB):

(pI)

(pII)

(pIII)

(pIV)

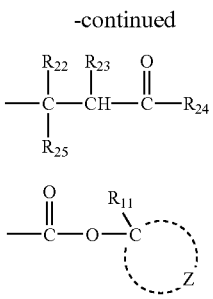

(pV)

(pVI)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the adjacent carbon atom; $R_{12}$, $R_{13}$, $R_{14}$, $R_{15}$, and $R_{16}$ each represent a straight-chain or branched alkyl group having 1 to 4 carbon atoms or an alicyclic hydrocarbon group, provided that at least one of $R_{12}$, $R_{13}$, and $R_{14}$ and at least one of $R_{15}$ and $R_{16}$ represent an alicyclic hydrocarbon group; $R_{17}$, $R_{18}$, $R_{19}$, $R_{20}$, and $R_{21}$ each represent a hydrogen atom, a straight-chain or branched alkyl group having 1 to 4 carbon atoms or an alicyclic hydrocarbon group, provided that at least one of $R_{17}$, $R_{18}$, $R_{19}$, $R_{20}$, and $R_{21}$ represents an alicyclic hydrocarbon group and that at least one of $R_{19}$ and $R_{21}$ represents a straight-chain or branched alkyl group having 1 to 4 carbon atoms or an alicyclic hydrocarbon group; and $R_{22}$, $R_{23}$, $R_{24}$, and $R_{25}$ each represent a straight-chain or branched alkyl group having 1 to 4 carbon atoms or an alicyclic hydrocarbon group, provided that at least one of $R_{22}$, $R_{23}$, $R_{24}$, and $R_{25}$ represents an alicyclic hydrocarbon group; and $R_{23}$ and $R_{24}$ may be connected together to form a ring.

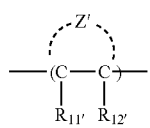

(II-AB)

wherein $R_{11'}$ and $R_{12'}$ each represent a hydrogen atom, a cyano group, a halogen atom or a substituted or unsubstituted alkyl group; and Z' represents an atomic group necessary to form a substituted or unsubstituted alicyclic structure containing the two bonded carbon atoms (C—C).

The unit represented by formula (II-AB) is preferably represented by formula (II-A) or (II-B):

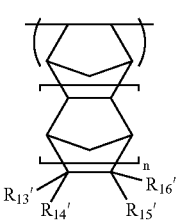

(II-A)

-continued

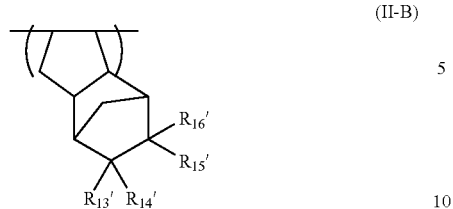
(II-B)

wherein $R_{13'}$, $R_{14'}$, $R_{15}'$, and $R_{16'}$ each represent a hydrogen atom, a halogen atom, a cyano group, —COOH, —COOR$_5$, a group decomposable by the action of an acid, —C(=O)—X-A'-R$_{17'}$, a substituted or unsubstituted alkyl group or a substituted or unsubstituted cyclic hydrocarbon group; wherein $R_5$ represents a substituted or unsubstituted alkyl group, a substituted or unsubstituted cyclic hydrocarbon group or a group —Y represented by formulae shown below;

X represents an oxygen atom, a sulfur atom, —NH—, —NHSO$_2$— or —NHSO$_2$NH—; A' represents a single bond or a divalent linking group; $R_{17'}$ represents —COOH, —COOR$_5$, —CN, a hydroxyl group, a substituted or unsubstituted alkoxy group, —CO—NH—R$_6$, —CO—NH—SO$_2$—R$_6$ or a group —Y; and R$_6$ represents a substituted or unsubstituted alkyl group or a substituted or unsubstituted cyclic hydrocarbon group;

two or more of $R_{13'}$, $R_{14'}$, $R_{15'}$, and $R_{16'}$ may be taken together to form a ring; and n represents 0 or 1.

The group —Y is represented by formula:

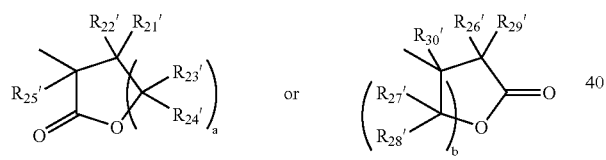

wherein $R_{21'}$, $R_{22'}$, $R_{23'}$, $R_{24'}$, $R_{25'}$, $R_{26'}$, $R_{27'}$, $R_{28'}$, $R_{29'}$, and $R_{30'}$ each represent a hydrogen atom or a substituted or unsubstituted alkyl group; and a and b each represent 1 or 2.

In formulae (pI) to (pVI), the alkyl group as $R_{12}$ to $R_{25}$ is a substituted or unsubstituted straight-chain or branched one having 1 to 4 carbon atoms, such as methyl, ethyl, n-propyl, isopropyl, n-butyl, isobutyl, sec-butyl or t-butyl. The substituent of the substituted alkyl group includes an alkoxy group having 1 to 4 carbon atoms, a halogen atom (e.g., fluorine, chlorine, bromine or iodine), an acyl group, an acyloxy group, a cyano group, a hydroxyl group, a carboxyl group, an alkoxycarbonyl group, and a nitro group.

The alicyclic hydrocarbon group as represented by $R_{12}$ to $R_{25}$ or as formed by Z and the adjacent carbon atom may be monocyclic or polycyclic and includes groups having a monocyclic, bicyclic, tricyclic, tetracyclic or like cyclic structure containing 5 or more carbon atoms. The carbon atom number of the alicyclic hydrocarbon group (as unsubstituted) is preferably 6 to 30, still preferably 7 to 25. The alicyclic hydrocarbon group may have a substituent. Examples of the alicyclic moiety of the alicyclic hydrocarbon group are shown below.

 (1)

 (2)

 (3)

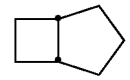 (4)

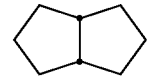 (5)

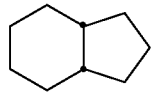 (6)

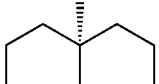 (7)

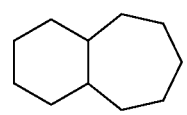 (8)

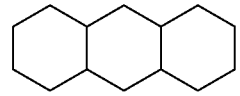 (9)

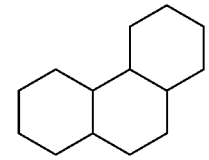 (10)

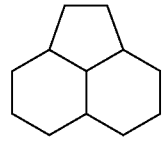 (11)

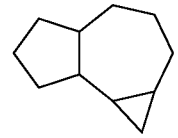 (12)

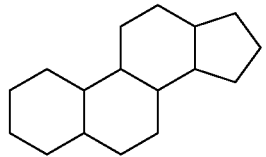 (13)

-continued
(14) 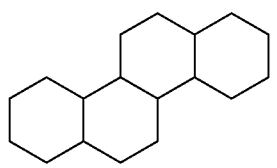
(15) 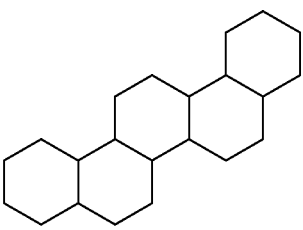
(16) 
(17) 
(18) 
(19) 
(20) 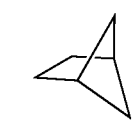
(21) 
(22) 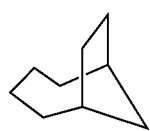
(23) 
(24) 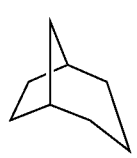
(25) 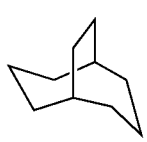
-continued
(26) 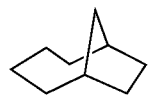
(27) 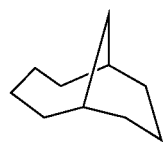
(28) 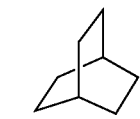
(29) 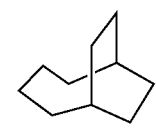
(30) 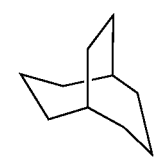
(31) 
(32) 
(33) 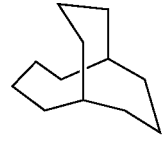
(34) 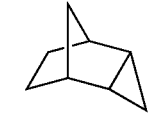
(35) 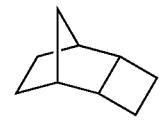
(36) 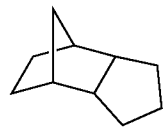

-continued

(37) 

(38) 

(39) 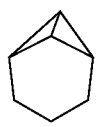

(40) 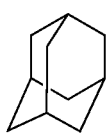

(41) 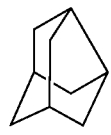

(42) 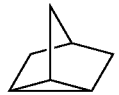

(43) 

(44) 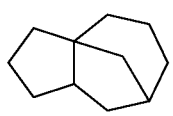

(45) 

(46) 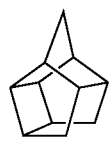

(47) 

(48) 

(49) 

-continued

(50) 

Preferred of these alicyclic moieties are adamantyl, noradamantyl, decalyl, tricyclodecanyl, tetracyclododecanyl, norbornyl, cedryl, cyclohexyl, cycloheptyl, cyclooctyl, cyclodecanyl, and cyclododecanyl. Still preferred are adamantyl, decalyl, norbornyl, cedryl, cyclohexyl, cycloheptyl, cyclooctyl, cyclodecanyl, and cyclododecanyl.

The substituent the alicyclic hydrocarbon group can have includes an alkyl group, a substituted alkyl group, a halogen atom, a hydroxyl group, an alkoxy group, a carboxyl group, and an alkoxycarbonyl group. The alkyl group is preferably a lower one, e.g., methyl, ethyl, propyl, isopropyl or butyl, still preferably methyl, ethyl, propyl or isopropyl. The substituent of the substituted alkyl group includes a hydroxyl group, a halogen atom, and an alkoxy group. The alkoxy group is preferably one having 1 to 4 carbon atoms, e.g., methoxy, ethoxy, propoxy or butoxy.

The structures represented by formulae (pI) through (pVI) can serve for protection of an alkali-soluble group. The alkali-soluble group includes various groups known in the art, such as a carboxyl group, a sulfo group, a phenol group, and a thiol group, with a carboxyl group and a sulfo group being preferred.

The alkali-soluble groups protected with the structures of formula (pI) through (pVI) preferably include those shown below.

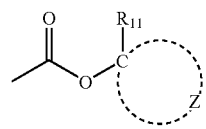 (pVII)

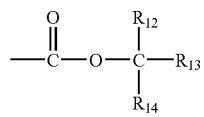 (pVIII)

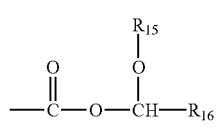 (pIX)

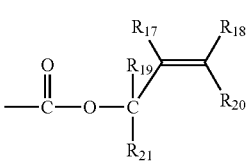 (pX)

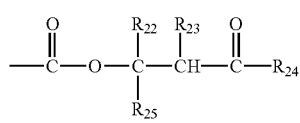 (pXI)

wherein $R_{11}$ to $R_{25}$ and Z are as defined above.

The repeating unit having an alkali-soluble group protected with the structures of formulae (pI) to (pVI) which constitutes the above-described resin (B) is preferably represented by formula (pA):

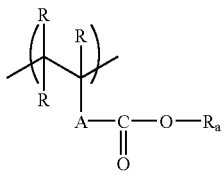
(pA)

wherein a plurality of R groups, which may be the same or different, each represent a hydrogen atom, a halogen atom or a substituted or unsubstituted straight-chain or branched alkyl group having 1 to 4 carbon atoms; A represents a single bond or one of, or a combination of two or more of, an alkylene group, a substituted alkylene group, an ether group, a thioether group, a carbonyl group, an ester group, an amide group, a sulfonamide group, a urethane group, and a urea group; and Ra represents any one of the structures represented by formulae (pI) to (pVI).

Examples of the monomers providing the repeating unit of formula (pA) are shown below.

1
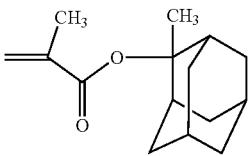

2
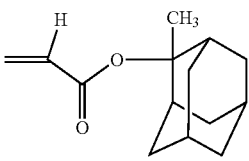

3
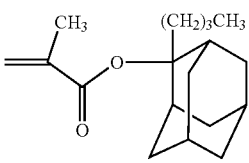

4
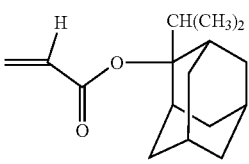

5
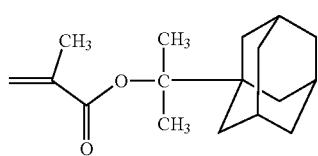

-continued

6
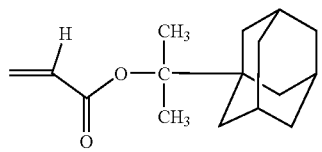

7
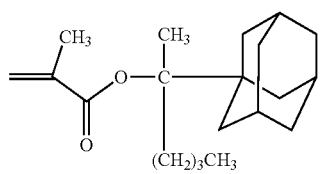

8
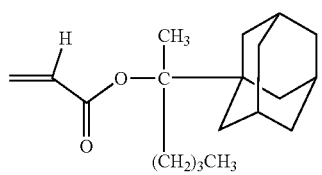

9
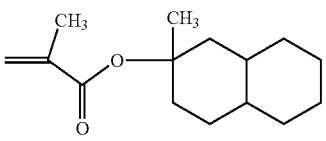

10
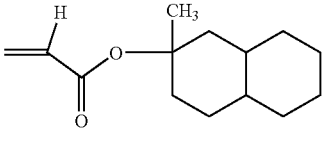

11
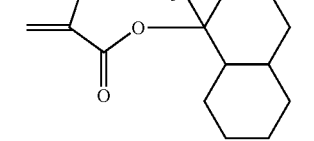

12
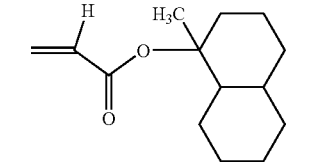

13
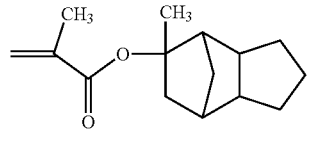

14
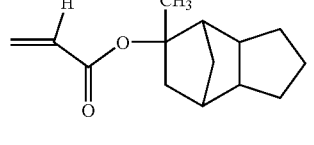

15
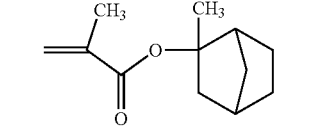

-continued
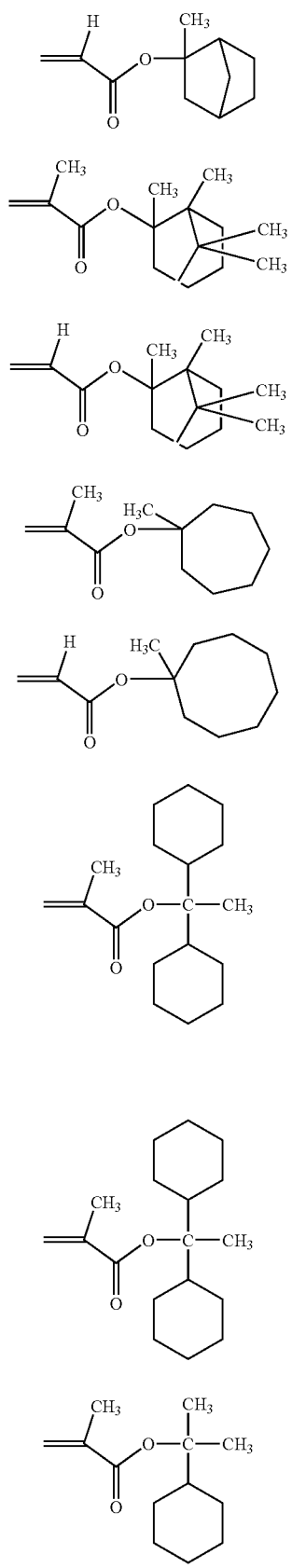
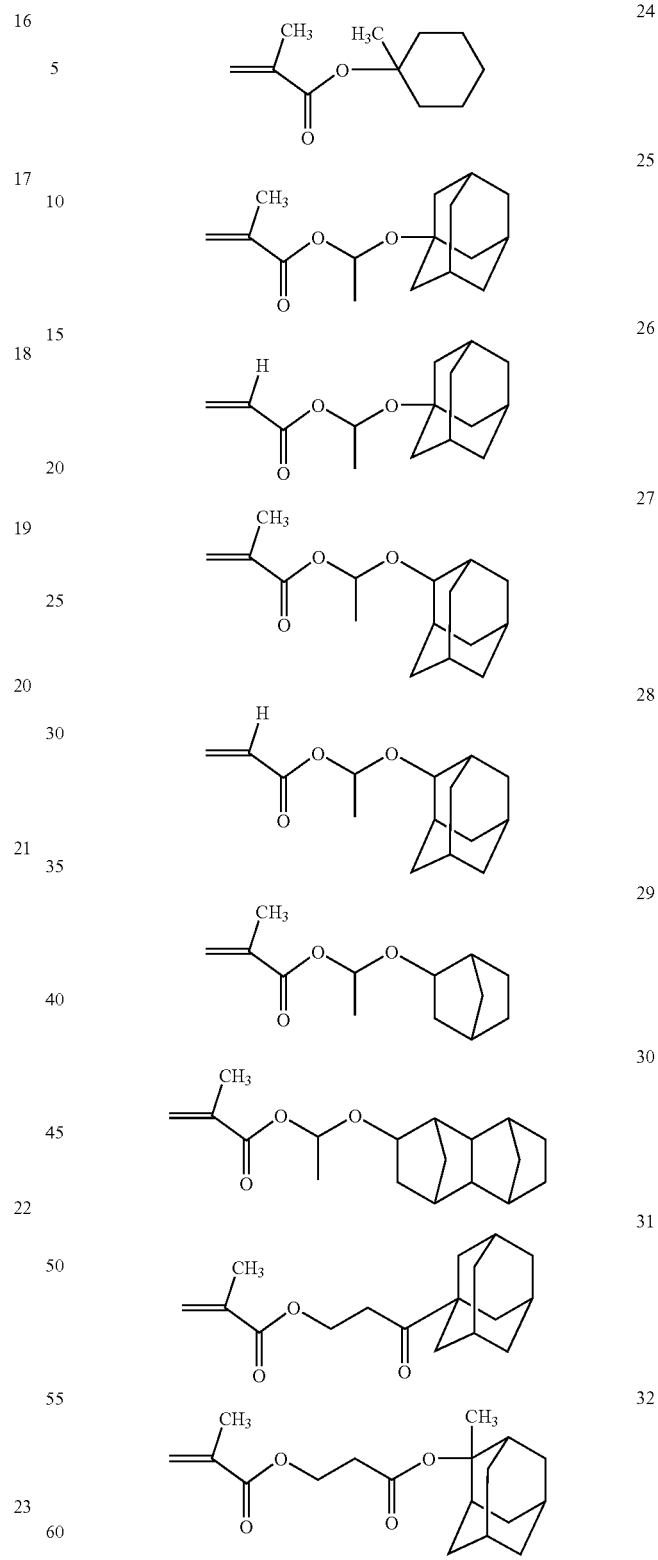
In formula (II-AB), $R_{11'}$ and $R_{12'}$ each represent a hydrogen atom, a cyano group, a halogen atom or a substituted or unsubstituted alkyl group; and Z' represents an atomic group necessary to form a substituted or unsubstituted alicyclic structure containing the two bonded carbon atoms (C—C).

The halogen atom as $R_{11'}$ or $R_{12'}$ includes chlorine, bromine, fluorine, and iodine.

The alkyl group as $R_{11'}$, $R_{12'}$, and $R_{21'}$ to $R_{30'}$ (in formulae (II-A) and (II-B)) is preferably a straight-chain or branched one having 1 to 10 carbon atoms, still preferably a straight-chain or branched one having 1 to 6 carbon atoms, particularly preferably methyl, ethyl, propyl, isopropyl, n-butyl, isobutyl, sec-butyl or t-butyl.

The substituent of the substituted alkyl group as $R_{11'}$, $R_{12'}$, and $R_{21'}$ to $R_{30'}$ includes a hydroxyl group, a halogen atom, a carboxyl group, an alkoxy group, an acyl group, a cyano group, and an acyloxy group. The halogen atom includes chlorine, bromine, fluorine, and iodine. The alkoxy group includes one having 1 to 4 carbon atoms, e.g., methoxy, ethoxy, propoxy or butoxy. The acyl group includes formyl and acetyl. The acyloxy group includes acetoxy.

The atomic group Z' necessary to form the alicyclic structure is to provide a repeating unit with a substituted or unsubstituted alicyclic hydrocarbon. In particular, Z' is preferably an atomic group forming a bridged alicyclic structure providing a bridged alicyclic hydrocarbon repeating unit.

Skeletons of the alicyclic hydrocarbons formed by Z' are shown below.

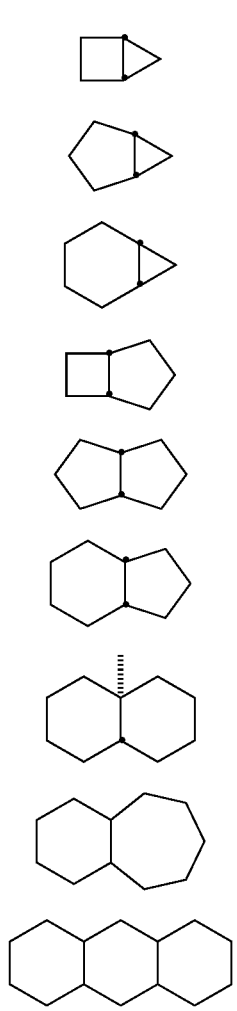

(1)
(2)
(3)
(4)
(5)
(6)
(7)
(8)
(9)

-continued

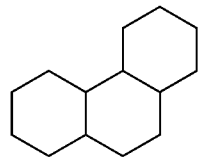

(10)

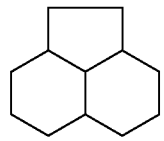

(11)

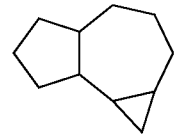

(12)

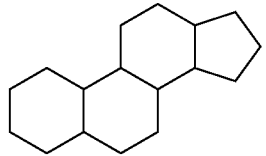

(13)

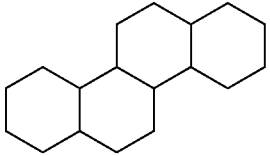

(14)

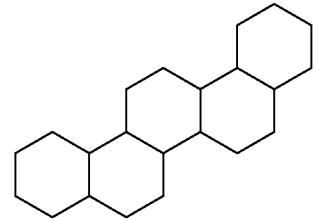

(15)

(16)

(17)

(18)

(19)

(20)

-continued
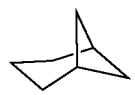
(21)
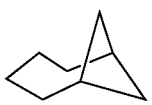
(22)
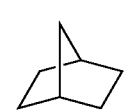
(23)
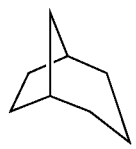
(24)
(25)
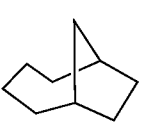
(26)
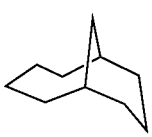
(27)
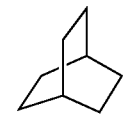
(28)
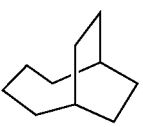
(29)
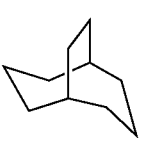
(30)
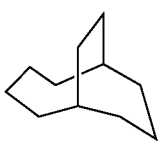
(31)
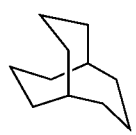
(32)
-continued
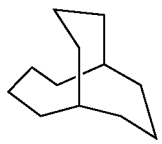
(33)
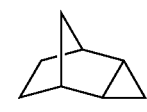
(34)
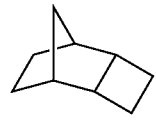
(35)
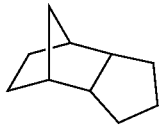
(36)
(37)
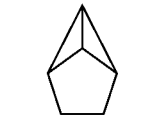
(38)
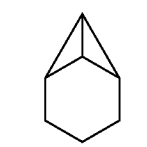
(39)
(40)
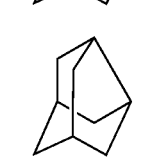
(41)
(42)
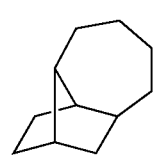
(43)
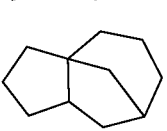
(44)

-continued

(45)

(46)
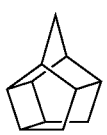

(47)

Of the bridged alicyclic hydrocarbon skeletons shown above preferred are (5) to (7), (9), (10), (13) to (15), (23), (28), 36), (37), (42), and (47).

The above-described alicyclic hydrocarbon skeletons may have a substituent. The substituent includes the atoms (except hydrogen) and groups recited as $R_{13'}$, $R_{14'}$, $R_{15'}$, and $R_{16'}$ of formulae (II-A) and (II-B).

Of the repeating units having a bridged alicyclic hydrocarbon skeleton, those represented by formulae (II-A) and (II-B) are still preferred.

In formulae (II-A) and (II-B), $R_{13'}$, $R_{14'}$, $R_{15'}$, and $R_{16'}$ each represent a hydrogen atom, a halogen atom, a cyano group, —COOH, —COOR$_5$, a group decomposable by the action of an acid, —C(=O)—X-A'-R$_{17'}$, a substituted or unsubstituted alkyl group or a substituted or unsubstituted cyclic hydrocarbon group. $R_5$ represents a substituted or unsubstituted alkyl group, a substituted or unsubstituted cyclic hydrocarbon group or a group —Y represented by formulae shown above. X represents an oxygen atom, a sulfur atom, —NH—. —NHSO$_2$— or —NHSO$_2$NH—. A' represents a single bond or a divalent linking group. $R_{17'}$ represents —COOH, —COOR$_5$, —CN, a hydroxyl group, a substituted or unsubstituted alkoxy group, —CO—NH—R$_6$, —CO—NH—SO$_2$—R$_6$ or a group —Y. $R_6$ represents a substituted or unsubstituted alkyl group or a substituted or unsubstituted cyclic hydrocarbon group. Two or more of $R_{13'}$, $R_{14'}$, $R_{15'}$, and $R_{16'}$ may be taken together to form a ring. n represents 0 or 1.

In the group —Y, $R_{21'}$ to $R_{30'}$ each represent a hydrogen atom or a substituted or unsubstituted alkyl group; and a and b each represent 1 or 2.

The acid-degradable group may be present in —C(=O)—X-A'-R$_{17'}$ or as a substituent of Z' of formula (II-AB).

The acid-degradable group is represented by formula: —C(=O)—X$_1$—R$_0$, wherein R$_0$ represents a tertiary alkyl group (e.g., t-butyl or t-amyl), an isobornyl group, a 1-alkoxyethyl group (e.g., 1-ethoxyethyl, 1-butoxyethyl, 1-isobutoxyethyl or 1-cyclohexyloxyethyl), an alkoxymethyl group (e.g., 1-methoxymethyl or 1-ethoxymethyl), a 3-oxoalkyl group, a tetrahydropyranyl group, a tetrahydrofuranyl group, a trialkylsilyl ester group, a 3-oxocyclohexyl ester group, a 2-methyl-2-adamantyl group, a mevalonic lactone residue, etc.; and X$_1$ has the same meaning as X.

The halogen atom as $R_{13'}$ to $R_{16'}$ includes chlorine, bromine, fluorine, and iodine.

The alkyl group as $R_5$, $R_6$, and $R_{13'}$ to $R_{16'}$ is preferably a straight-chain or branched one having 1 to 10 carbon atoms, still preferably a straight-chain or branched one having 1 to 6 carbon atoms, particularly preferably methyl, ethyl, propyl, isopropyl, n-butyl, isobutyl, sec-butyl or t-butyl.

The cyclic hydrocarbon group as $R_5$, $R_6$, and $R_{13'}$ to $R_{16'}$ includes a cyclic alkyl group and a bridged hydrocarbon group, such as cyclopropyl, cyclopentyl, cyclohexyl, adamantyl, 2-methyl-2-adamantyl, norbornyl, bornyl, isobornyl, tricyclodecanyl, dicyclopentenyl, epoxynorbornyl, menthyl, isomenthyl, neomenthyl, and tetracyclododecanyl.

The ring formed of two or more of $R_{13'}$ to $R_{16'}$ includes a ring having 5 to 12 carbon atoms, such as cyclopentene, cyclohexene, cycloheptane, and cyclooctane.

The alkoxy group as $R_{17'}$ includes one containing 1 to 4 carbon atoms, such as methoxy, ethoxy, propoxy or butoxy.

The substituents of the alkyl group, cyclic hydrocarbon group, and alkoxy group include a hydroxyl group, a halogen atom (e.g., chlorine, bromine, fluorine or iodine), a carboxyl group, an alkoxy group (for example, one having 1 to 4 carbon atoms, e.g., methoxy, ethoxy, propoxy or butoxy), an acyl group (e.g., formyl or acetyl), a cyano group, an acyloxy group (e.g., acetoxy), an alkyl group, and a cyclic hydrocarbon group. The alkyl group and the cyclic hydrocarbon group include those recited above.

The divalent linking group as represented by A' includes an alkylene group, a substituted alkylene group, an ether group, a thioether group, a carbonyl group, an ester group, an amide group, a sulfonamide group, a urethane group, a urea group, and a combination of two or more thereof. The substituted or unsubstituted alkylene group as A' includes those represented by —[C(R$_a$) (R$_b$)]$_r$—, wherein R$_a$ and R$_b$, which may be the same or different, each represent a hydrogen atom, a substituted or unsubstituted alkyl group, a halogen atom, a hydroxyl group or an alkoxy group, and r presents an integer of 1 to 10. The alkyl group is preferably a lower one, such as methyl, ethyl, propyl, isopropyl or butyl, still preferably methyl, ethyl, propyl or isopropyl. The substituent the alkyl group can have includes a hydroxyl group, a halogen atom (e.g., chlorine, bromine, fluorine or iodine), and an alkoxy group (such as one having 1 to 4 carbon atoms, e.g., methoxy, ethoxy, propoxy or butoxy).

The group decomposable by the action of an acid can be incorporated into at least one of the repeating unit having an alicyclic hydrocarbon group-containing partial structure represented by formulae (pI) to (pVI), the repeating unit represented by formula (II-AB), and a repeating unit derived from a comonomer described infra.

The atom or atomic group represented by $R_{13'}$ to $R_{16'}$ in formula (II-A) or (II-B) can be a substituent of the atomic group Z' which is necessary to form a (bridged) alicyclic structure in formula (II-AB).

Specific but non-limiting examples of the repeating units represented by formula (II-A) or (II-B) are shown below.

[11-1]
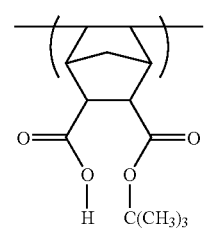

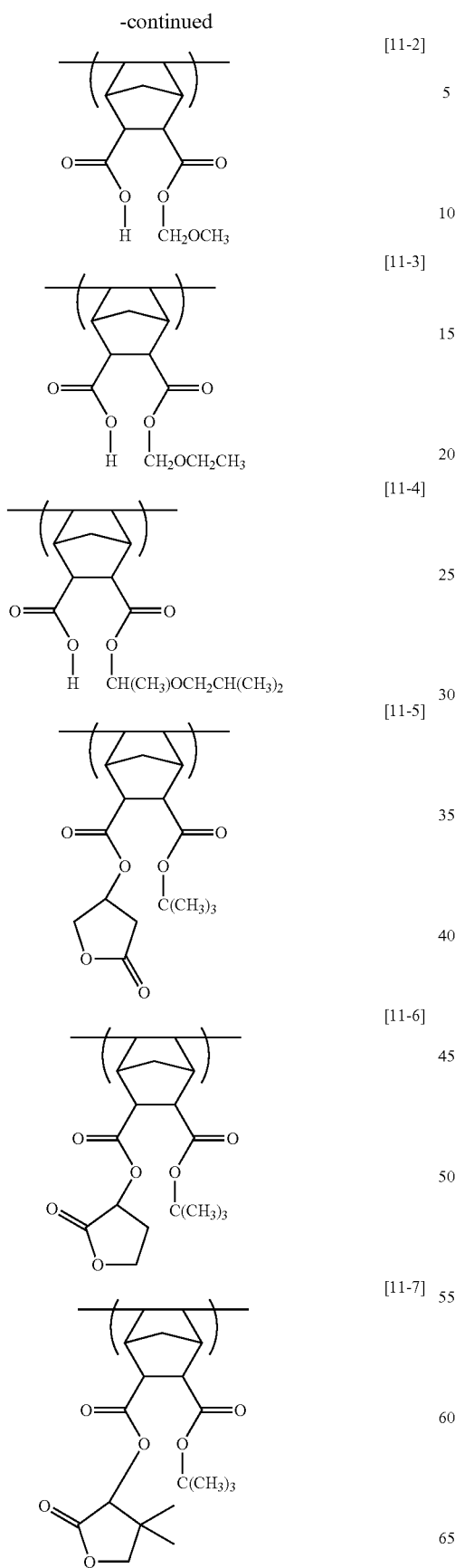
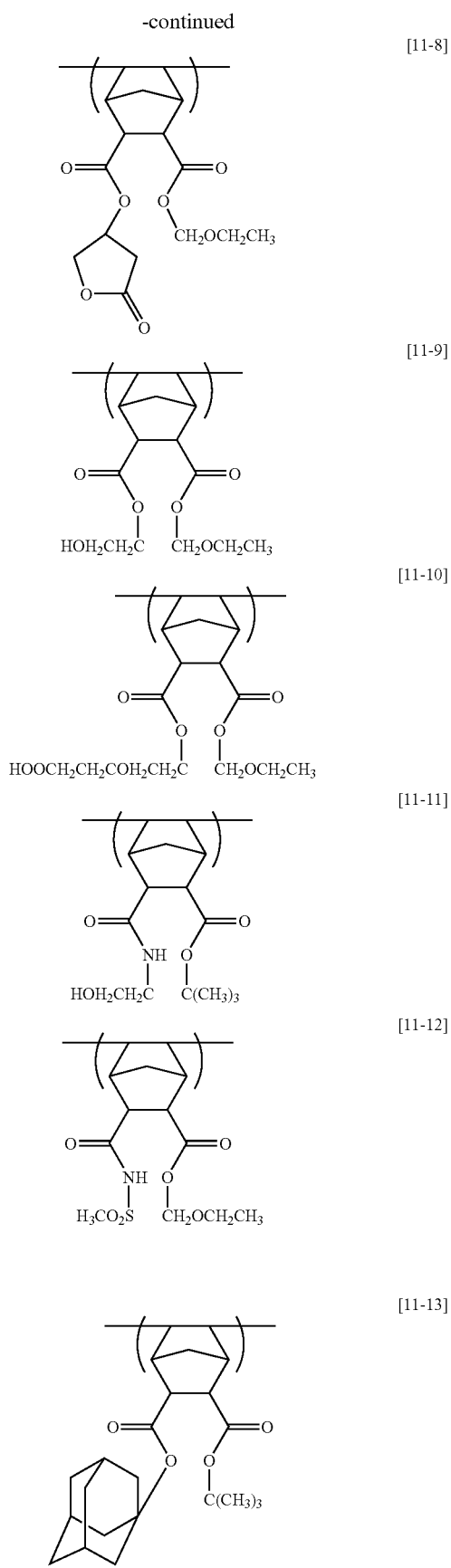

[11-14] 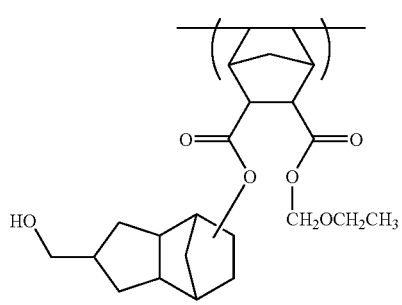
[11-15] 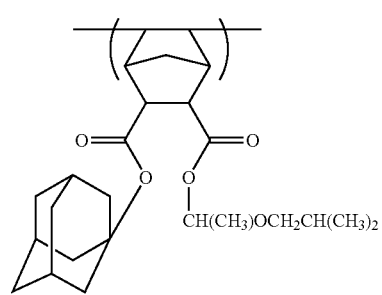
[11-16] 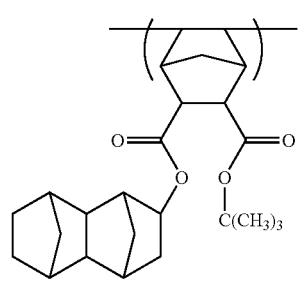
[11-17] 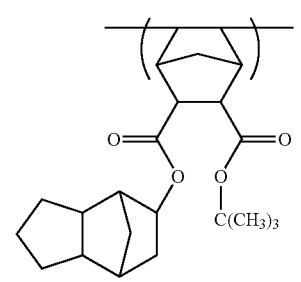
[11-18] 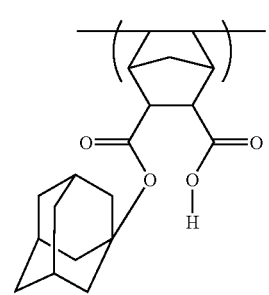
[11-19] 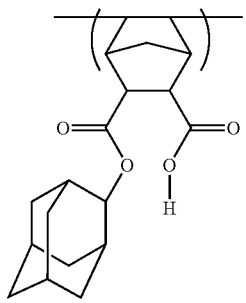
[11-20] 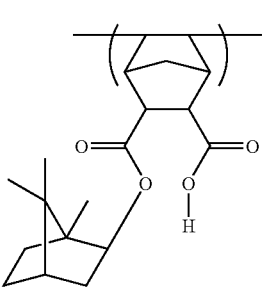
[11-21] 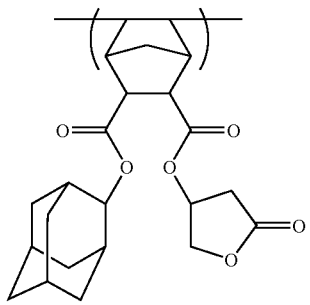
[11-22] 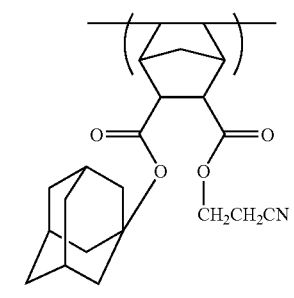
[11-23] 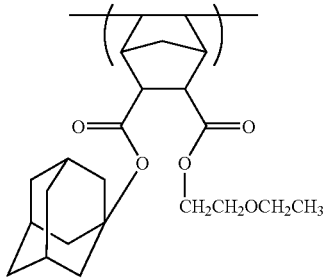

-continued
[11-24]
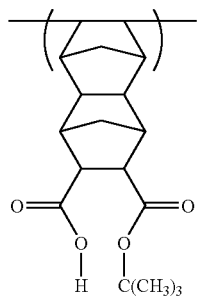
[11-25]
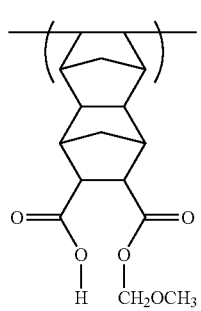
[11-26]
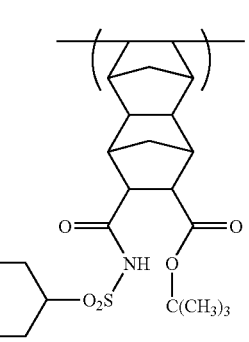
[11-27]
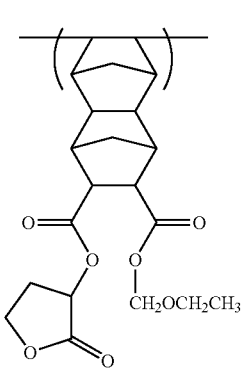
-continued
[11-28]
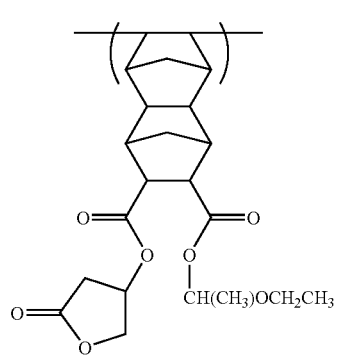
[11-29]
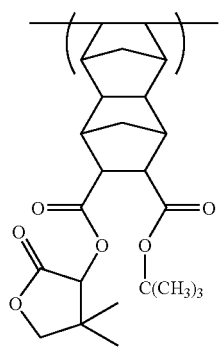
[11-30]
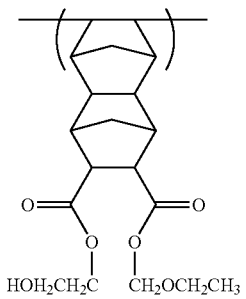
[11-31]
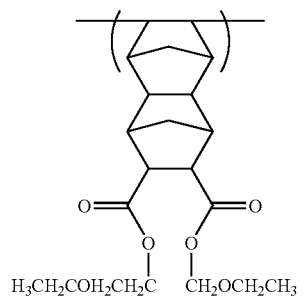
[11-32]
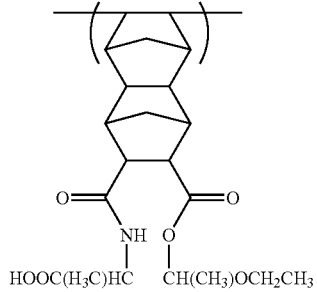

-continued
[11-33]
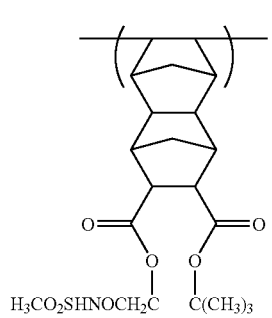
[11-37]
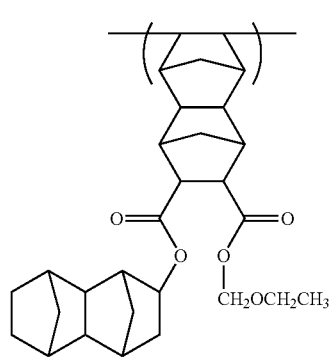
[11-34]
[structure with HOH₂CH₂COOCH₂C and CH₂OCH₂CH₃ substituents]
[11-38]
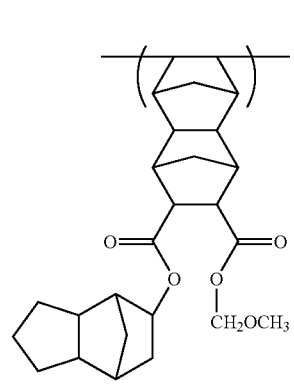
[11-35]
[structure with NCH₂CH₂C and tetrahydropyranyl substituents]
[11-39]
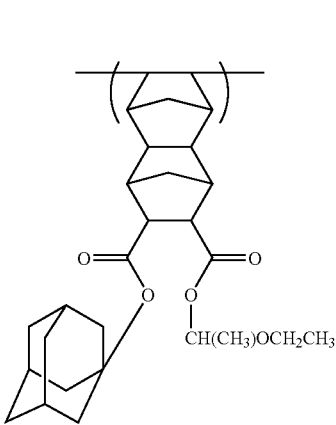
[11-36]
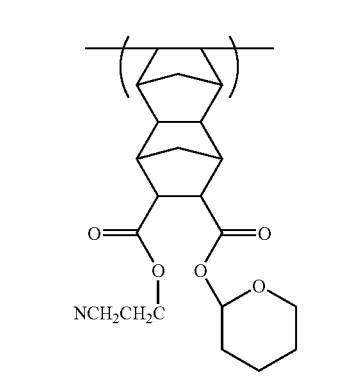
[11-40]
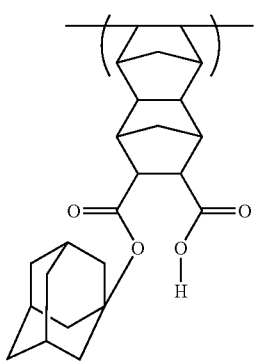

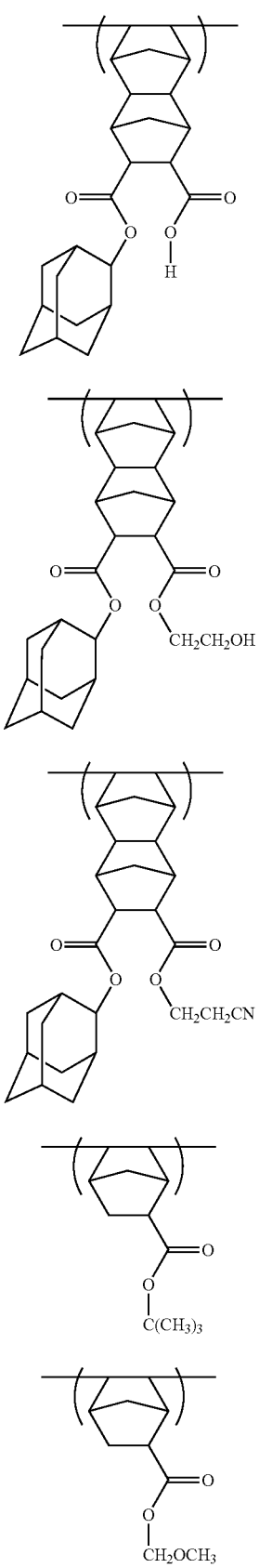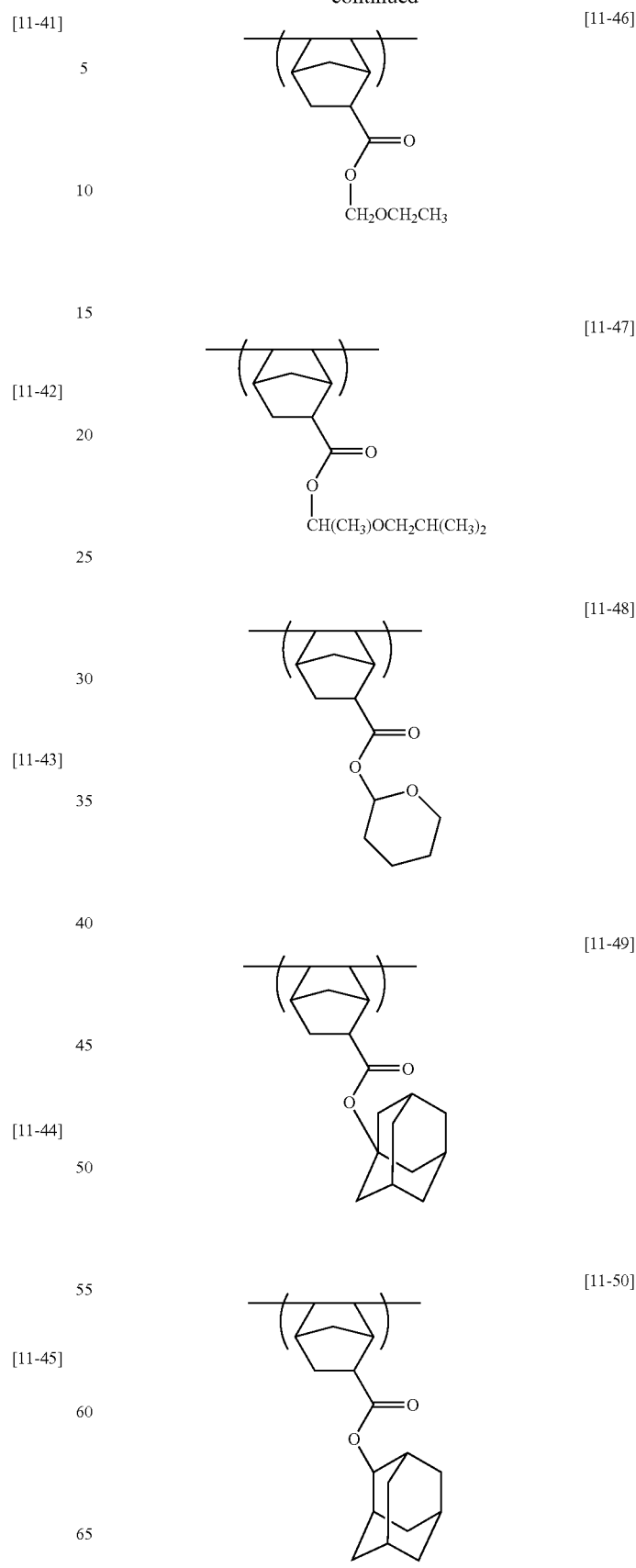

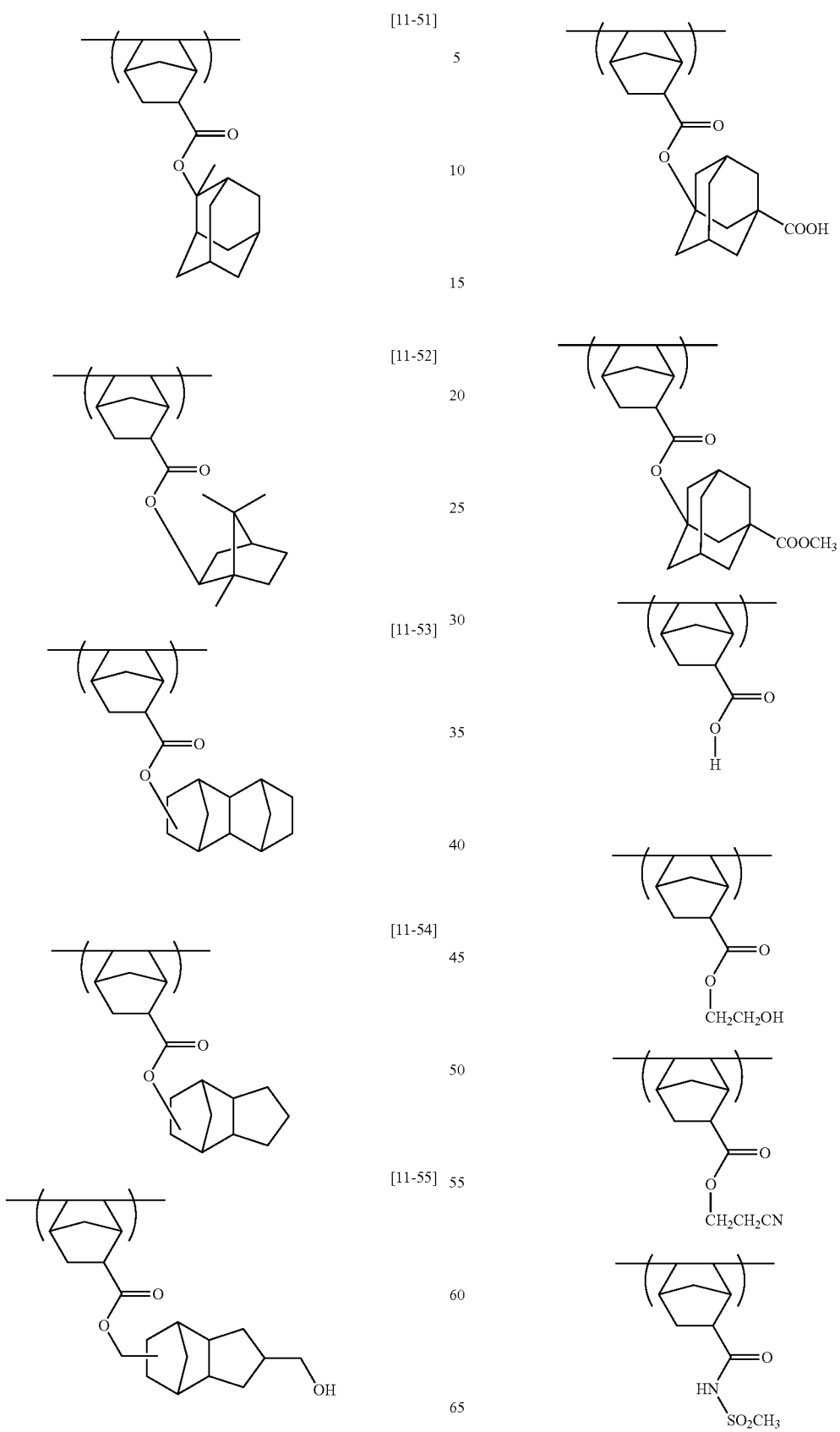
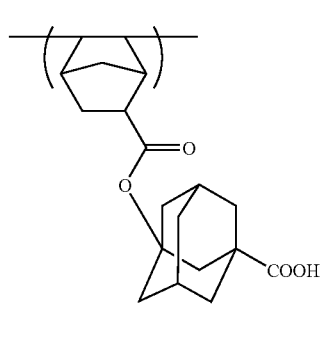
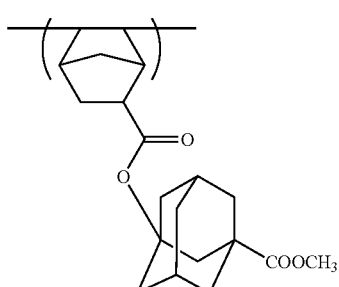
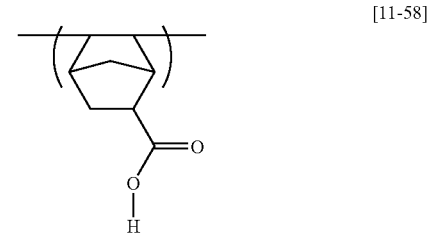
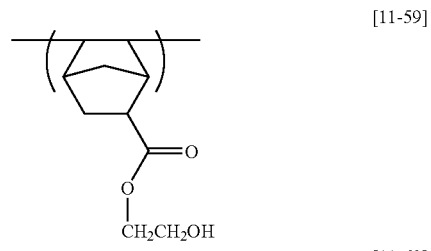
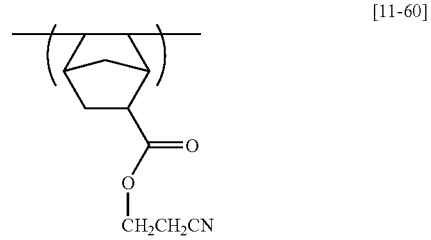
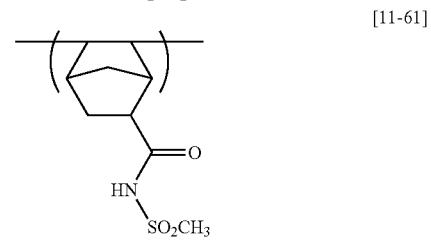

[11-62]
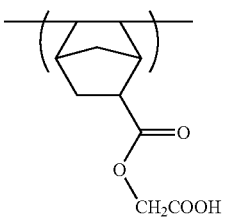
[11-63]
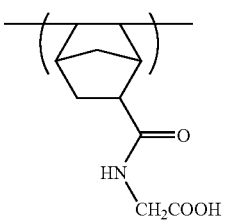
[11-64]
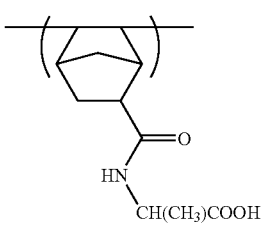
[11-65]
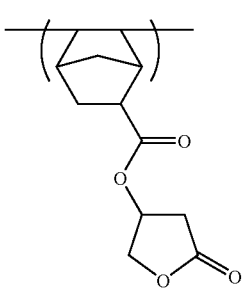
[11-66]
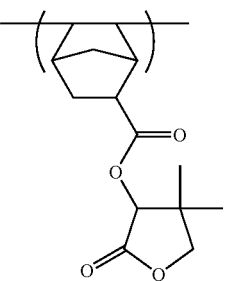
[11-67]
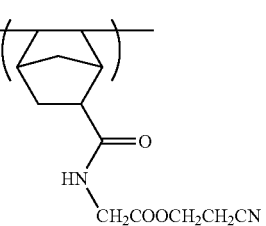
[11-68]
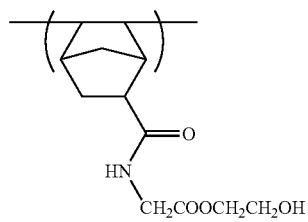
[11-69]
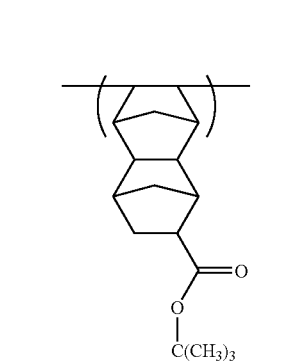
[11-70]
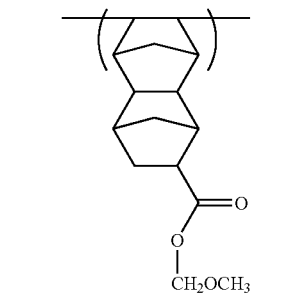
[11-71]
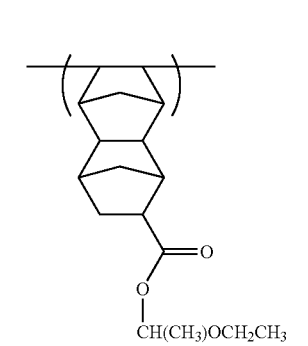
[11-72]
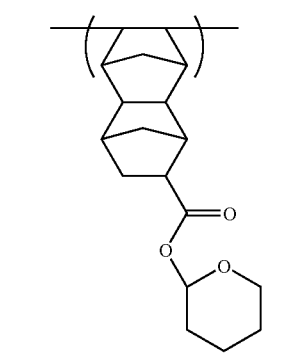

[11-73]
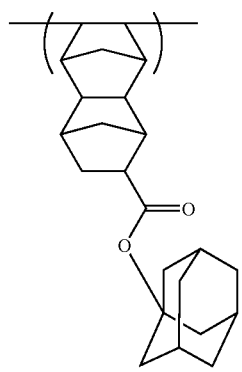
[11-74]
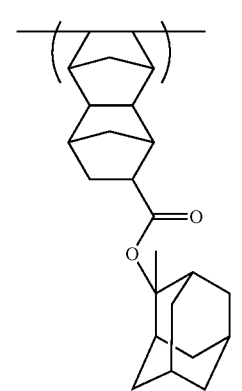
[11-75]
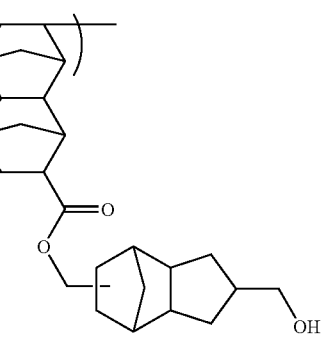
[11-76]
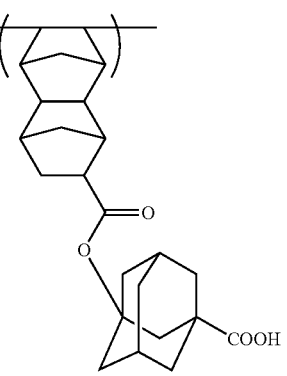
[11-77]
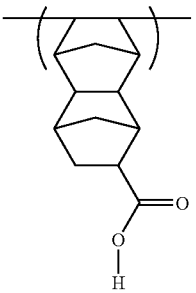
[11-78]
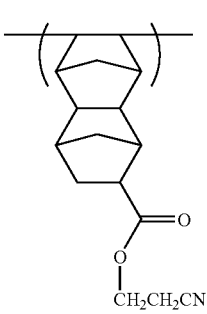
[11-79]
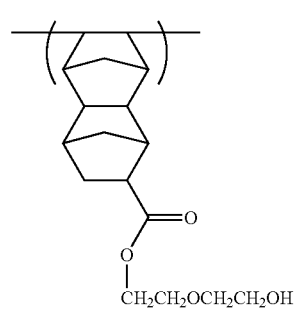
[11-80]
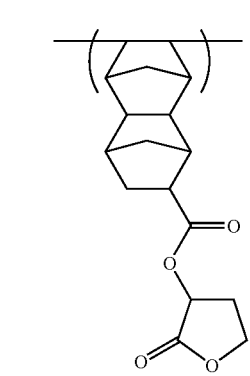

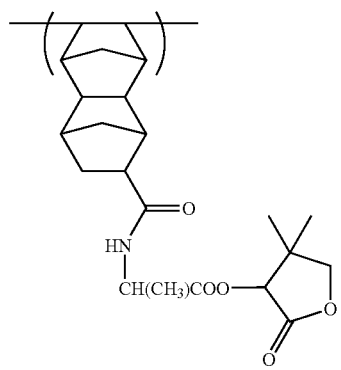
[11-81]
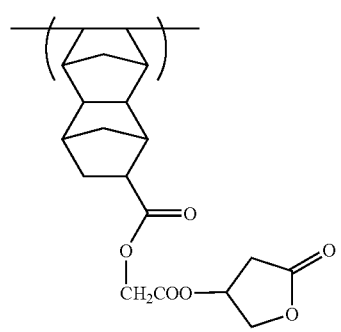
[11-82]
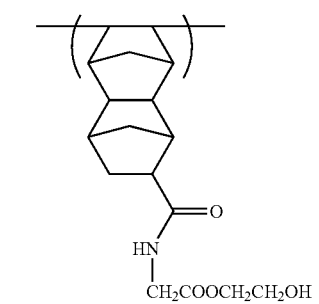
[11-83]
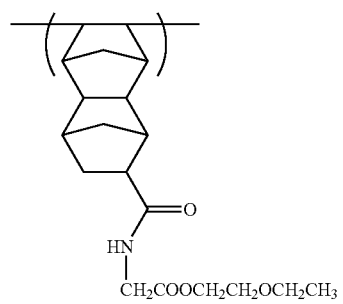
[11-84]
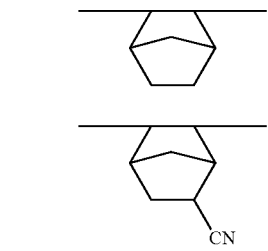
[11-85]
[11-86]
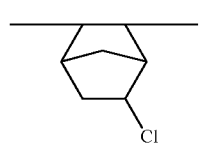
[11-87]
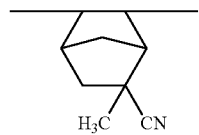
[11-88]
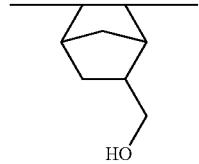
[11-89]
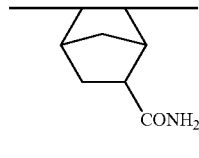
[11-90]
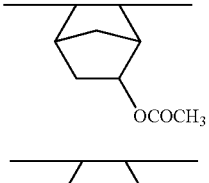
[11-91]
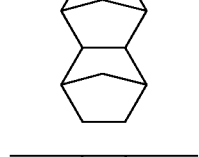
[11-92]
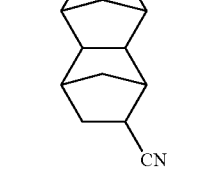
[11-93]
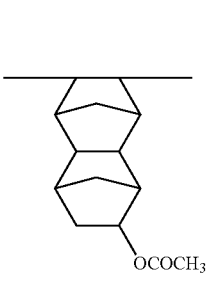
[11-94]
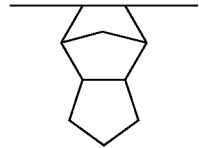
[11-95]

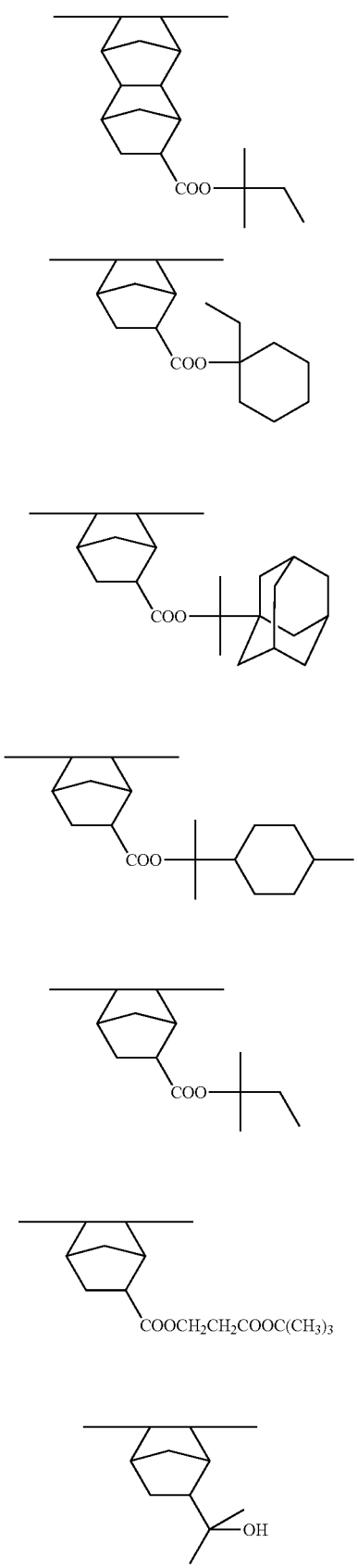

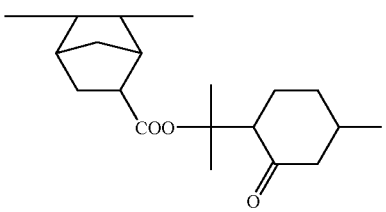

[11-97] The acid-degradable resin (B) according to the present invention can further comprise a repeating unit having a lactone moiety and represented by formula (IV):

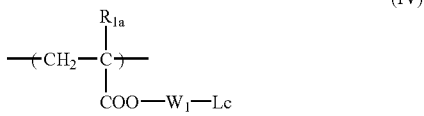

[11-98] wherein $R_{1a}$ represents a hydrogen atom or a methyl group; $W_1$ represents a single bond or one of, or a combination of two or more of, an alkylene group, an ether group, a thioether group, a carbonyl group, and an ester group; and Lc represents a lactone structure of formula:

[11-99] Lc: 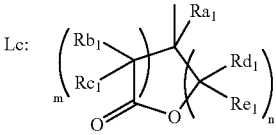

wherein $R_{a1}$, $R_{b1}$, $R_{c1}$, $R_{d1}$, and $R_{e1}$ each represent a hydrogen atom or an alkyl group having 1 to 4 carbon atoms;

and m and n each represent an integer of 0 to 3, provided that m+n is 2 to 6.

[11-100] The $C_{1-4}$ alkyl group as $R_{a1}$ to $R_{e1}$ includes methyl, ethyl, propyl, isopropyl, n-butyl, isobutyl, sec-butyl, and t-butyl.

The alkylene group as $W_1$ includes a group represented by formula: $-[C(R_f)(R_g)]_{r1}-$, wherein $R_f$ and $R_g$, which may be the same or different, each represent a hydrogen atom, an alkyl group, a substituted alkyl group, a halogen atom, a hydroxyl group or an alkoxy group; and r1 represents an integer of 1 to 10. The alkyl group in the alkylene group is preferably a lower one, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group. The alkoxy group in the alkylene group includes one having 1 to 4 carbon atoms, e.g., methoxy, ethoxy, propoxy or butoxy. The halogen atom includes chlorine, bromine, fluorine, and iodine.

[11-102] Substituents of the substituted alkyl group include a carboxyl group, an acyloxy group, a cyano group, an alkyl group, a substituted alkyl group, a halogen atom, a hydroxyl group, an alkoxy group, a substituted alkoxy group, an acetylamide group, an alkoxycarbonyl group, and an acyl group. The alkyl group as a substituent includes a lower one, such as methyl, ethyl, propyl, isopropyl, butyl, cyclopropyl, cyclobutyl or a cyclopentyl. The substituent of the substituted alkyl group includes a hydroxyl group, a halogen atom, and an alkoxy group. The substituent of the substituted alkoxy group includes an alkoxy group. The alkoxy group includes a lower one having 1 to 4 carbon atoms, such as methoxy, ethoxy, propoxy or butoxy. The acyloxy group includes an acetoxy group. The halogen atom includes chlorine, bromine, fluorine, and iodine.

Specific but non-limiting examples of the repeating units of formula (IV) are shown below.

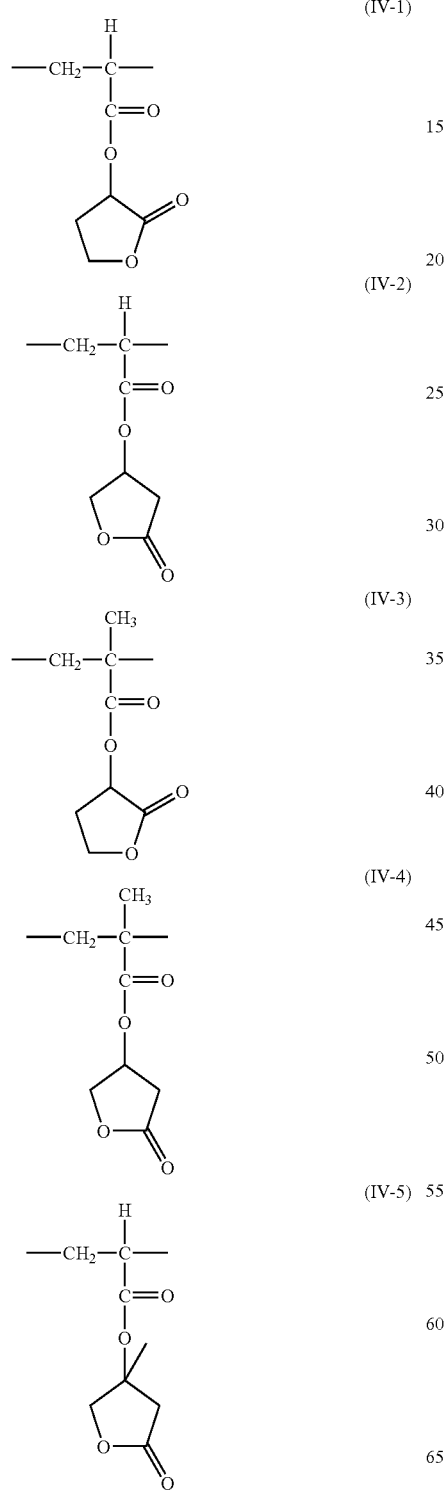

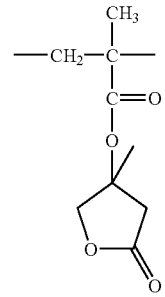

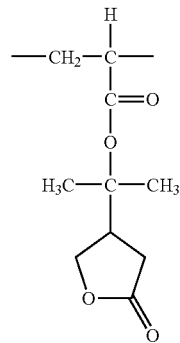

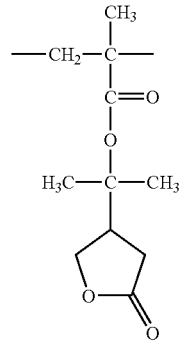

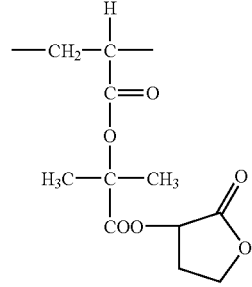

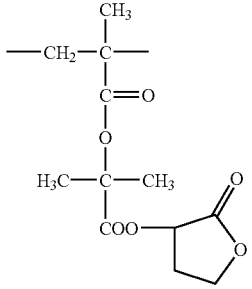

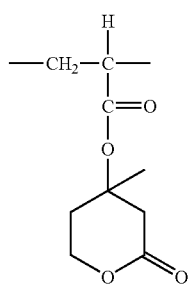 (IV-11)
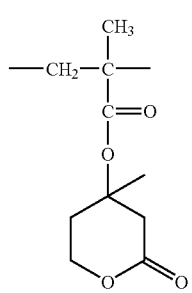 (IV-12)
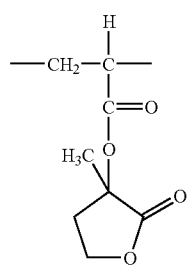 (IV-13)
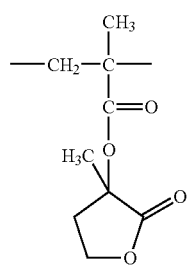 (IV-14)
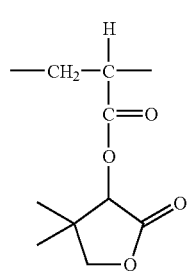 (IV-15)
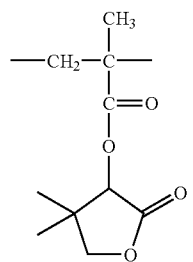 (IV-16)
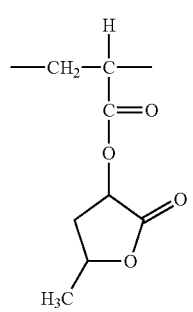 (IV-17)
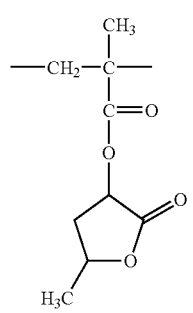 (IV-18)
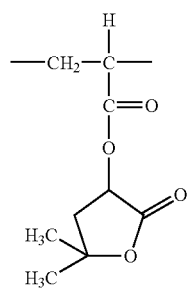 (IV-19)
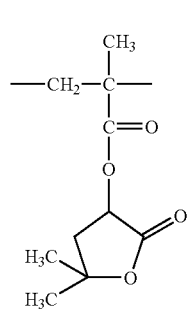 (IV-20)

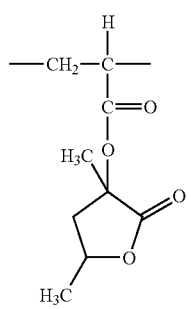 (IV-21)
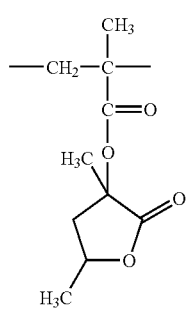 (IV-22)
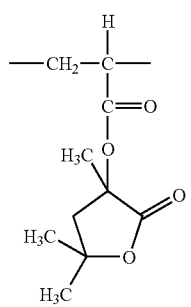 (IV-23)
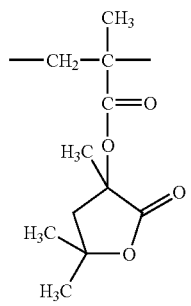 (IV-24)
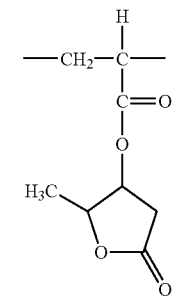 (IV-25)
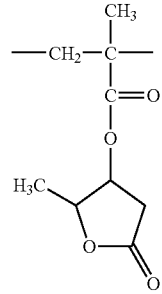 (IV-26)
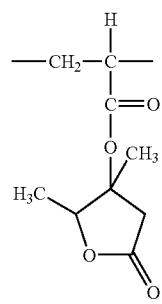 (IV-27)
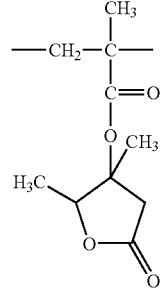 (IV-28)
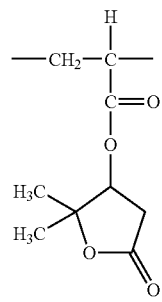 (IV-29)
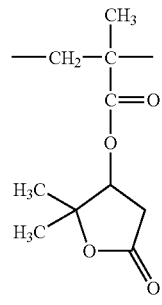 (IV-30)

From the standpoint of a wider exposure latitude, repeating units (IV-17) to (IV-36) are preferred. From the standpoint of improved LER, those having an acrylate structure are preferred.

The resin (B) of the present invention can have a repeating unit having a group represented by formula (V-1), (V-2), (V-3) or (V-4):

wherein $R_{1b}$, $R_{2b}$, $R_{3b}$, $R_{4b}$, and $R_{5b}$ each represent a hydrogen atom, a substituted or unsubstituted alkyl group, a substituted or unsubstituted cycloalkyl group or a substituted or unsubstituted alkenyl group, and two out of $R_{1b}$, $R_{2b}$, $R_{3b}$, $R_{4b}$, and $R_{5b}$ may be taken together to form a ring.

The alkyl group as $R_{1b}$ to $R_{5b}$ may be straight or branched and substituted or unsubstituted. The alkyl group preferably contains 1 to 12, particularly 1 to 10, carbon atoms (as unsubstituted). Especially preferred alkyl groups are methyl, ethyl, propyl, isopropyl, n-butyl, isobutyl, sec-butyl, t-butyl, pentyl, hexyl, heptyl, octyl, nonyl, and decyl.

The cycloalkyl group as $R_{1b}$ to $R_{5b}$ is preferably one containing 3 to 8 carbon atoms, such as cyclopropyl, cyclopentyl, cyclohexyl, cycloheptyl or cyclooctyl.

The alkenyl group as $R_{1b}$ to $R_{5b}$ is preferably one containing 2 to 6 carbon atoms, such as vinyl, propenyl, butenyl or hexenyl.

The ring formed of two of $R_{1b}$ through $R_{5b}$ includes a 3- to 8-membered one, such as cyclopropane, cyclobutane, cyclopentane, cyclohexane or cyclooctane.

In formulae (V-1) through (V-4), $R_{1b}$ to $R_{5b}$ may be bonded to any carbon atoms making up the cyclic skeleton.

Substituents that the alkyl, cycloalkyl or alkenyl group may have include an alkoxy group containing 1 to 4 carbon atoms, a halogen atom (e.g., fluorine, chlorine, bromine or iodine), an acyl group having 2 to 5 carbon atoms, an acyloxy group having 2 to 5 carbon atoms, a cyano group, a hydroxyl group, a carboxyl group, an alkoxycarbonyl group having 2 to 5 carbon atoms, and a nitro group.

The repeating units having the group represented by formulae (V-1) to (V-4) include the units represented by formula (II-A) or (II-B) wherein at least one of $R_{13'}$, $R_{14'}$, $R_{15'}$, and $R_{16'}$ has the group of formula (V-1), (V-2), (V-3) or (V-4) (for example, at least one of $R_{13'}$ to $R_{16'}$ is —COOR$_5$, wherein $R_5$ is the group of formula (V-1), (V-2), (V-3) or (V-4)) and a repeating unit represented by formula (AI):

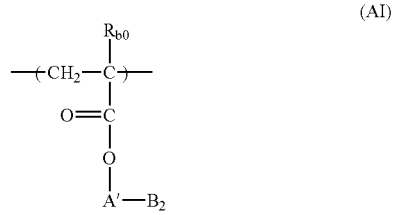

(AI)

wherein $R_{b0}$ represents a hydrogen atom, a halogen atom or a substituted or unsubstituted alkyl group having 1 to 4 carbon atoms; A' represents a single bond or a divalent linking group selected from an ether group, an ester group, a carbonyl group, an alkylene group, and a combination thereof; and $B_2$ represents a group represented by any of formulae (V-1) to (V-4).

Preferred substituents of the substituted alkyl group as $R_{b0}$ include those recited supra as preferred substituents of the substituted alkyl group represented by $R_{1b}$ in formulae (V-1) through (V-4). The halogen atom as $R_{b0}$ includes a fluorine atom, a chlorine atom, a bromine atom, and an iodine atom. $R_{b0}$ is preferably a hydrogen atom. The combination of linking groups as A' includes the following groups.

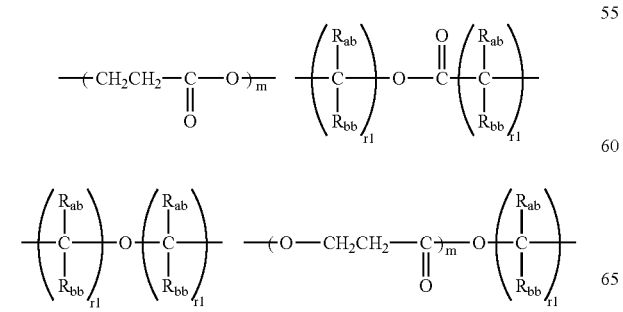

-continued

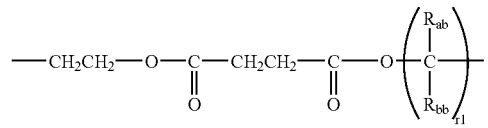

wherein $R_{ab}$ and $R_{bb}$, which may be the same or different, each represent a hydrogen atom, an alkyl group, a substituted alkyl group, a halogen atom, a hydroxyl group or an alkoxy group; m represents an integer of 1 to 3; and r1 represents an integer of 1 to 10.

The alkyl group as $R_{ab}$ or $R_{bb}$ is preferably a lower one, such as methyl, ethyl, propyl, isopropyl or butyl, still preferably methyl, ethyl, propyl or isopropyl. The substituent of the substituted alkyl group includes a hydroxyl group, a halogen atom, and an alkoxy group having 1 to 4 carbon atoms. The alkoxy group as $R_{ab}$ or $R_{bb}$ includes one having 1 to 4 carbon atoms, such as methoxy, ethoxy, propoxy or butoxy. The halogen atom includes chlorine, bromine, fluorine, and iodine. m is preferably 1 or 2. r1 is preferably 1 to 4.

Specific but non-limiting examples of the repeating unit represented by formula (AI) are shown below.

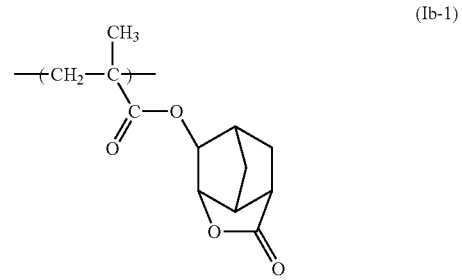

(Ib-1)

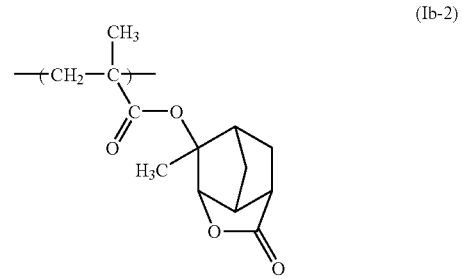

(Ib-2)

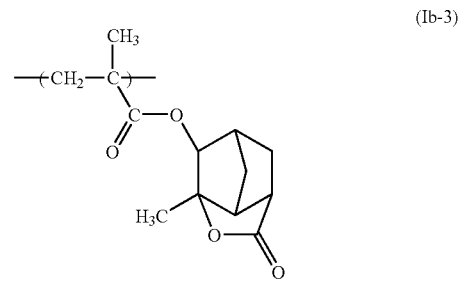

(Ib-3)

-continued
(Ib-4)
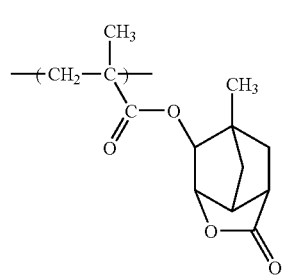
(Ib-5)
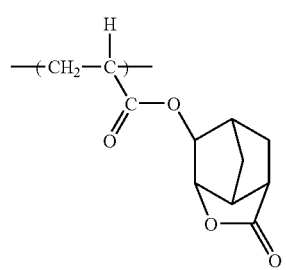
(Ib-6)
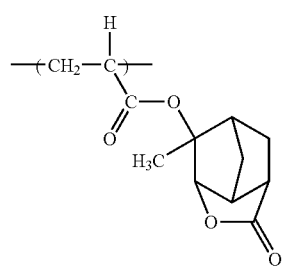
(Ib-7)
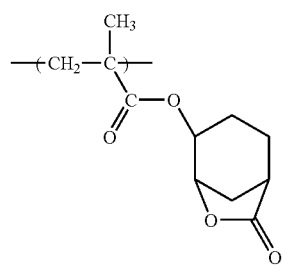
(Ib-8)
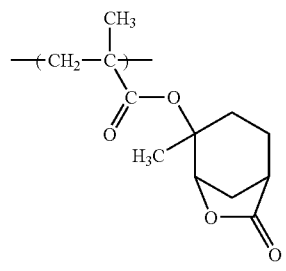
(Ib-9)
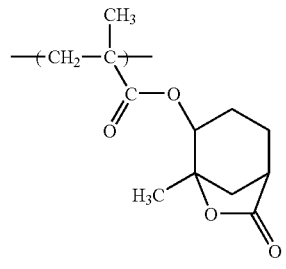
-continued
(Ib-10)
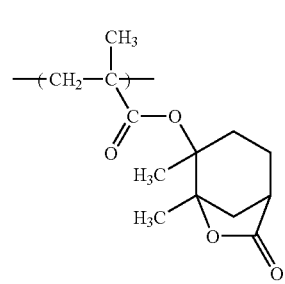
(Ib-11)
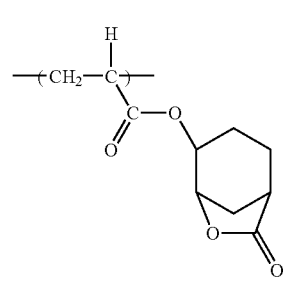
(Ib-12)
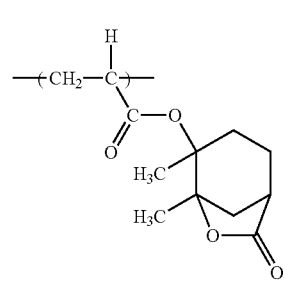
(Ib-13)
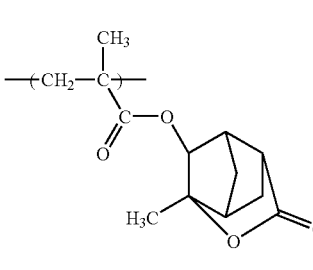
(Ib-14)
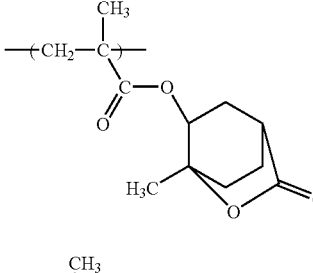
(Ib-15)
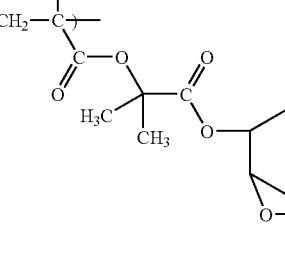

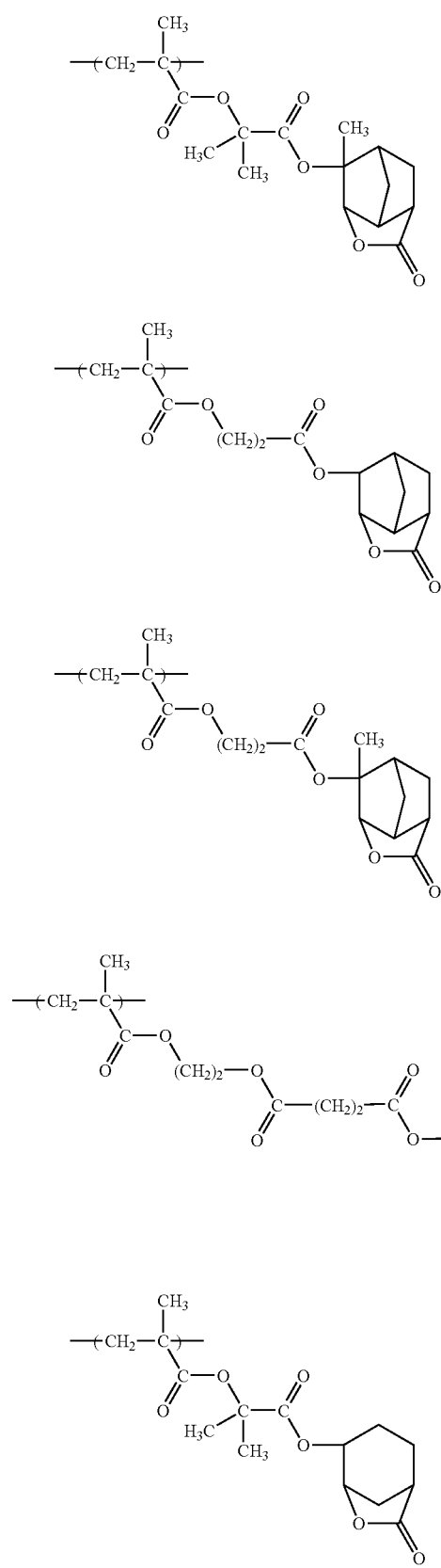
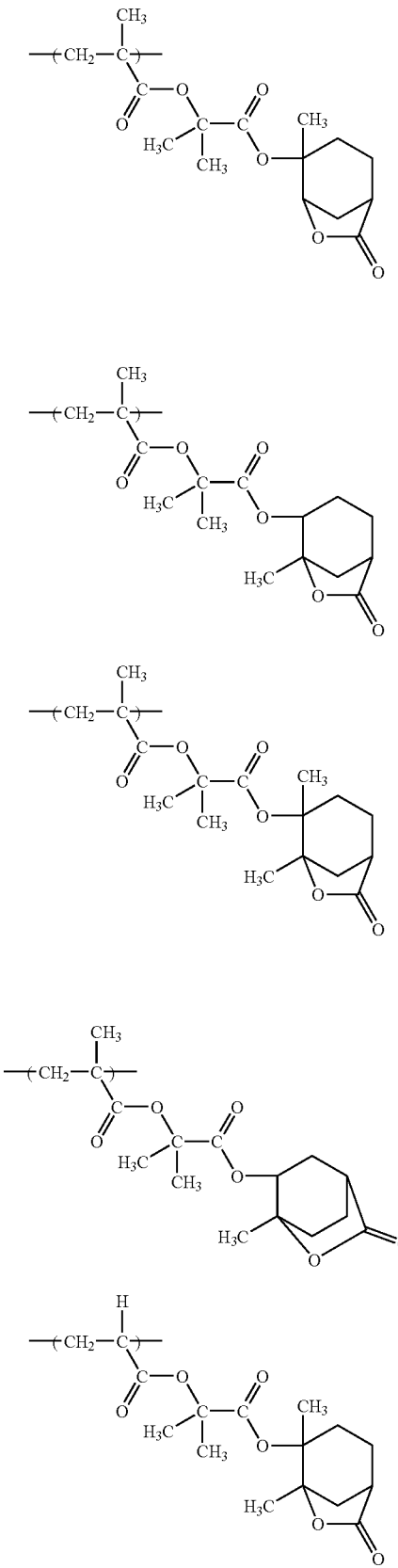

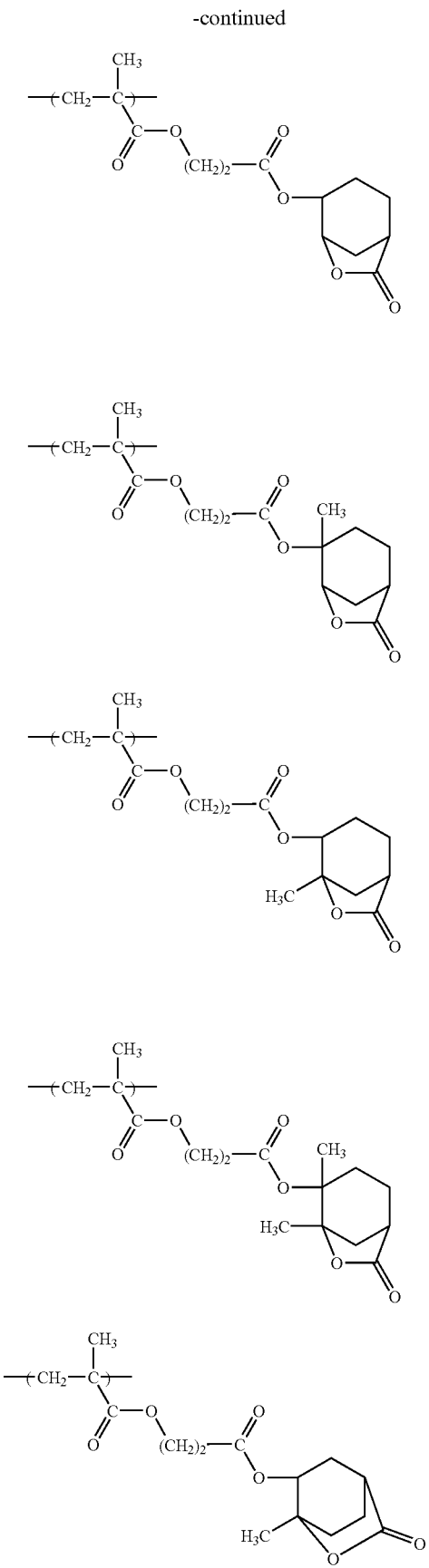

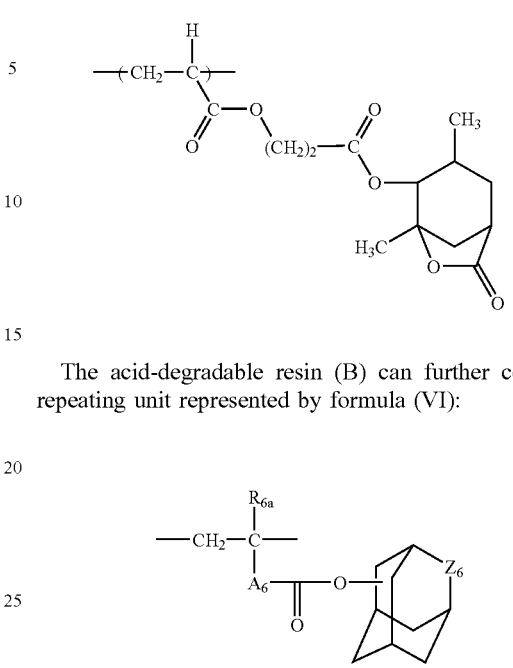

The acid-degradable resin (B) can further comprise a repeating unit represented by formula (VI):

wherein $R_{6a}$ represents a hydrogen atom, an alkyl group having 1 to 4 carbon atoms, a cyano group or a halogen atom; $A_6$ represents a single bond or one of, or a combination of two or more of, an alkylene group, a cycloalkylene group, an ether group, a thioether group, a carbonyl group, and an ester group; and $Z_6$ represents —O—C(=O)— or —C(=O)—O—.

In formula (VI), the alkylene group as $A_6$ includes a group represented by formula: —[C($R_{nf}$) ($R_{ng}$)]$_r$—, wherein $R_{nf}$ and $R_{ng}$, which may be the same or different, each represent a hydrogen atom, an alkyl group, a substituted alkyl group, a halogen atom, a hydroxyl group or an alkoxy group; and r represents an integer of 1 to 10. The alkyl group in the alkylene group is preferably a lower one, e.g., methyl, ethyl, propyl, isopropyl or butyl, still preferably methyl, ethyl, propyl or isopropyl. The substituent of the substituted alkyl group in the alkylene group includes a hydroxyl group, a halogen atom, and an alkoxy group. The alkoxy group includes one having 1 to 4 carbon atoms, e.g., methoxy, ethoxy, propoxy or butoxy. The halogen atom includes chlorine, bromine, fluorine, and iodine.

The cycloalkylene group as $A_6$ includes one having 3 to 10 carbon atoms, such as cyclopentylene, cyclohexylene or cyclooctylene.

The bridged alicyclic ring containing $Z_6$ may have a substituent, such as a halogen atom, an alkoxy group (preferably one having 1 to 4 carbon atoms), an alkoxycarbonyl group (preferably one having 1 to 5 carbon atoms), an acyl group (e.g., formyl or benzoyl), an acyloxy group (e.g., propylcarbonyloxy or benzoyloxy), an alkyl group (preferably one having 1 to 4 carbon atoms), a carboxyl group, a hydroxyl group, and an alkylsulfonylsulfamoyl group (e.g., —CONHSO$_2$CH$_3$). The alkyl group as a substituent may be substituted with a hydroxyl group, a halogen atom, an alkoxy group (preferably one having 1 to 4 carbon atoms), etc.

In formula (VI), the oxygen atom of the ester group linking $A_6$ and the bridged alicyclic ring may be bonded to any carbon atom of the bridged alicyclic ring.
Specific but non-limiting examples of the repeating unit represented by formula (VI) are shown below.
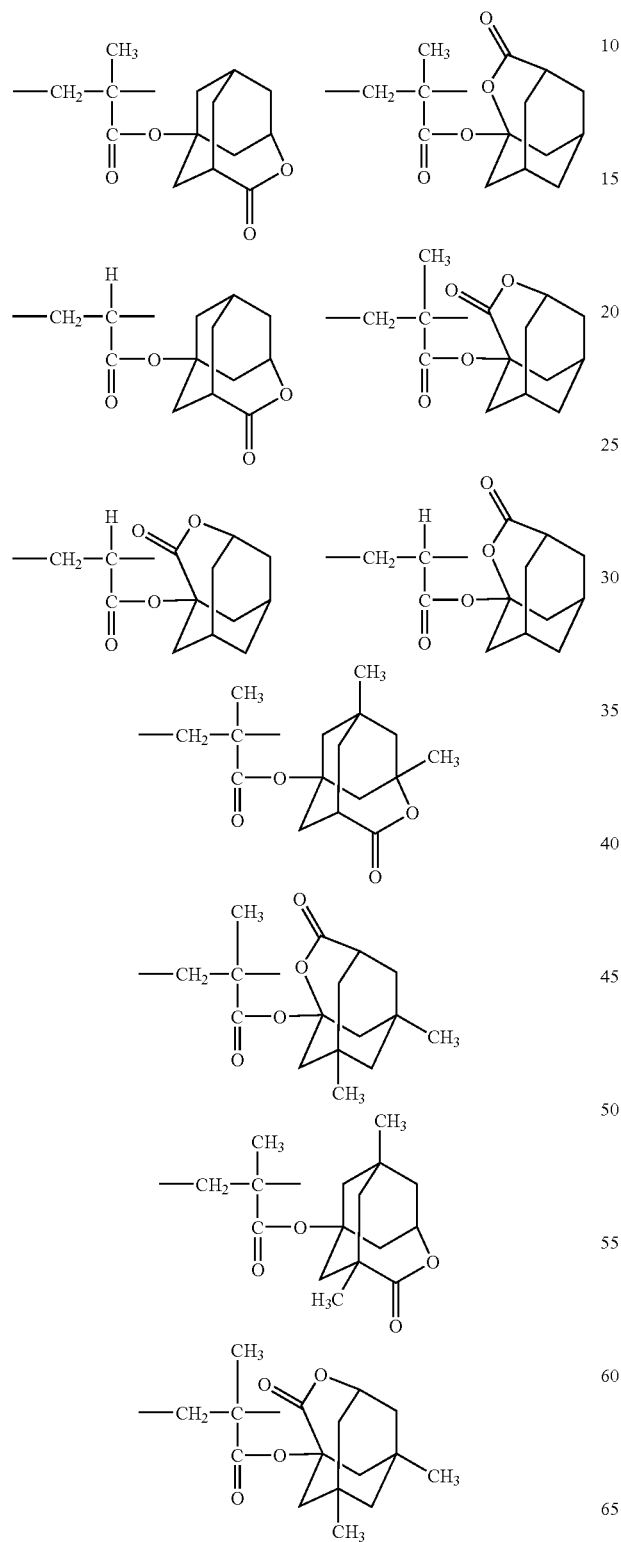
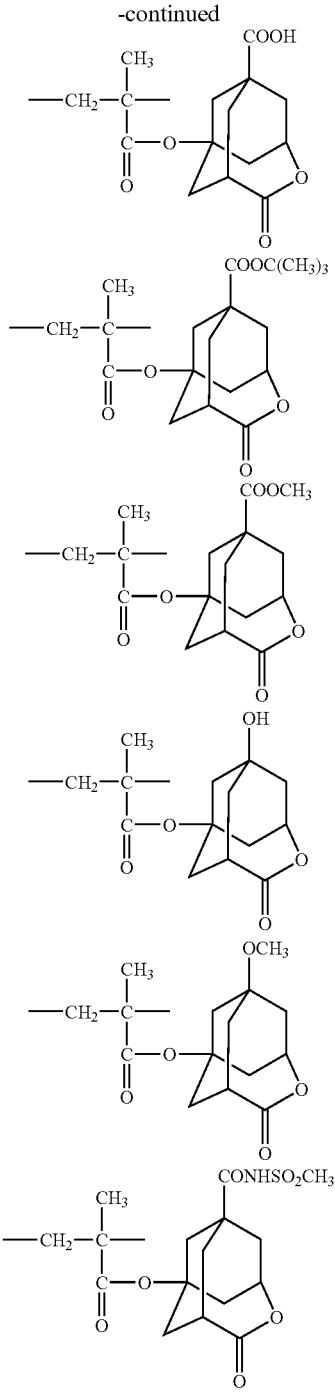
The acid-degradable resin (B) may comprise a repeating unit having a group represented by formula (VII):
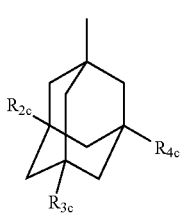
(VII)

wherein $R_{2c}$, $R_{3c}$, and $R_{4c}$ each represent a hydrogen atom or a hydroxyl group, provided that at least one of them is a hydroxyl group.

It is preferred that one or two of $R_{2c}$, $R_{3c}$, and $R_{4c}$ represent a hydroxyl group. It is still preferred that one of $R_{2c}$, $R_{3c}$, and $R_{4c}$ be a hydroxyl group.

The repeating units having the group represented by formulae (VII) include the units represented by formula (II-A) or (II-B) wherein at least one of $R_{13'}$, $R_{14'}$, $R_{15'}$, and $R_{16'}$ has the group of formula (VII) (for example, at least one of $R_{13'}$ to $R_{16'}$ is —COOR$_5$, wherein $R_5$ is the group of formula (VII)) and a repeating unit represented by formula (AII):

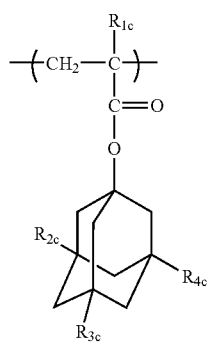

(AII)

wherein $R_{1c}$ represents a hydrogen atom or a methyl group; and $R_{2c}$, $R_{3c}$, and $R_{4c}$ are as defined above.

Specific but non-limiting examples of the repeating units represented by formula (AII) are shown below.

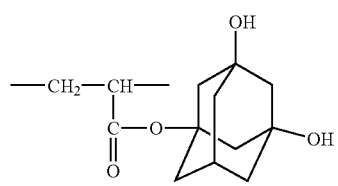

(1)

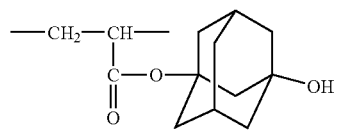

(2)

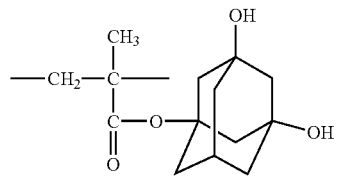

(3)

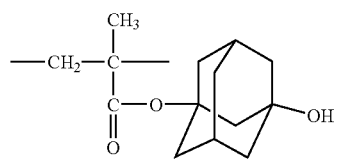

(4)

The acid-degradable resin (B) may further comprise a repeating unit represented by formula (VIII):

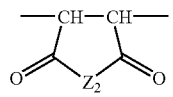

(VIII)

wherein $Z_2$ represents —O— or —N(R$_{41}$)—; $R_{41}$ represents a hydrogen atom, a hydroxyl group, an alkyl group, a haloalkyl group or —OSO$_2$—R$_{42}$; and $R_{42}$ represents an alkyl group, a haloalkyl group, a cycloalkyl group or a camphor residual group.

The alkyl group as $R_{41}$ or $R_{42}$ is preferably a straight-chain or branched one having 1 to 10 carbon atoms, still preferably a straight-chain or branched one having 1 to 6 carbon atoms, particularly preferably methyl, ethyl, propyl, isopropyl, n-butyl, isobutyl, sec-butyl or t-butyl. The haloalkyl group as $R_{41}$ or $R_{42}$ includes trifluoromethyl, nanofluorobutyl, pentadecafluorooctyl, and trichloromethyl. The cycloalkyl group as $R_{42}$ includes cyclopentyl, cyclohexyl, and cyclooctyl.

The alkyl group and the haloalkyl group as $R_{41}$ or $R_{42}$ and the cycloalkyl group and the camphor residue as $R_{42}$ may have a substituent. The substituent includes a hydroxyl group, a carboxyl group, a cyano group, a halogen atom (e.g., chlorine, bromine, fluorine or iodine), an alkoxy group (preferably one having 1 to 4 carbon atoms, e.g., methoxy, ethoxy, propoxy or butoxy), an acyl group (preferably one having 2 to 5 carbon atoms, e.g., formyl or acetyl), an acyloxy group (preferably one having 2 to 5 carbon atoms, e.g., acetoxy), and an aryl group (preferably one having 6 to 14 carbon atoms, e.g., phenyl).

The repeating unit represented by formula (VIII) includes, but is not limited to, the following units (I'-1) to (I'-7).

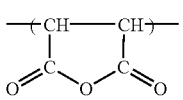

[I'-1]

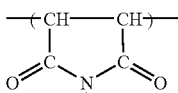

[I'-2]

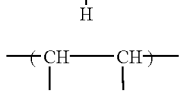

[I'-3]

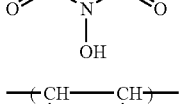

[I'-4]

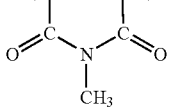

[I'-5]

-continued

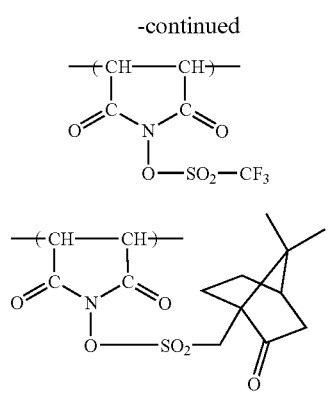

The acid-degradable resin (B) may further comprise various repeating units other than those described above for the purpose of improving dry etching resistance, suitability to standard developing solutions, adhesion to a substrate, resist profile, and basic characteristics required of a resist, such as resolution, heat resistance, and sensitivity. Useful comonomers providing the other repeating units include, but are not limited to, compounds having one addition polymerizable unsaturated bond, such as acrylic esters, methacrylic esters, acrylamides, methacrylamides, allyl compounds, vinyl ethers, and vinyl esters. Incorporation of these repeating units enables fine adjustment of various performance properties required of the acid-degradable resin, particularly solubility in a solvent for coating, film-forming properties (controllable by glass transition point adjustment), alkali developability, resistance to resist film thickness loss (controllable by hydrophilicity or hydrophobicity adjustment and by selection of an alkali soluble group), adhesion (of an unexposed portion) to a substrate, and dry etching resistance.

The acrylic esters include alkyl esters, preferably those having 1 to 10 carbon atoms in the alkyl moiety. Examples are methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, and tetrahydrofurfuryl acrylate.

The methacrylic esters include alkyl esters, preferably those having 1 to 10 carbon atoms in the alkyl moiety. Examples are methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate.

The acrylamides include acrylamide, N-alkylacrylamides having an alkyl moiety containing 1 to 10 carbon atoms (e.g., methyl, ethyl, propyl, butyl, t-butyl, heptyl, octyl, cyclohexyl or hydroxyethyl), N,N-dialkylacrylamides having an alkyl group containing 1 to 10 carbon atoms (e.g., methyl, ethyl, butyl, isobutyl, ethylhexyl or cyclohexyl), N-hydroxyethyl-N-methylacrylamide, and N-2-acetamido-ethyl-N-acetylacrylamide.

The methacrylamides include methacrylamide, N-alkyl-methacrylamides having an alkyl moiety containing 1 to 10 carbon atoms (e.g., methyl, ethyl, t-butyl, ethylhexyl, hydroxyethyl or cyclohexyl), N,N-dialkylmethacrylamides having ethyl, propyl, butyl, etc. as an alkyl moiety, and N-hydroxyethyl-N-methylmethacrylamide.

The allyl compounds include allyl esters (e.g., allyl acetate, allyl caproate, allyl caprylate, allyl laurate, allyl palmitate, allyl stearate, allyl benzoate, allyl acetoacetate, and allyl lactate) and allyloxyethanol.

The vinyl ethers include alkyl vinyl ethers, such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.

The vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate.

Further included in the other copolymerizable monomers are dialkyl itaconates (e.g., dimethyl itaconate, diethyl itaconate, and dibutyl itaconate), dialkyl fumarates (e.g., dibutyl fumarate), monoalkyl fumarates, crotonic acid, itaconic acid, maleic anhydride, maleimide, acrylonitrile, methacrylonitrile, and maleonitrile. Any other addition polymerizable unsaturated compounds that are copolymerizable with monomers having the above-described various repeating units can be used.

The molar ratio of the repeating units constituting the acid-degradable resin (B) is decided appropriately with due consideration for dry etching resistance, suitability to standard developing solutions, adhesion to a substrate, resist profile, and basic characteristics required of a resist, such as resolution, heat resistance, and sensitivity.

The acid-degradable resin (B) preferably includes the following types.

(B-1) A resin containing a repeating unit having an alicyclic hydrocarbon group-containing partial structure represented by formula (pI), (pII), (pIII), (pIV), (pV) or (pVI) (side chain type)

(B-2) A resin containing a repeating unit represented by formula (II-AB) (main chain type)

The main chain type (B-2) includes a resin containing a repeating unit represented by formula (II-AB) and having a maleic anhydride derivative structure and a (meth)acrylate structure (hybrid type).

A preferred content of the repeating unit having an alicyclic hydrocarbon group-containing partial structure represented by formula (pI), (pII), (pIII), (pIV), (pV) or (pVI) is 30 to 70 mol %, particularly 35 to 65 mol %, especially 40 to 60 mol %, based on the total repeating units.

A preferred content of the repeating unit represented by formula (II-AB) is 10 to 60 mol %, particularly 15 to 55 mol %, especially 20 to 50 mol %, based on the total repeating units.

The contents of other repeating units derived from the above-recited copolymerizable monomers are decided appropriately according to desired resist performance properties. In general, the content of the other repeating units is preferably 99 mol % or less, still preferably 90 mol % or less, particularly preferably 80 mol % or less, based on the total mole number of the repeating unit having the alicyclic hydrocarbon group-containing partial structure represented by formula (pI), (pII), (pIII), (pIV), (pV) or (pVI) and the repeating unit represented by formula (II-AB).

Where the resist composition of the invention is adapted to be exposed to ArF laser light, it is preferred that the acid-degradable resin (B) be free from an aromatic group to assure transparency to ArF laser light.

An acid-degradable resin which has a structure containing a fluorine atom substituting the main chain and/or the side chain of the polymer skeleton and decomposes by the action of an acid to increase its solubility in an alkali developing solution is also preferred as component (B). Such a resin will hereinafter be referred to as a fluorine-containing resin. A preferred fluorine-containing resin (B) includes a resin containing at least one fluorine-containing divalent group selected from a perfluoroalkylene group and a perfluoroarylene group in the main chain thereof and a resin containing, in the side chain thereof, at least one fluorine-containing monovalent group selected from a perfluoroalkyl group, a perfluoroaryl group, a hexafluoro-2-propanol group, and a hexafluoro-2-propanol group with its hydroxyl group being protected.

More specifically, the fluorine-containing resin (B) includes resins containing at least one of repeating units represented by formulae (I) through (X):

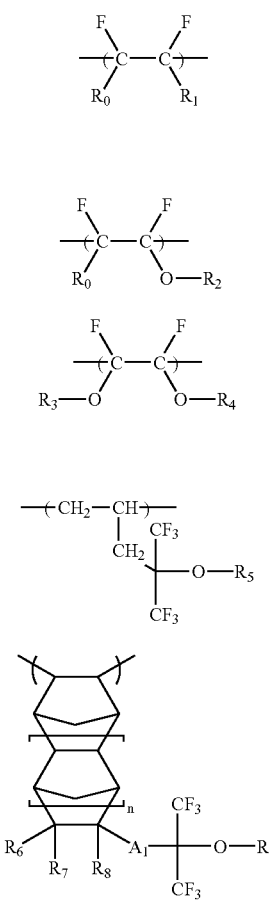

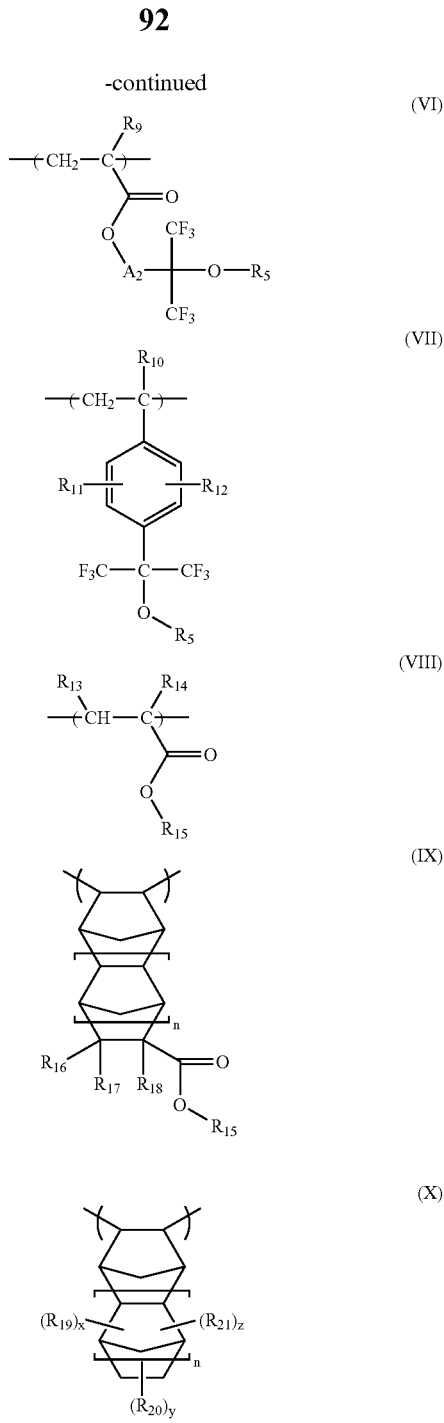

wherein $R_0$ and $R_1$ each represent a hydrogen atom, a fluorine atom, a substituted or unsubstituted alkyl group, a substituted or unsubstituted perfluoroalkyl group, a substituted or unsubstituted cycloalkyl group or a substituted or unsubstituted aryl group; $R_2$, $R_3$, and $R_4$ each represent a substituted or unsubstituted alkyl group, a substituted or unsubstituted perfluoroalkyl group, a substituted or unsubstituted cycloalkyl group or a substituted or unsubstituted aryl group; $R_0$ and $R_1$ in formula (I), $R_0$ and $R_2$ in formula (II), or $R_3$ and $R_4$ in formula (III) may be connected to form a ring; $R_5$ represents a hydrogen atom, a substituted or unsubstitutedalkyl group, a substituted or unsubstituted perfluoroalkyl group, a substituted or unsubstituted monocyclic or polycyclic cycloalkyl group, a substituted or unsubstituted acyl group or a substituted or unsubstituted alkoxycarbonyl group; $R_6$, $R_7$, and $R_8$, which may be the same or different, each represent a hydrogen atom, a halogen atom, a substituted or unsubstituted alkyl group, a substituted or unsubstituted perfluoroalkyl group or a substituted or unsubstituted alkoxy group; $R_9$ and $R_{10}$, which may be the same or different, each represent a hydrogen atom, a halogen atom, a cyano group, a substituted or unsubstituted alkyl group or a substituted or unsubstituted haloalkyl group; $R_{11}$ and $R_{12}$, which may be the same or different, each represent a hydrogen atom, a hydroxyl group, a halogen atom, a cyano group, an alkoxy group, an acyl group, a substituted or unsubstituted alkyl group, a substituted or unsubstituted cycloalkyl group, a substituted or unsubstituted alkenyl group, a substituted or unsubstituted aralkyl group or a substituted or unsubstituted aralkyl group; $R_{13}$ and $R_{14}$, which may be the same or different, each represent a hydrogen atom, a halogen atom, a cyano group, a substituted or unsubstituted alkyl group or a substituted or unsubstituted haloalkyl group; $R_{15}$ represents a fluorine-containing alkyl group, a fluorine-containing monocyclic or polycyclic cycloalkyl group, a fluorine-containing alkenyl group, a fluorine-containing aralkyl group or a fluorine-containing aryl group; $R_{16}$, $R_{17}$, and $R_{18}$, which may be the same or different, each represent a hydrogen atom, a halogen atom, a cyano group, a substituted or unsubstituted alkyl group, a substituted or unsubstituted perfluoroalkyl group, a substituted or unsubstituted alkoxy group or —CO—O—$R_{15}$; $R_{19}$, $R_{20}$, $R_{21}$, which may be the same or different, each represent a hydrogen atom, a fluorine atom, a fluorine-containing alkyl group, a fluorine-containing monocyclic or polycyclic cycloalkyl group, a fluorine-containing alkenyl group, a fluorine-containing aralkyl group, a fluorine-containing aryl group or a fluorine-containing alkoxy group, provided that not all of $R_{19}$, $R_{20}$, and $R_{21}$ represent hydrogen; $A_1$ and $A_2$ each represent a single bond, a substituted or unsubstituted alkylene group, a substituted or unsubstituted alkenylene group, a substituted or unsubstituted cycloalkylene group, a substituted or unsubstituted arylene group, —O—CO—$R_{22}$, —CO—O—$R_{23}$— or —CO—N($R_{24}$) —$R_{25}$—;

wherein $R_{22}$, $R_{23}$, and $R_{25}$, which maybe the same or different, each represent a single bond or a divalent group selected from an alkylene group, an alkenylene group, a cycloalkylene group, and an arylene group, all of which may have an ether group, an ester group, an amide group, a urethane group or a ureido group; $R_{24}$ represents a hydrogen atom, a substituted or unsubstituted alkyl group, a substituted or unsubstituted cycloalkyl group, a substituted or unsubstituted aralkyl group or a substituted or unsubstituted aryl group;

n represents 0 or 1; and x, y, and z each represent an integer of 1 to 4.

It is preferred that the acid-degradable fluorine-containing resin (B) further comprise at least one repeating unit represented by formula (XI), (XII) or (XIII):

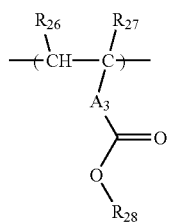

(XI)

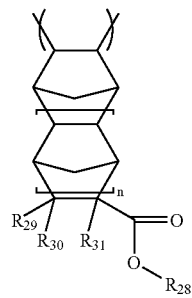

(XII)

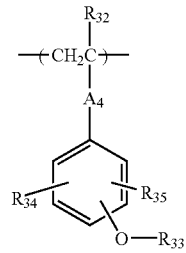

(XIII)

wherein $R_{26}$, $R_{27}$, and $R_{32}$, which may be the same or different, each represent a hydrogen atom, a halogen atom, a cyano group, a substituted or unsubstituted alkyl group or a substituted or unsubstituted haloalkyl group; $R_{28}$ and $R_{33}$ each represent —C($R_{36}$) ($R_{37}$) ($R_{38}$), —C($R_{36}$) ($R_{37}$) (O$R_{39}$) or a group represented by formula (XIV):

(XIV)

wherein $R_{40}$ represents a substituted or unsubstituted alkyl group, a substituted or unsubstituted cycloalkyl group, a substituted or unsubstituted alkenyl group, a substituted or unsubstituted alkynyl group, a substituted or unsubstituted aralkyl group or a substituted or unsubstituted aryl group; and Z represents an atomic group necessary to form a monocyclic or polycyclic alicyclic group together with the adjacent carbon atom;

$R_{29}$, $R_{30}$, and $R_{31}$, which maybe the same or different, each represent a hydrogen atom, a halogen atom, a cyano group, a substituted or unsubstituted alkyl group, a substituted or unsubstituted perfluoroalkyl group, a substituted or unsubstituted alkoxy group or —CO—O—$R_{28}$; $R_{34}$ and $R_{35}$, which may be the same or different, each represent a hydrogen atom, a hydroxyl group, a halogen atom, a cyano group, an alkoxy group, an acyl group, a substituted or unsubstituted alkyl group, a substituted or unsubstituted cycloalkyl group, a substituted or unsubstituted alkenyl group, a substituted or unsubstituted aralkyl group or a substituted or unsubstituted aryl group; $R_{36}$, $R_{37}$, $R_{38}$, and $R_{39}$, which may be the same or different, each represent a substituted or unsubstituted alkyl group, a substituted or unsubstituted cycloalkyl group, a substituted or unsubstituted alkenyl group, a substituted or unsubstituted alkynyl group, a substituted or unsubstitutedaralkyl group or a substituted or unsubstituted aryl group; two of $R_{36}$, $R_{37}$, and $R_{38}$, or two of $R_{36}$, $R_{37}$, and $R_{39}$ may be connected to form a ring which may contain an oxo group; $A_3$ and $A_4$ each represent a single bond, a substituted or unsubstituted alkylene group, a substituted or unsubstituted alkenylene group, a substituted or unsubstituted cycloalkylene group, a substituted or unsubstituted arylene group, —O—CO—$R_{22}$—, —CO—O—$R_{23}$— or —CO—N($R_{24}$)—$R_{25}$— (wherein $R_{22}$, $R_{23}$, $R_{24}$, and $R_{25}$ are as defined above); and n represents 0 or 1.

For the purpose of controlling hydrophilicity or hydrophobicity, glass transition point, transparency to exposure light, and like attributes of the acid-degradable fluorine-containing resin (B), the fluorine-containing resin (B) may further comprise at least one repeating unit selected from a maleic anhydride unit represented by formula (XV), a vinyl ether unit represented by formula (XVI), and a cyano-containing vinyl compound unit represented by formula (XVII):

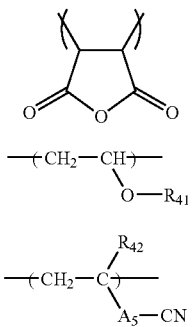

(XV)

(XVI)

(XVII)

wherein $R_{41}$ represents a substituted or unsubstituted alkyl group, a substituted or unsubstituted cycloalkyl group, a substituted or unsubstituted aralkyl group or a substituted or unsubstituted aryl group; $R_{42}$ represents a hydrogen atom, a cyano group, a substituted or unsubstituted alkyl group or a substituted or unsubstituted haloalkyl group; $A_5$ represents a single bond, a substituted or unsubstituted alkylene group, a substituted or unsubstituted alkenylene group, a substituted or unsubstituted cycloalkylene group, a substituted or unsubstituted arylene group, —O—CO—$R_{22}$—, —CO—O—$R_{23}$— or —CO—N($R_{24}$)—$R_{25}$— (wherein $R_{22}$, $R_{23}$, $R_{24}$, and $R_{25}$ are as defined above).

Still preferred acid-degradable fluorine-containing resins (B) include a resin comprising at least one repeating unit represented by formula (IA) and at least one repeating unit represented by formula (IIA) and a resin comprising at least one repeating unit represented by formula (IIA) and at least one repeating unit represented by formula (VIA). The resin comprising at least one repeating unit of formula (IA) and at least one repeating unit of formula (IIA) and the resin comprising at least one repeating unit of formula (IIA) and at least one repeating unit of formula (VIA) may further comprise the repeating unit represented by formula (I) to (V).

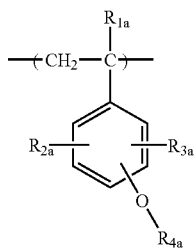

(IA)

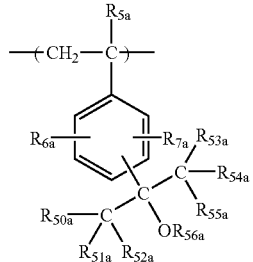

(IIA)

wherein $R_{1a}$ and $R_{5a}$, which may be the same or different, each represent a hydrogen atom, a halogen atom, a cyano group or a substituted or unsubstituted alkyl group; $R_{2a}$, $R_{3a}$, $R_{6a}$, and $R_{7a}$, which may be the same or different, each represent a hydrogen atom, a halogen atom, a cyano group, a hydroxyl group, a substituted or unsubstituted alkyl group, a substituted or unsubstituted cycloalkyl group, a substituted or unsubstituted alkoxy group, a substituted or unsubstituted acyl group, a substituted or unsubstituted acyloxy group, a substituted or unsubstituted alkenyl group, a substituted or unsubstituted aryl group or a substituted or unsubstituted aralkyl group; $R_{50a}$, $R_{51a}$, $R_{52a}$, $R_{53a}$, $R_{54a}$, and $R_{55a}$, which may be the same or different, each represent a hydrogen atom, a fluorine atom or a substituted or unsubstituted alkyl group, provided that at least one of $R_{50a}$ to $R_{55a}$ represents a fluorine atom or an alkyl group with at least one hydrogen atom thereof substituted with a fluorine atom; $R_{56a}$ represents a hydrogen atom, a substituted or unsubstituted alkyl group, a substituted or unsubstituted cycloalkyl group, a substituted or unsubstituted acyl group or a substituted or unsubstituted alkoxycarbonyl group, preferably a hydrogen atom; and $R_{4a}$ represents a group represented by formula (IVA) or (VA):

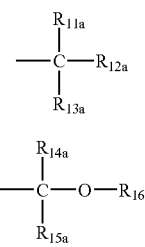

(IVA)

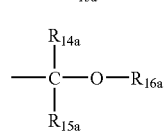

(VA)

wherein $R_{11a}$, $R_{12a}$, and $R_{13a}$, which may be the same or different, each represent a substituted or unsubstituted alkyl group, a substituted or unsubstituted cycloalkyl group, a substituted or unsubstituted alkenyl group, a substituted or unsubstituted aralkyl group or a substituted or unsubstituted aryl group; $R_{14a}$ and $R_{15a}$, which may be the same or different, each represent a hydrogen atom or a substituted or unsubstituted alkyl group; $R_{16a}$ represents a substituted or unsubstituted alkyl group, a substituted or unsubstituted cycloalkyl group, a substituted or unsubstituted aralkyl group or a substituted or unsubstituted aryl group; and two of $R_{14a}$, $R_{15a}$, and $R_{16a}$ may be taken together to form a ring.

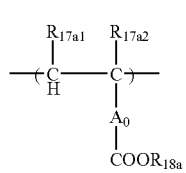
(VIA)

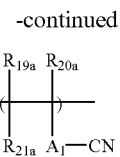
(VIIA)

wherein $R_{17a1}$ and $R_{17a2}$, which may be the same or different, each represent a hydrogen atom, a halogen atom, a cyano group or a substituted or unsubstituted alkyl group; $R_{18a}$ represents —C($R_{18a1}$) ($R_{18a2}$) ($R_{18a3}$) or —C($R_{18a1}$) ($R_{18a2}$) (O$R_{18a4}$); $R_{18a1}$, $R_{18a2}$, $R_{18a3}$, and $R_{18a4}$, which may be the same or different, each represent a hydrogen atom, a substituted or unsubstituted alkyl group, a substituted or unsubstituted cycloalkyl group, a substituted or unsubstituted alkenyl group, a substituted or unsubstituted aralkyl group or a substituted or unsubstituted aryl group; two of $R_{18a1}$, $R_{18a2}$, and $R_{18a3}$ or two of $R_{18a1}$, $R_{18a2}$, and $R_{18a4}$ may be taken together to form a ring; and $A_0$ represents a single bond or a substituted or unsubstituted divalent linking group, preferably a single bond.

In formula (VIA), $R_{18a}$ is preferably a group represented by formula (VIA-A) or (VIA-B):

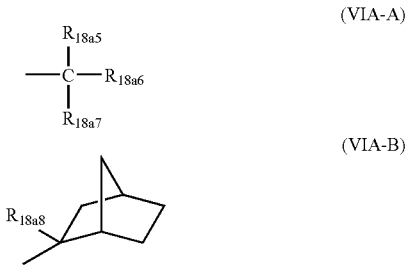

wherein $R_{18a5}$ and $R_{18a6}$, which may be the same or different, each represent a substituted or unsubstituted alkyl group; $R_{18a7}$ represents a substituted or unsubstituted cycloalkyl group; and $R_{18a8}$ represents a substituted or unsubstituted alkyl group, a substituted or unsubstituted alkenyl group, a substituted or unsubstituted alkynyl group, a substituted or unsubstituted aralkyl group or a substituted or unsubstituted aryl group.

It is also preferred that at least one of $R_{1a}$ in formula (IA), $R_{5a}$ in formula (IIA), and $R_{17a2}$ in formula (VIA) be a trifluoromethyl group.

The resin comprising at least one repeating unit of formula (IA) and at least one repeating unit of formula (IIA) and the resin comprising at least one repeating unit of formula (IIA) and at least one repeating unit of formula (VIA) may further comprise at least one of repeating units represented by formulae (IIIA) and (VIIA):

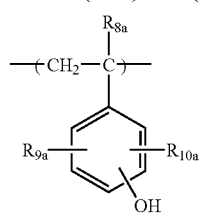
(IIIA)

wherein $R_{8a}$ represents a hydrogen atom, a halogen atom, a cyano group or a substituted or unsubstituted alkyl group; $R_{9a}$ and $R_{10a}$, which may be the same or different, each represent a hydrogen atom, a halogen atom, a cyano group, a substituted or unsubstituted alkyl group, a substituted or unsubstituted cycloalkyl group, a substituted or unsubstituted alkoxy group, a substituted or unsubstituted acyl group, a substituted or unsubstituted acyloxy group, a substituted or unsubstituted alkenyl group, a substituted or unsubstituted aryl group or a substituted or unsubstituted aralkyl group; $R_{19a}$ and $R_{20a}$, which may be the same or different, each represent a hydrogen atom, a halogen atom, a cyano group or a substituted or unsubstituted alkyl group; $R_{21a}$ represents a hydrogen atom, a halogen atom, a substituted or unsubstituted alkyl group or -$A_1$-CN; and $A_1$ represents a single bond or a divalent linking group.

In the formulae shown above with respect to the fluorine-containing acid-degradable resin (B), the alkyl groups include those having 1 to 8 carbon atoms, preferably methyl, ethyl, propyl, n-butyl, sec-butyl, hexyl, 2-ethylhexyl, and octyl. The cycloalkyl groups may be either monocyclic or polycyclic. The monocyclic cycloalkyl groups include those having 3 to 8 carbon atoms, preferably including cyclopropyl, cyclopentyl, cyclohexyl, cycloheptyl, and cyclooctyl. The polycyclic cycloalkyl groups include those having 6 to 20 carbon atoms, preferably including adamantyl, norbornyl, isobornyl, camphanyl, dicyclopentyl, α-pinenyl, tricyclodecanyl, tetracyclododecyl, and androstanyl. The carbon atom of the mono- or polycyclic cycloalkyl groups may be displaced with a hetero atom, such as oxygen.

The perfluoroalkyl groups include those having 4 to 12 carbon atoms. Preferred examples are perfluorobutyl, perfluorohexyl, perfluorooctyl, perfluorooctylethyl, and perfluorododecyl. The haloalkyl groups include those having 1 to 4 carbon atoms, preferably including chloromethyl, chloropropyl, chlorobutyl, bromomethyl, and bromoethyl.

The aryl groups include those having 6 to 15 carbon atoms. Preferred examples are phenyl, tolyl, dimethylphenyl, 2,4,6-trimethylphenyl, naphthyl, anthryl, and 9,10-dimethoxyanthryl. The aralkyl groups include those having 7 to 12 carbon atoms. Preferred examples are benzyl, phenethyl, and naphthylmethyl.

The alkenyl groups include those having 2 to 8 carbon atoms. Preferred examples are vinyl, allyl, butenyl, and cyclohexenyl. The alkoxy groups include those having 1 to 8 carbon atoms. Preferred examples are methoxy, ethoxy, n-propoxy, isopropoxy, pentoxy, allyloxy, and octoxy. The acyl groups include those having 1 to 10 carbon atoms. Preferred examples are formyl, acetyl, propanoyl, butanoyl, pivaloyl, octanoyl, and benzoyl. The acyloxy groups preferably include those having 2 to 12 carbon atoms, such as acetoxy, propionyloxy, and benzoyloxy.

The alkynyl groups preferably include those having 2 to 5 carbon atoms, such as ethynyl, propynyl, and butynyl. The alkoxycarbonyl groups include isopropoxycarbonyl, t-butoxycarbonyl, t-amyloxycarbonyl, and 1-methyl-1-cyclohexyloxycarbonyl, preferably a secondary alkoxycarbonyl group, still preferably a tertiary one.

The halogen atom includes fluorine, chlorine, bromine, and iodine.

The alkylene groups preferably include substituted or unsubstituted ones having 1 to 8 carbon atoms, such as methylene, ethylene, propylene, butylene, hexylene, and octylene. The alkenylene groups preferably include those having 2 to 6 carbon atoms, such as ethenylene, propenylene, and butenylene. The cycloalkylene groups preferably include those having 5 to 8 carbon atoms, such as cyclopentylene and cyclohexylene. The arylene groups preferably include those having 6 to 15 carbon atoms, such as phenylene, tolylene, and naphthylene.

The divalent linking groups include a substituted or unsubstituted alkylene group, a substituted or unsubstituted cycloalkylene group, a substituted or unsubstituted alkenylene group, a substituted or unsubstituted arylene group, $-O-CO-R_{22a}-$, $-CO-O-R_{23a}-$ or $-CO-N(R_{24a})-$, wherein $R_{22a}$, $R_{23a}$, and $R_{25a}$, which may be the same or different, each represent a single bond or an alkylene group, an alkenylene group, a cycloalkylene group or an arylene group, each of which may contain an ether group, an ester group, an amide group, a urethane group or a ureido group; and $R_{24a}$ represents a hydrogen atom, a substituted or unsubstituted alkyl group, a substituted or unsubstituted cycloalkyl group, a substituted or unsubstituted aralkyl group or a substituted or unsubstituted aryl group.

The ring formed by $R_0$ and $R_1$, the ring formed by Ro and $R_2$, and the ring formed by $R_3$ and $R_4$ include 5- to 7-membered rings, such as pentane, hexane, furan, dioxonol, and 1,3-dioxolane, each of which is substituted with fluorine.

The ring formed by two of $R_{36}$, $R_{37}$, and $R_{38}$ and the ring formed by two of $R_{36}$, $R_{37}$, and $R_{39}$ include 3- to 8-membered rings, such as cyclopropane, cyclopentane, cyclohexane, furan, and pyran.

The ring formed by two of $R_{14a}$, $R_{15a}$, and $R_{16a}$, the ring formed by two of $R_{18a1}$, $R_{18a2}$, and $R_{18a3}$, and the ring formed by two of $R_{18a1}$, $R_{18a2}$, and $R_{18a4}$ preferably include 3- to 8-membered rings, such as cyclopropane, cyclopentane, cyclohexane, tetramethylene oxide, pentamethylene oxide, hexamethylene oxide, furan, pyran, dioxonol, and 1,3-dioxolane.

Z represents an atomic group constituting a monocyclic or polycyclic alicyclic group. The monocyclic alicyclic group formed by Z includes one having 3 to 8 carbon atoms, preferably including cyclopropyl, cyclopentyl, cyclohexyl, cycloheptyl, and cyclooctyl. The polycyclic alicyclic group formed by Z includes one having 6 to 20 carbon atoms, preferably including adamantyl, norbornyl, isobornyl, camphanyl, dicyclopentyl, α-pinenyl, tricyclodecanyl, tetracyclododecyl, and androstanyl.

The substituents that these groups can have include an alkyl group, a cycloalkyl group, an aryl group; groups having active hydrogen, such as an amino group, an amide group, a ureido group, a urethane group, a hydroxyl group, and a carboxyl group; a halogen atom (e.g., fluorine, chlorine, bromine or iodine), an alkoxy group (e.g., methoxy, ethoxy, propoxy or butoxy), a thioether group, an acyl group (e.g., acetyl, propanoyl, benzoyl), an acyloxy group (e.g., acetoxy, propanoyloxy or benzoyloxy), an alkoxycarbonyl group (e.g., methoxycarbonyl, ethoxycarbonyl or propoxycarbonyl), a cyano group, and a nitro group. The alkyl, cycloalkyl and aryl groups include the respective examples recited above. The alkyl group may further be substituted with a fluorine atom or a cycloalkyl group.

The acid-degradable group, which decomposes in the presence of an acid to become an alkali-soluble group, which is contained in the fluorine-containing resin (B) includes $-O-C(R_{36})(R_{37})(R_{38})$, $-O-C(R_{36})(R_{37})(OR_{39})$, $-O-COO-C(R_{36})(R_{37})(R_{38})$, $-O-C(R_{01})(R_{02})COO-C(R_{36})(R_{37})(R_{38})$, $-COO-C(R_{36})(R_{37})(R_{38})$, and $-COO-C(R_{36})(R_{37})(OR_{39})$, wherein $R_{36}$, $R_{37}$, $R_{38}$, and $R_{39}$ are as defined above; and $R_{01}$ and $R_{02}$ each represent a hydrogen atom or the above-described substituted or unsubstituted alkyl, cycloalkyl, alkenyl, aralkyl or aryl group.

Examples of preferred acid-degradable groups include ether or ester groups of tertiary alkyl groups, such as t-butyl, t-amyl, 1-alkyl-1-cyclohexyl, 2-alkyl-2-adamantyl, 2-adamantyl-2-propyl, and 2-(4-methylcyclohexyl)-2-propyl; 1-alkoxy-1-ethoxy groups; acetal or acetal ester groups, such as tetrahydropyranyl; t-alkylcarbonate groups, and t-alkylcarbonylmethoxy groups.

The total content of the repeating units represented by formulae (I) to (X) in the fluorine-containing resin (B) is generally 10 to 80 mol %, preferably 30 to 70 mol %, still preferably 35 to 65 mol %.

The total content of the repeating units represented by formula (XI) to (XIII) in the fluorine-containing resin (B) is generally 0 to 70 mol %, preferably 10 to 60 mol %, still preferably 20 to 50 mol %.

The total content of the repeating units represented by formula (XV) to (XVIII) in the fluorine-containing resin (B) is generally 0 to 70 mol %, preferably 10 to 60 mol %, still preferably 20 to 50 mol %.

The fluorine-containing resin (B) preferably includes a resin comprising at least one of the repeating units of formulae (I) to (III) and at least one of the repeating units of formula (IV) to (VI), a resin comprising at least one of the repeating units of formula (IV) to (VI) and at least one of the repeating units of formulae (VIII) to (X), and a resin comprising at least one of the repeating units of formula (IV) to (VII) and at least one of the repeating units of formula (XV) to (XVII). These preferred resins sufficiently increase transparency to light of 157 nm and suppress reduction of dry etching resistance.

The resin comprising at least one of the repeating units of formulae (I) to (III) and at least one of the repeating units of formula (IV) to (VI) usually has a total content of the former units of 0 to 70 mol %, preferably 10 to 60 mol %, still preferably 20 to 50 mol %, and a total content of the latter units of 10 to 80 mol %, preferably 30 to 70 mol %, still preferably 35 to 65 mol %.

The resin comprising at least one of the repeating units of formula (IV) to (VI) and at least one of the repeating units of formulae (VIII) to (X) usually has a total content of the former units of 10 to 80 mol %, preferably 30 to 70 mol %, still preferably 35 to 65 mol %, and a total content of the latter units of 0 to 70 mol %, preferably 10 to 60 mol %, still preferably 20 to 50 mol %.

The resin comprising at least one of the repeating units of formula (IV) to (VII) and at least one of the repeating units of formula (XV) to (XVII) usually has a total content of the former units of 10 to 80 mol %, preferably 30 to 70 mol %, still preferably 35 to 65 mol %, and a total content of the latter units of 0 to 70 mol %, preferably 10 to 60 mol %, still preferably 20 to 50 mol %.

The resin comprising at least one of the repeating units of formula (IA) and at least one of the repeating units of formula (IIA) usually has a total content of the repeating units of formula (IA) of 5 to 80 mol %, preferably 10 to 75 mol %, still preferably 20 to 70 mol %, and a total content of the repeating units of formula (IIA) of 5 to 80 mol %, preferably 10 to 70 mol %, still preferably 20 to 65 mol %.

The resin comprising at least one of the repeating units of formula (IIA) and at least one of the repeating units of formula (VIA) usually has a total content of the repeating units of formula (IIA) of 5 to 80 mol %, preferably 10 to 70 mol %, still preferably 20 to 65 mol %, and a total content of the repeating units of formula (VIA) of 5 to 80 mol %, preferably 10 to 70 mol %, still preferably 20 to 65 mol %.

The content of the repeating unit of formula (IIIA) in these resins is usually 1 to 40 mol %, preferably 3 to 35 mol %, still preferably 5 to 30 mol %. The content of the repeating unit of formula (VIIA) in these resins is usually 1 to 40 mol %, preferably 3 to 35 mol %, still preferably 5 to 30 mol %.

The acid-degradable fluorine-containing resin (B) may further comprise various repeating units other than those described above for the purpose of improving resist performance. Useful comonomers providing the other repeating units include compounds having one addition polymerizable unsaturated bond, such as acrylic esters, acrylamides, methacrylic esters, methacrylamides, allyl compounds, vinyl ethers, vinyl esters, styrenes, and crotonic esters.

The acrylic esters include alkyl esters, preferably those having 1 to 10 carbon atoms in the alkyl moiety and aryl esters. Examples of the alkyl esters are methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, furfuryl acrylate, and tetrahydrofurfuryl acrylate. Examples of the aryl esters include phenyl acrylate.

The methacrylic esters include alkyl esters, preferably those having 1 to 10 carbon atoms in the alkyl moiety and aryl esters. Examples of the alkyl esters are methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidylmethacrylate, furfurylmethacrylate, and tetrahydrofurfuryl methacrylate. Examples of the aryl esters are phenyl methacrylate, cresyl methacrylate, and naphthyl methacrylate.

The acrylamides include acrylamide, N-alkylacrylamides having an alkyl moiety containing 1 to 10 carbon atoms (e.g., methyl, ethyl, propyl, butyl, t-butyl, heptyl, octyl, cyclohexyl, benzyl or hydroxyethyl), N-arylacrylamides having phenyl, tolyl, nitrophenyl, naphthyl, cyanophenyl, hydroxyphenyl, carboxyphenyl, etc. as an aryl moiety, N,N-dialkylacrylamides having an alkyl group containing 1 to 10 carbon atoms (e.g., methyl, ethyl, butyl, isobutyl, ethylhexyl or cyclohexyl), N,N-diarylacrylamides having, e.g., phenyl as an aryl moiety, N-methyl-N-phenylacrylamide, N-hydroxyethyl-N-methylacrylamide, and N-2-acetamidoethyl-N-acetylacrylamide.

The methacrylamides include methacrylamide, N-alkylmethacrylamides having an alkyl moiety containing 1 to 10 carbon atoms (e.g., methyl, ethyl, t-butyl, ethylhexyl, hydroxyethyl or cyclohexyl), N-arylmethacrylamides having, e.g., phenyl as an aryl moiety, N,N-dialkylmethacrylamides having ethyl, propyl, butyl, etc. as an alkyl moiety, N,N-diarylmethacrylamides having phenyl, etc. as an aryl moiety, N-hydroxyethyl-N-methylmethacrylamide, N-methyl-N-phenylmethacrylamide, and N-ethyl-N-phenylmethacrylamide.

The allyl compounds include allyl esters (e.g., allyl acetate, allyl caproate, allyl caprylate, allyl laurate, allyl palmitate, allyl stearate, allyl benzoate, allyl acetoacetate, and allyl lactate) and allyloxyethanol.

The vinyl ethers include alkyl vinyl ethers, such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether; and aryl vinyl ethers, such as phenyl vinyl ether, tolyl vinyl ether, chlorophenyl vinyl ether, 2,4-dichlorophenyl vinyl ether, naphthyl vinyl ether, and anthranyl vinyl ether.

The vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, and vinyl naphthoate.

The styrenes include styrene; alkylstyrenes, such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, andacetoxymethylstyrene; alkoxystyrenes, such as methoxystyrene, 4-methoxy-3-methylstyrene, and dimethoxystyrene; halogenostyrenes, such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, and 4-fluoro-3-trifluoromethylstyrene; carboxystyrene; and vinylnaphthalene.

The crotonic esters include alkyl crotonates, such as butyl crotonate, hexyl crotonate, and glycerol monocrotonate.

Further included in the other copolymerizable monomers are dialkyl itaconates (e.g., dimethyl itaconate, diethyl itaconate, and dibutyl itaconate), dialkyl fumarates (e.g., dibutyl fumarate), dialkyl maleates (e.g., dimethyl maleate), maleic anhydride, maleimide, acrylonitrile, methacrylonitrile, and maleonitrile. Any other addition polymerizable unsaturated compounds that are copolymerizable with monomers having the above-described various repeating units can be used.

Specific but non-limiting examples of the repeating units represented by formulae (I) to (X) are shown below.

(F-1)

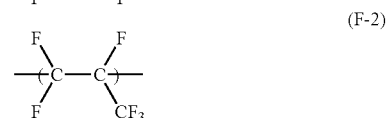

(F-2)

-continued

-continued
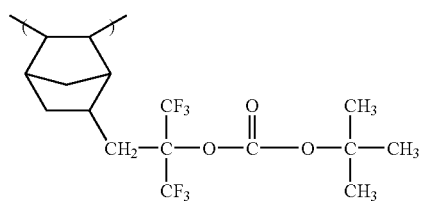
(F-23)
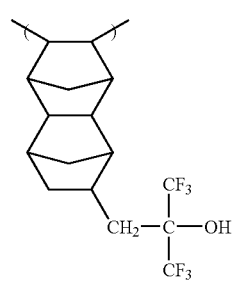
(F-24)
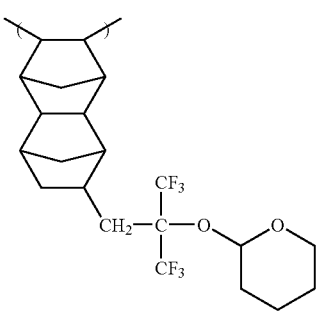
(F-25)
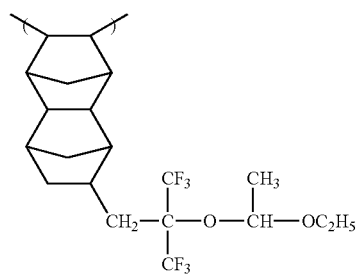
(F-26)
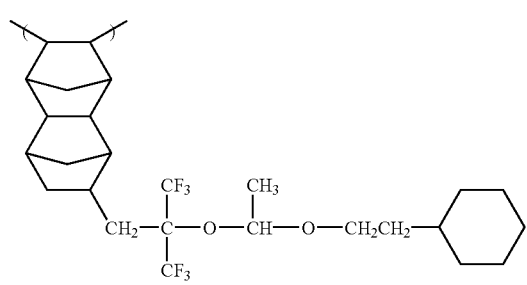
(F-27)
-continued
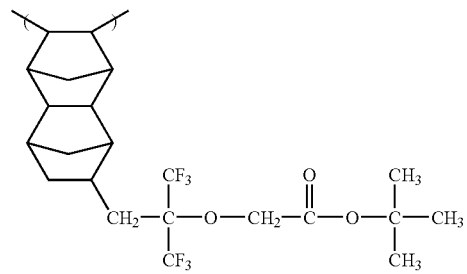
(F-28)
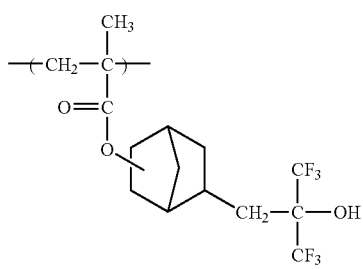
(F-29)
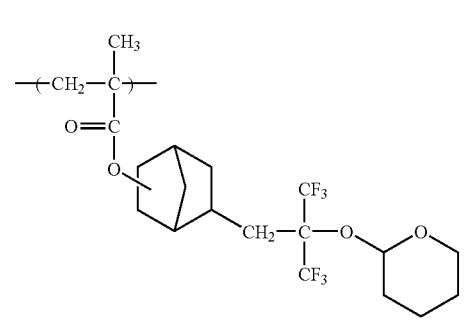
(F-30)
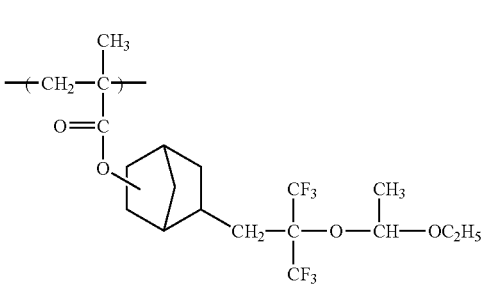
(F-31)
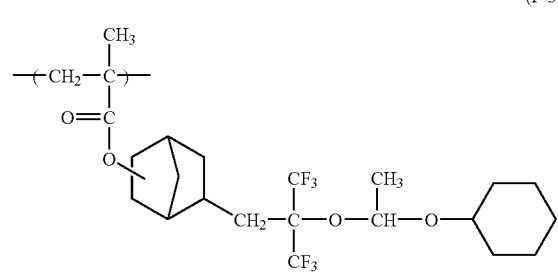
(F-32)

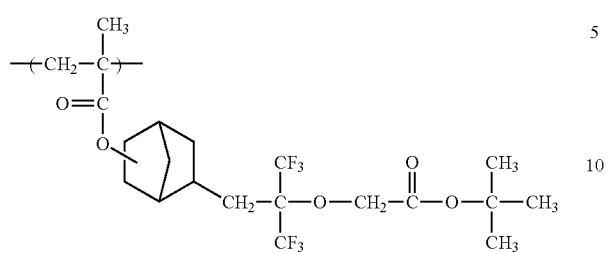
(F-33)
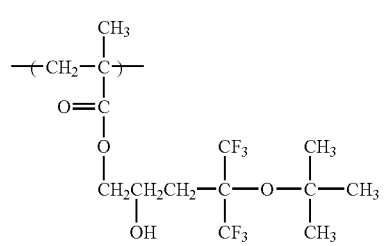
(F-34)
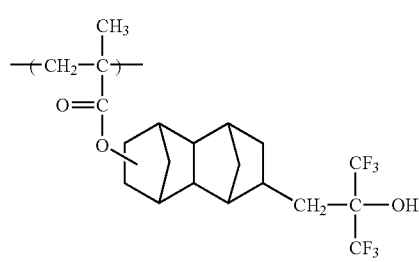
(F-35)
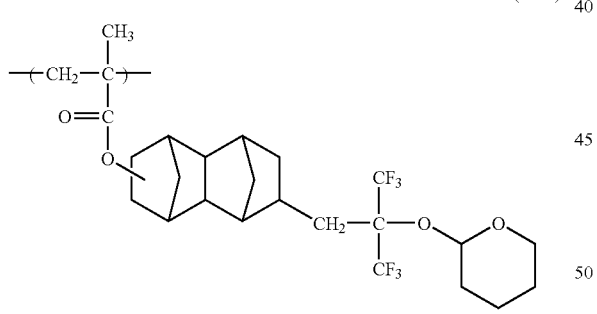
(F-36)
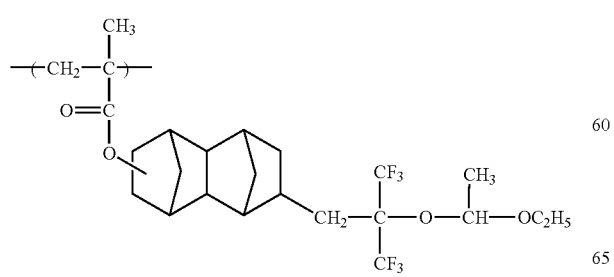
(F-37)
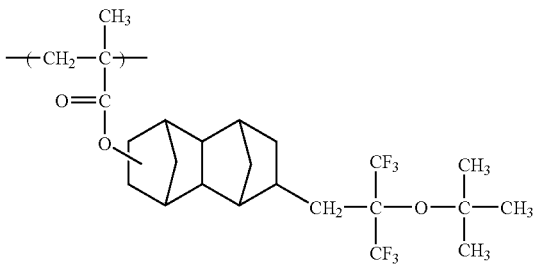
(F-38)
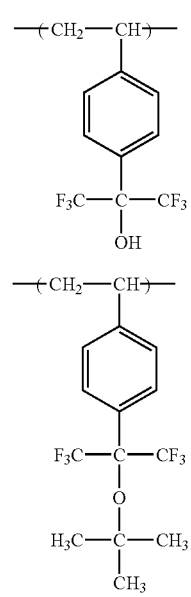
(F-39)
(F-40)
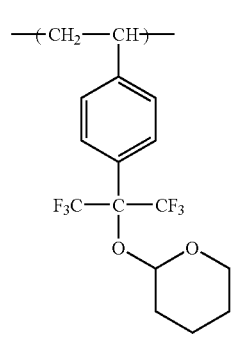
(F-41)
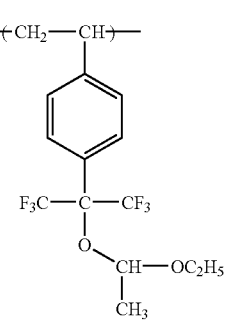
(F-42)

-continued
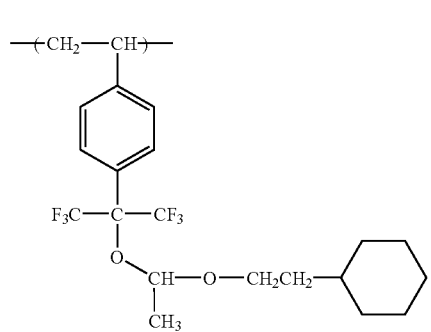 (F-43)
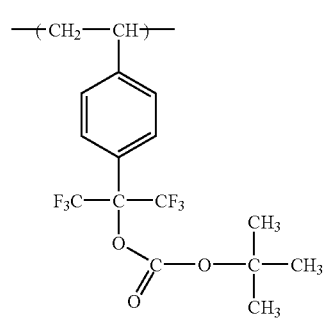 (F-44)
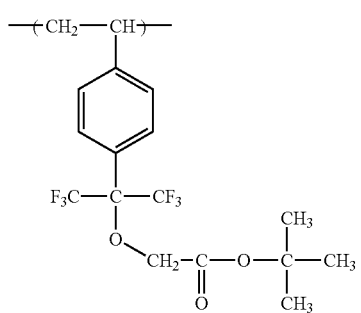 (F-45)
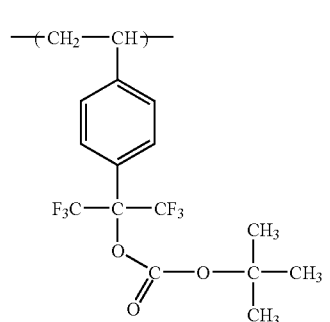 (F-46)
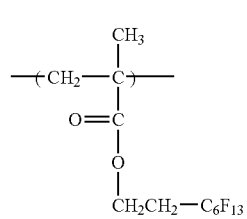 (F-47)
-continued
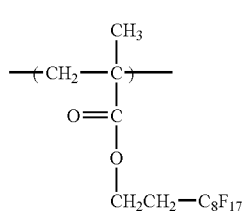 (F-48)
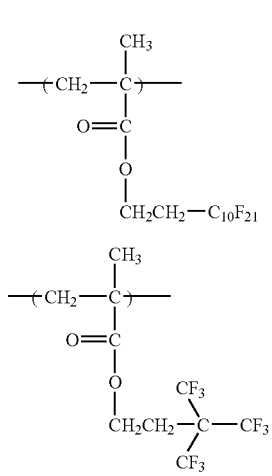 (F-49)
(F-50)
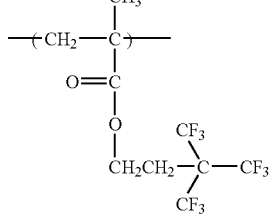 (F-51)
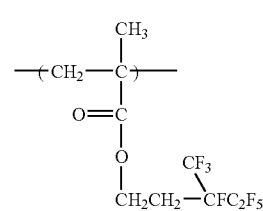 (F-52)
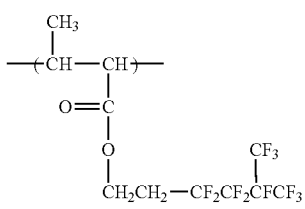 (F-53)
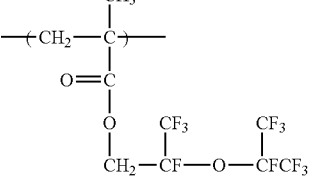 (F-54)
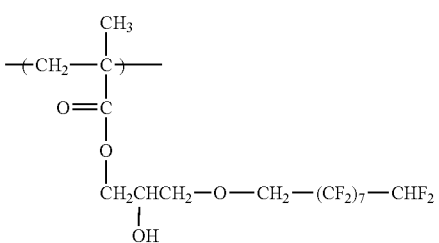

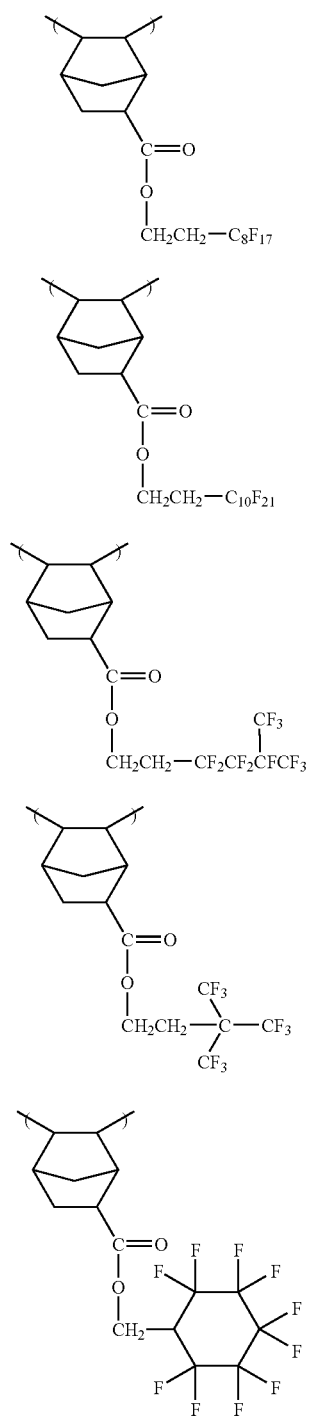
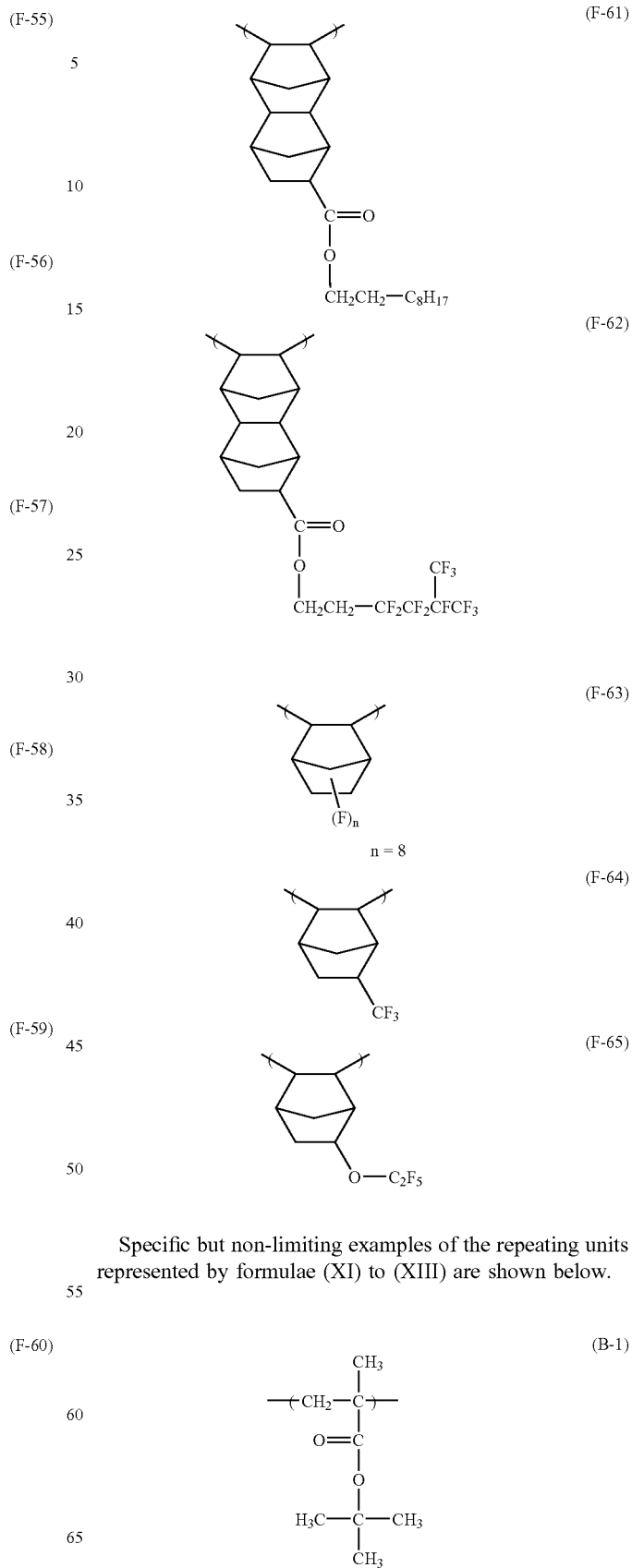
Specific but non-limiting examples of the repeating units represented by formulae (XI) to (XIII) are shown below.
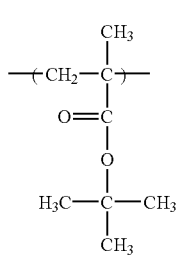

-continued
(B-2)
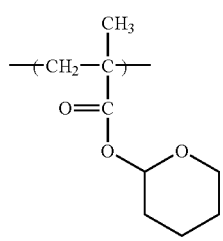
(B-3)
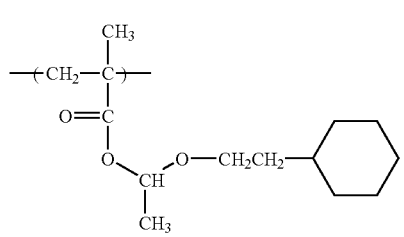
(B-4)
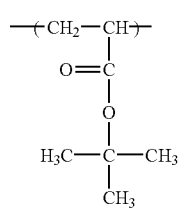
(B-5)
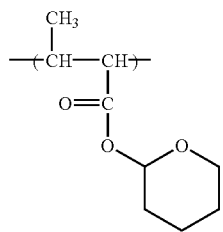
(B-6)
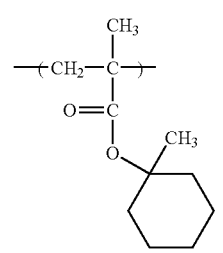
(B-7)
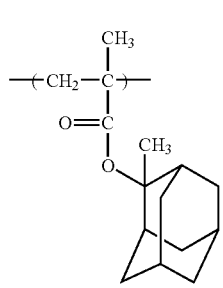
-continued
(B-8)
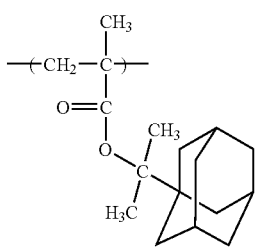
(B-9)
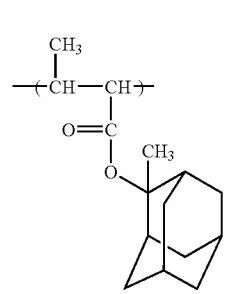
(B-10)
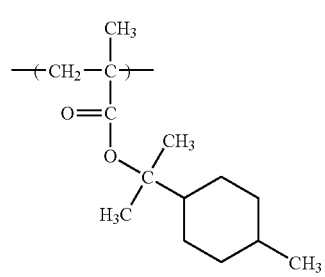
(B-11)
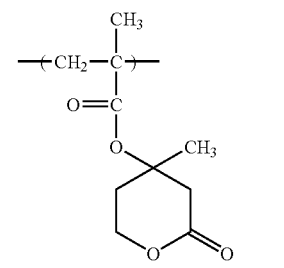
(B-12)
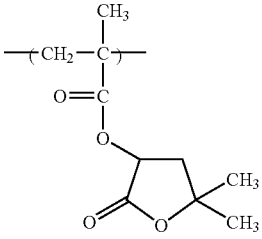
(B-13)
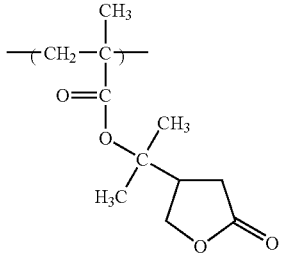

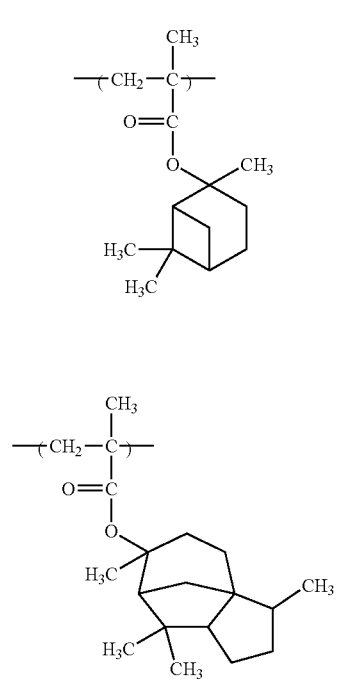
(B-14)
(B-15)
(B-16)
(B-17)
(B-18)
(B-19)
(B-20)
(B-21)
(B-22)
(B-23)

-continued
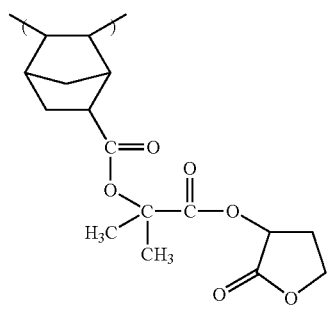
(B-24)
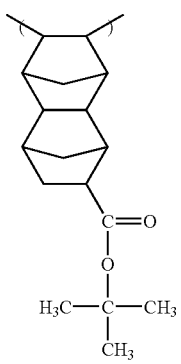
(B-25)
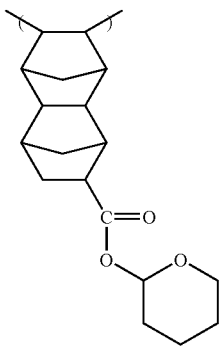
(B-26)
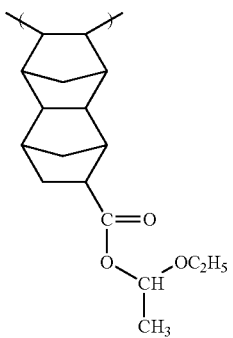
(B-27)
-continued
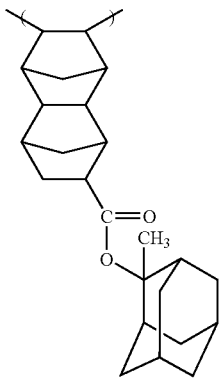
(B-28)
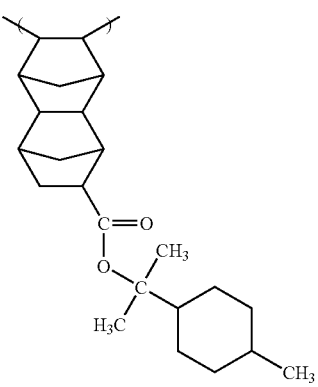
(B-29)
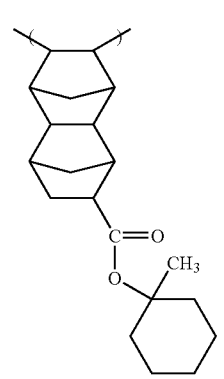
(B-30)
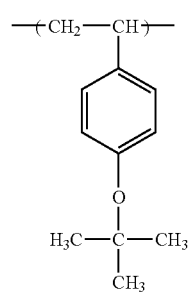
(B-31)

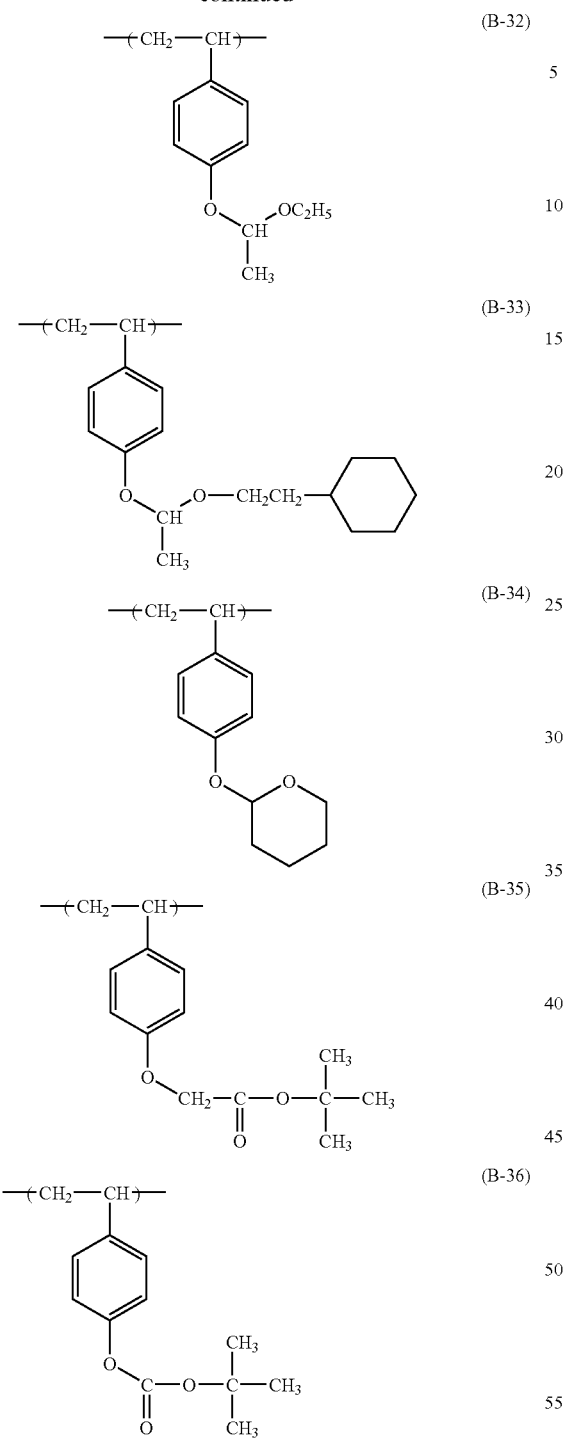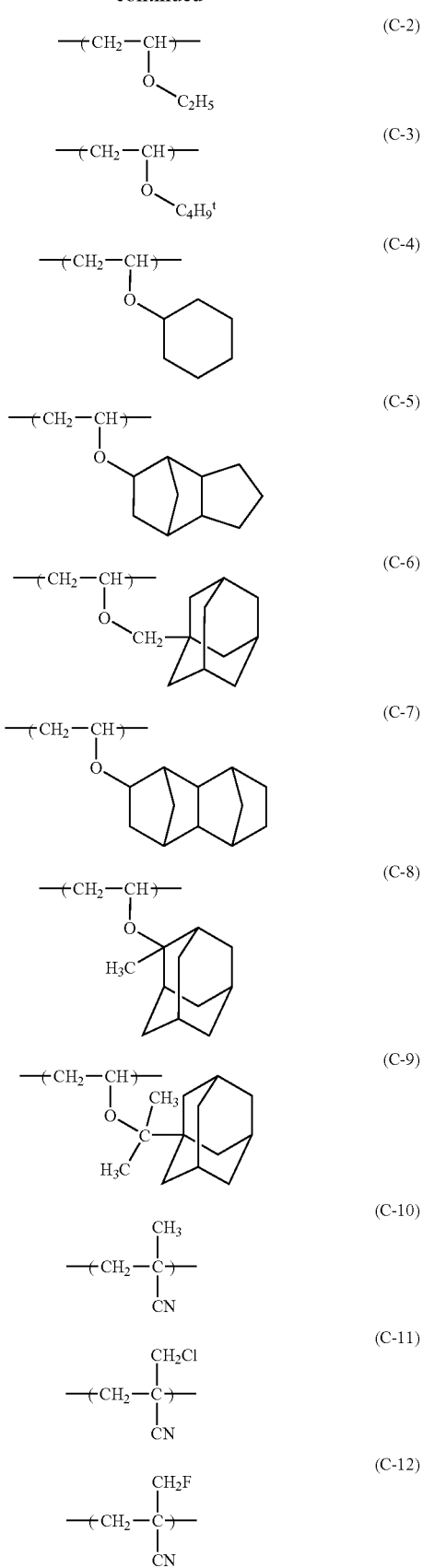
Specific but non-limiting examples of the repeating units represented by formulae (XVI) to (XVII) are shown below.

(C-13)
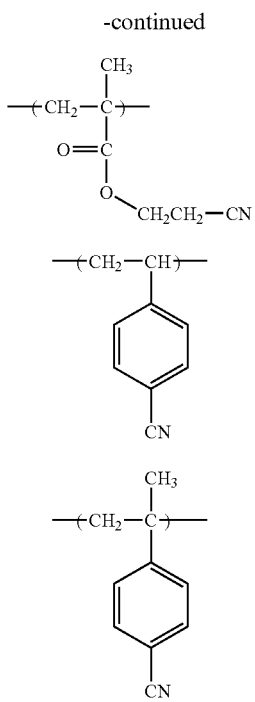
(C-14)
(C-15)
Specific but non-limiting examples of the repeating units represented by formula (IA) are shown below.
(A-1)
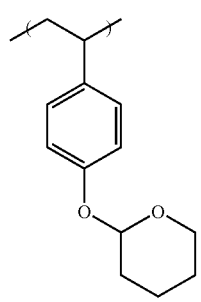
(A-2)
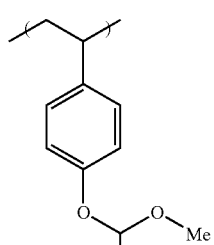
(A-3)
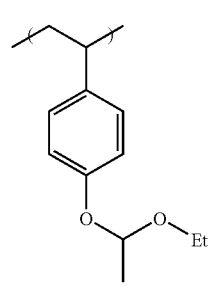
(A-4)
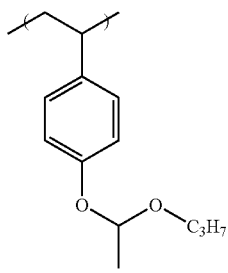
(A-5)
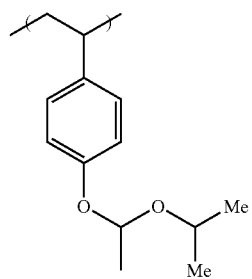
(A-6)
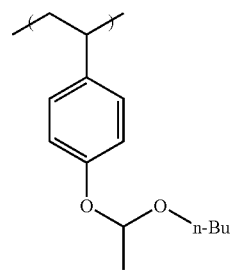
(A-7)
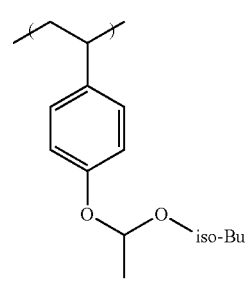
(A-8)
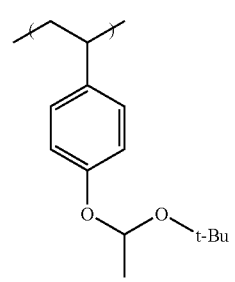

-continued
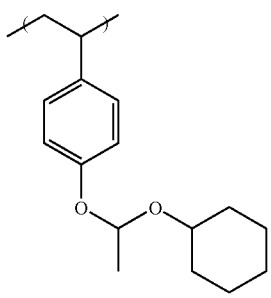 (A-9)
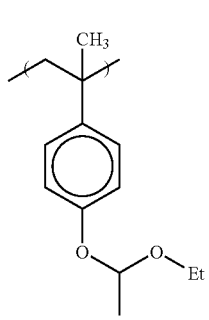 (A-3′)
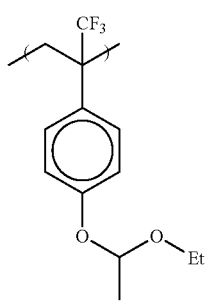 (A-3″)
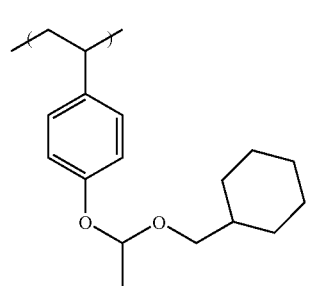 (A-10)
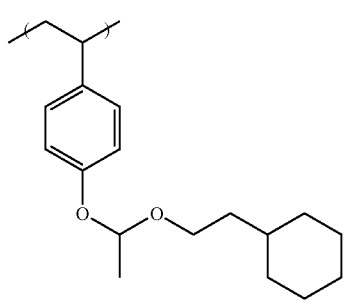 (A-11)
-continued
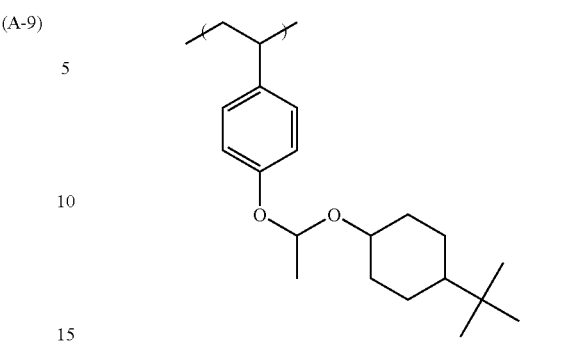 (A-12)
(A-13)
(A-14)
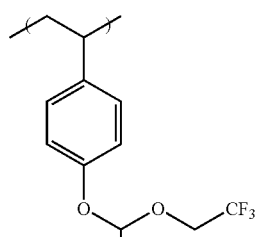 (A-15)
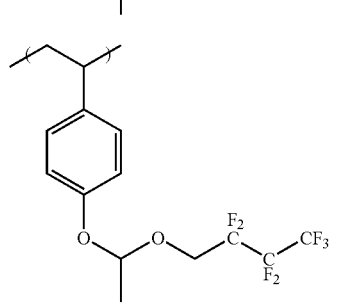 (A-16)

-continued
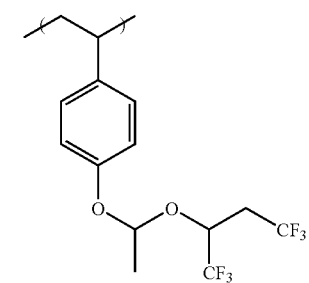 (A-17)
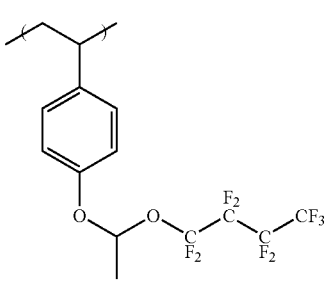 (A-18)
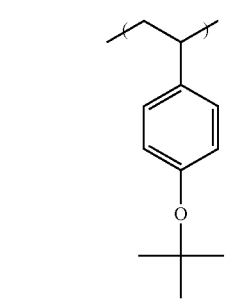 (A-19)
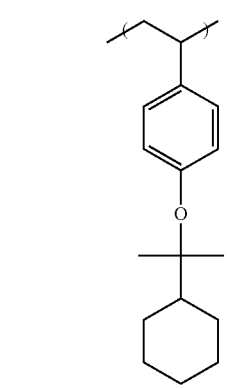 (A-20′)
-continued
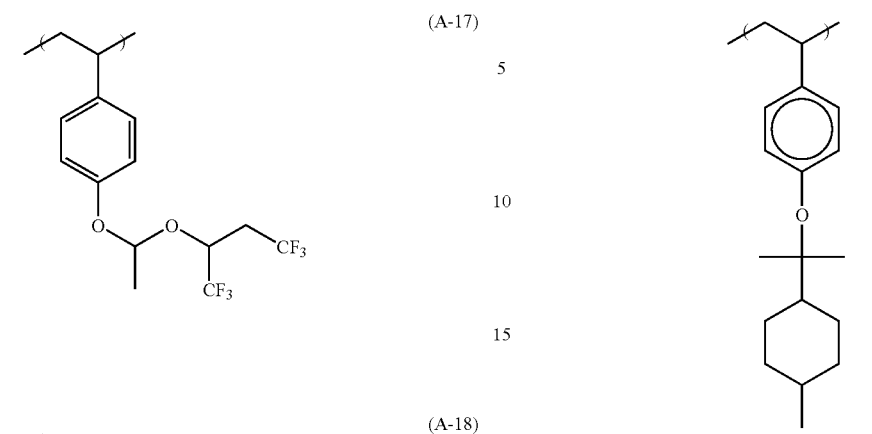 (A-20)
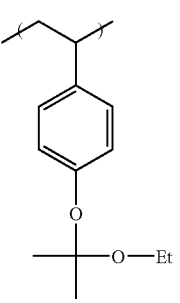 (A-24)
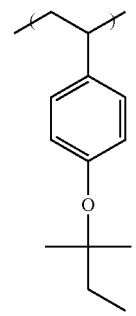 (A-25)
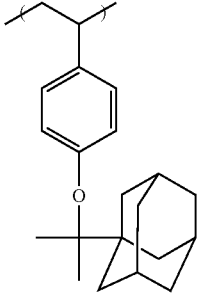 (A-26)
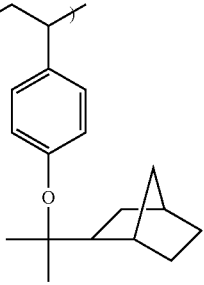 (A-27)

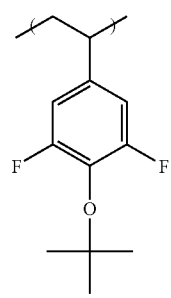
(A-28)
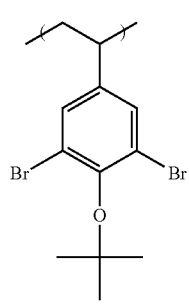
(A-29)
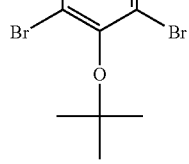
(A-30)
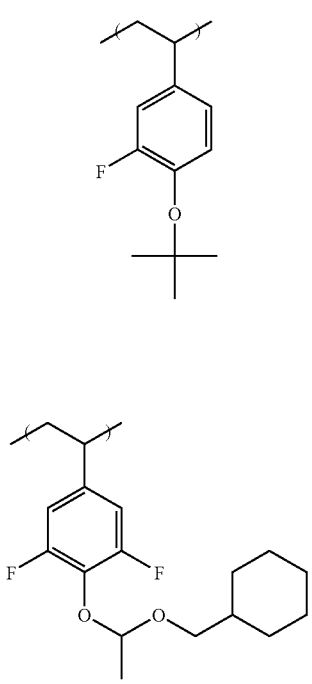
(A-31)
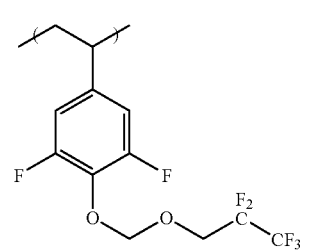
(A-32)
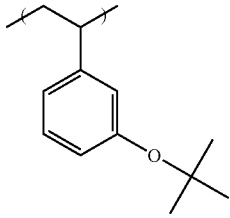
(A-33)
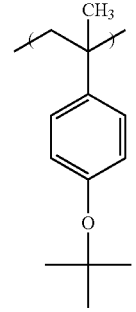
(A-34)
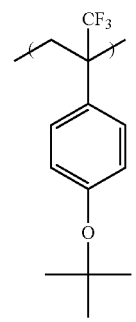
(A-35)
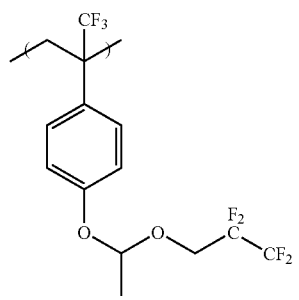
(A-36)
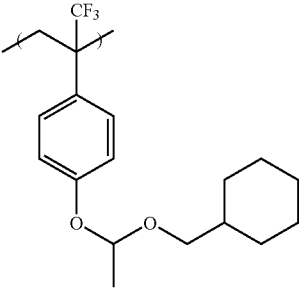
(A-37)

-continued

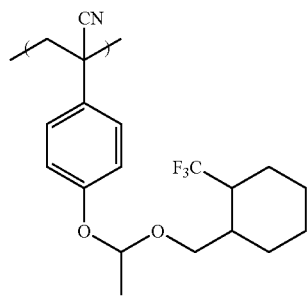
(A-38)

Specific but non-limiting examples of the repeating units represented by formula (IIA) are shown below.

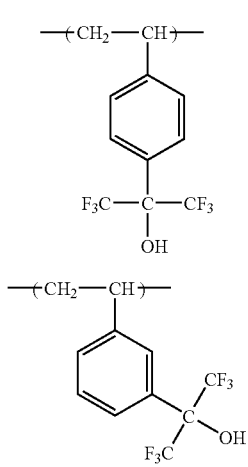
(IIa-1)

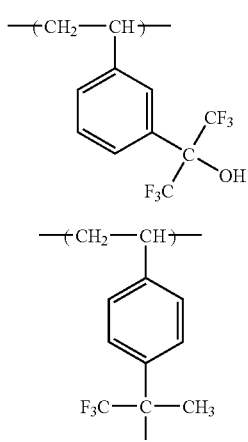
(IIa-2)

(IIa-3)

(IIa-4)

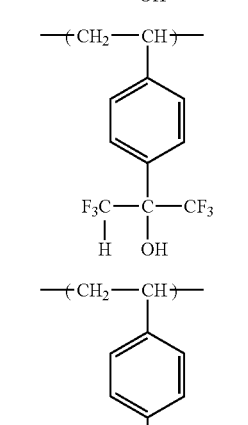
(IIa-5)

-continued

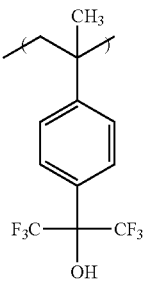
(IIa-6)

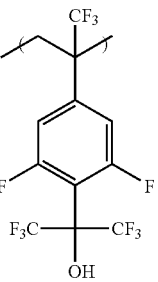
(IIa-7)

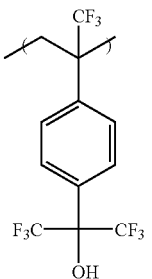
(IIa-8)

Additionally, repeating units (F-40) through (F-45) shown above are also included in the repeating units of formula (IIA).

Specific but non-limiting examples of the repeating units represented by formula (VIA) are shown below.

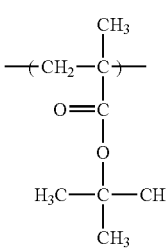
(B-1)

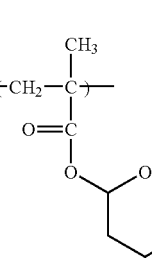
(B-2)

(B-3)
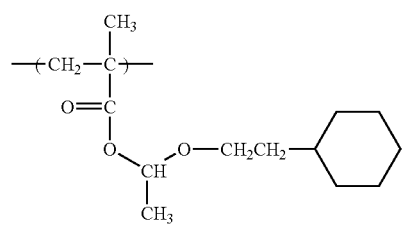
(B-4)
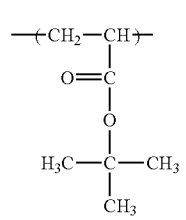
(B-5)
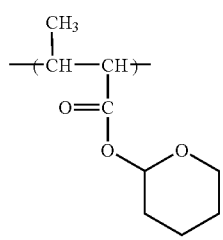
(B-6)
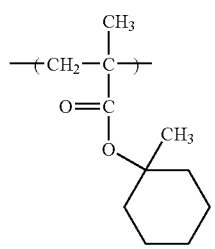
(B-7)
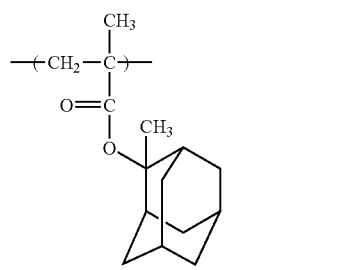
(B-8)
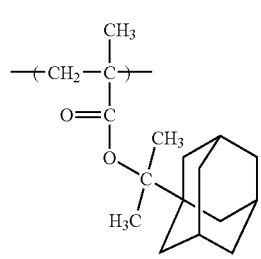
(B-9)
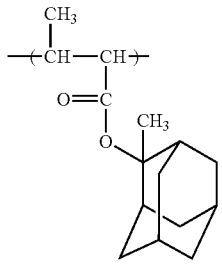
(B-10)
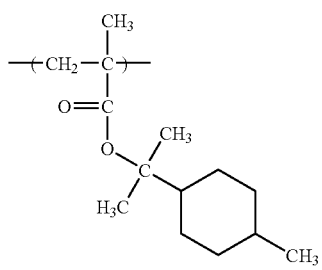
(B-11)
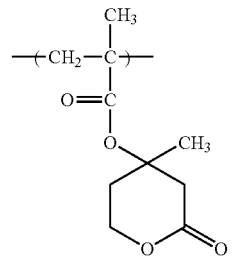
(B-12)
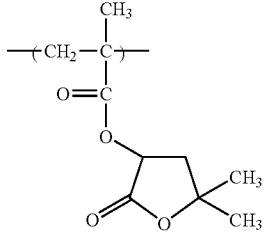
(B-13)
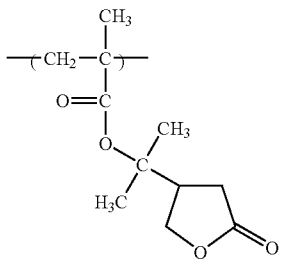
(B-1')
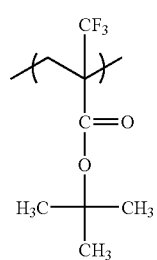

(B-8')
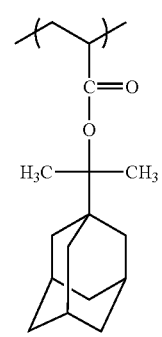

(B-8")
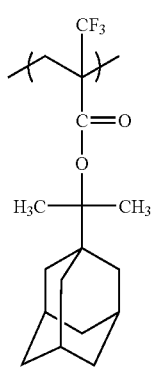

(B-12')
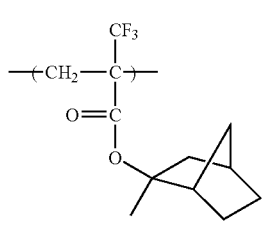

(B-12")
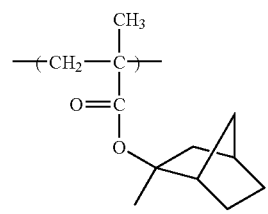

Additionally, repeating units (F-29) through (F-38) and (F-47) through (F-54) shown above are also included in the repeating units of formula (VIA).

Specific but non-limiting examples of the repeating units represented by formula (IIIA) are shown below.

(III-1)
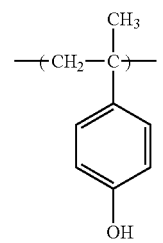

(III-2)
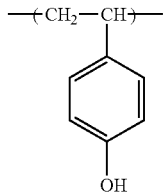

(III-3)
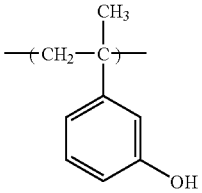

(III-4)
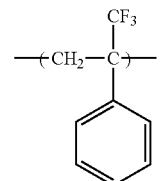

(III-5)
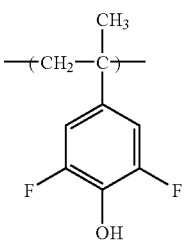

Specific but non-limiting examples of the repeating units represented by formula (VIIA) are shown below.

(VII-1)
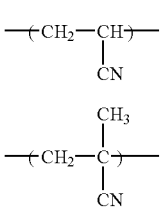

(VII-2)
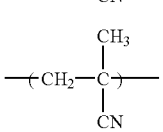

(VII-3)
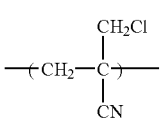

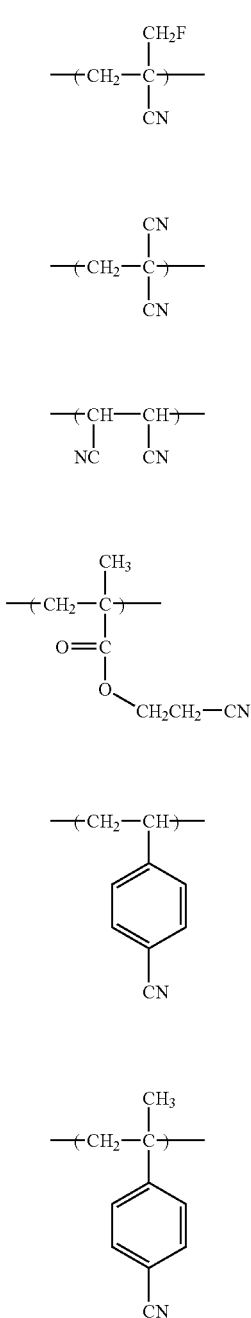

(VII-4)
(VII-5)
(VII-6)
(VII-7)
(VII-8)
(VII-9)

The acid-degradable resin (B) which can be used in the invention is synthesized in a usual manner, for example, by radical polymerization. General radical polymerization is carried out as follows. All the monomers are put into a reaction vessel at once, or some monomers may be added during reaction. If desired, a reaction solvent capable of dissolving the monomer mixture and the composition of the present invention is added to uniformly dissolve the monomer mixture. Useful reaction solvents include ethers, such as tetrahydrofuran, 1,4-dioxane, and diisopropyl ether; ketones, such as methyl ethyl ketone and methyl isobutyl ketone; esters, such as ethyl acetate; and propylene glycol monomethyl ether acetate. A commercially available radical initiator, such as an azo initiator or a peroxide, is added to the system to conduct polymerization of the monomers in an inert gas (e.g., nitrogen or argon) atmosphere under, if necessary, heating. If desired, an additional amount of the initiator can be added later, or the initiator can be added in divided portions. After completion of the reaction, the reaction system is poured into a poor solvent, and the polymer produced is collected in the form of powder or solid. The reaction system concentration is at least 20% by weight, preferably 30% by weight or higher, still preferably 40% by weight or higher. The reaction temperature ranges 10 to 150° C., preferably 30 to 120° C., still preferably 50 to 100° C.

The number of the kinds of repeating units represented by a single formula shown above which are used to make up the acid-degradable resin (B) may be one or more than one. The above-described acid-degradable resins (A) may be used either individually or as a combination of two or more thereof.

The weight average molecular weight (Mw) of the resin (B) is preferably 1,000 to 200,000, still preferably 3,000 to 20,000, in terms of polystyrene equivalent Mw determined by gel-permeation chromatography (GPC). With Mw less than 1,000, the resist tends to have reduced heat resistance or reduced dry etching resistance. With Mw more than 200,000, the resist tends to have reduced developability, or the composition will have too high a viscosity, which can result in poor film-forming properties.

The molecular weight distribution of the resin (B) is preferably in a range of 1 to 10, still preferably 1 to 5, particularly preferably 1 to 4. The smaller the molecular weight distribution, the higher the resist performance, such as resolution, resist profile, smoothness of resist pattern side walls, and LER.

The total resin content of the positive resist composition of the invention preferably ranges from 40 to 99.99% by weight, particularly 50 to 99.97% by weight, on solid basis.

The positive resist composition of the present invention comprises an acyclic compound having at least three groups selected from a hydroxyl group and a substituted hydroxyl group as component (D) (hereinafter referred to as compound (D)). Compound (D) is preferably an acyclic saccharide derivative having at least three groups selected from a hydroxyl group and a substituted hydroxyl group. The "acyclic saccharide derivative having at least three groups selected from a hydroxyl group and a substituted hydroxyl group" includes ring-opened structures of general saccharides and analogues thereof.

Such compounds include, but are not limited to, threitol, erythritol, adonitol, arabitol, xylitol, sorbitol, mannitol, iditol, dulcitol, erythrol, xylulose, ribulose, deoxyribulose, glucero-gulo-heptose, and the compounds shown below:

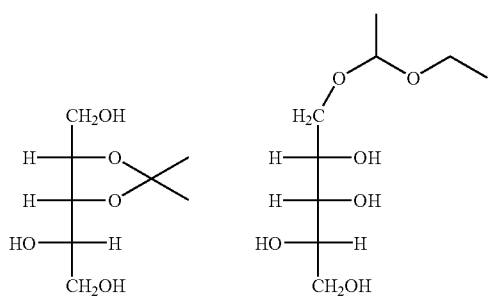

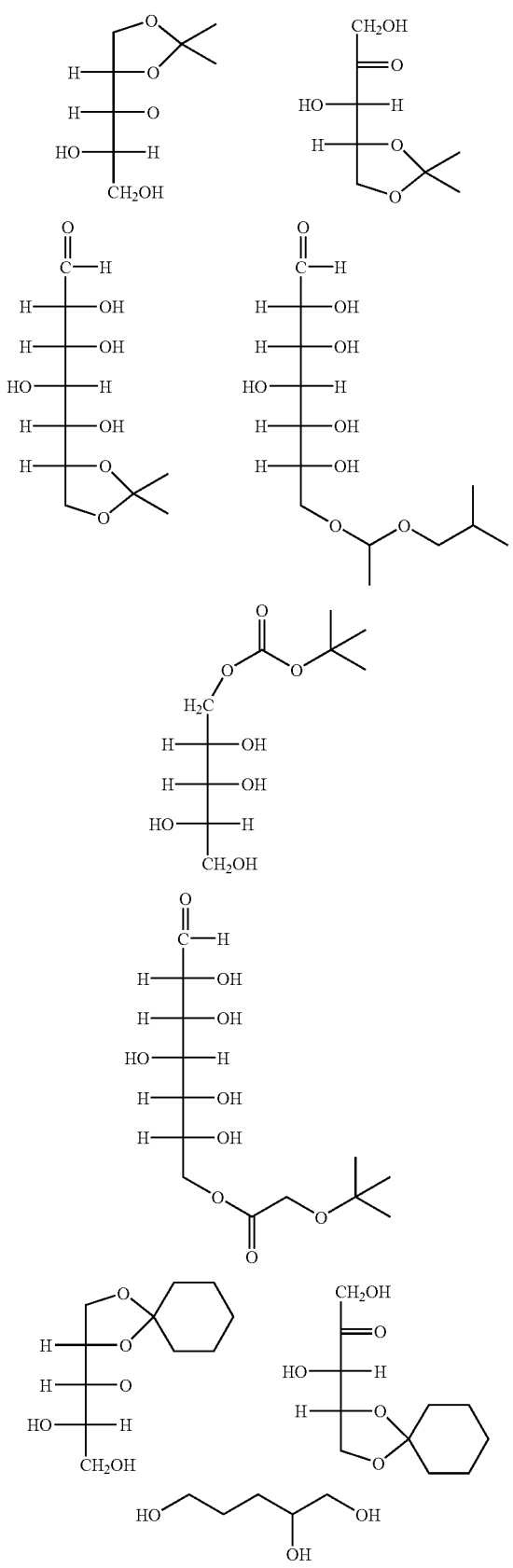

Some of these acyclic saccharide derivatives have optical isomers, all of which are included in component (D). The hydroxyl groups of these compounds may be substituted with an acid-degradable group, such as an acetal group and an isopropylidene group, or other substituents.

The number of hydroxyl groups and/or substituted hydroxyl groups in the compound (D) is preferably 3 to 10, still preferably 4 to 10. Presence of more than 10 hydroxyl groups and/or substituted hydroxyl groups per molecule tends to result in considerable film thickness reduction.

The compounds (D) can be used either individually or as a mixture of two or more thereof as component (D). Component (D) is usually used in an amount of 0.001 to 10% by weight, preferably 0.01 to 5% by weight, based on the solids content of the positive resist composition. Addition of less than 0.001% of component (D) produces no substantial effect. Addition of more than 10% of component (D) tends to result in reduction of sensitivity or developability of exposed areas.

It is preferred for the positive resist composition of the invention to further comprise (C) a basic compound. The basic compound as component (C) includes nitrogen-containing basic compounds. Nitrogen-containing basic compounds include those which do not cause deterioration of sublimating properties and resist performance, such as organic amines, basic ammonium salts, and basic sulfonium salts. Organic amines are preferred of them for excellent imaging performance. Useful organic amines are described, e.g., in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-508840, U.S. Pat. Nos. 5,525,453, 5,629,134, and 5,667,938.

Specifically, the nitrogen-containing basic compounds preferably include those represented by structures (A) to (E):

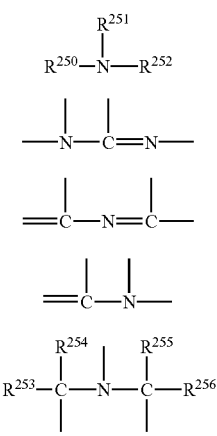

wherein $R^{250}$, $R^{251}$, and $R^{212}$, which may be the same or different, each represent a hydrogen atom, an alkyl group having 1 to 20 carbon atoms, an aminoalkyl group having 1 to 20 carbon atoms, a hydroxyalkyl group having 1 to 20 carbon atoms or a substituted or unsubstituted aryl group having 6 to 20 carbon atoms; $R^{251}$ and $R^{252}$ may be taken together to form a ring; $R^{253}$, $R^{254}$, $R^{255}$, and $R^{256}$, which may be the same or different, each represent an alkyl group having 1 to 10 carbon atoms.

Still preferred nitrogen-containing basic compounds include those having two or more nitrogen atoms in different chemical environments per molecule and aliphatic tertiary amines.

Examples of preferred nitrogen-containing basic compounds are 1,5-diazabicyclo[4.3.0]-5-nonene, 1,8-diazabicyclo[5.4.0]-7-undecene, 1,4-diazabicyclo[2,2,2]octane, 4-dimethylaminopyridine, 1-naphthylamine, piperidines, hexamethylenetetramine, imdiazoles, hydroxypyridines, pyridines, anilines, hydroxyalkylanilines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, tributylamine, tripentylamine, tri-n-octylamine, triisooctylamine, tris(ethylhexyl)amine, tridecylamine, and tridodecylamine. Particularly preferred of them are organic amines, such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, 4-hydroxypiperidine, 2,2,6,6-tetramethyl-4-hydroxypiperidine, hexamethylenetetramine, imidazoles, hydroxypyridine, pyridines, 4,4'-diaminidiphenyl ether, triethylamine, tributylamine, tripentylamine, tri-n-octylamine, tris(ethylhexyl)amine, tridodecylamine, N,N-dihydroxyethylaniline, and N-hydroxyethyl-N-ethylaniline.

The basic compounds can be used either individually or as a combination of two or more thereof. The basic compounds are usually used in a total amount of 0.001 to 10% by weight, preferably 0.01 to 5% by weight, based on the solids content of the resist composition. When added in total amounts less than 0.001%, the effects of addition are insubstantial. Total amounts more than 10% can result in reduction of sensitivity or developability of exposed areas.

It is preferred for the positive resist composition of the present invention to further comprise (E) at least one of a fluorine-containing surface active agent, a silicon-containing surface active agent, and a surface active agent containing both fluorine and silicon. Incorporation of component (E) is effective to form a resist pattern having good adhesion to a substrate and free from development defects with high sensitivity and high resolution when in using an exposure source of 250 nm or shorter wavelengths, particularly 220 nm or shorter.

Examples of the fluorine- and/or silicon-containing surface active agents are described, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, and U.S. Pat. Nos. 5,405,720, 5,360,692, 5,529,881, 5,296,330, 5,436,098, 5,576,143, 5,294,511, and 5,824,451. Commercially available fluorine- and/or silicon-containing surface active agents which can be used in the present invention include EFTOP series EF301 and EF303 (from Shin Akita Kasei K.K.); Fluorad series FC430 and FC431 (from Sumitomo 3M Ltd.); Megafac series F171, F173, F176, F189, and R08 (from Dainippon Ink & Chemicals Inc.); Surflon series S-382, SC101, 102, 103, 104, 105 and 106 (from Asahi Glass Co., Ltd.); and Troy Sol S-366 (from Troy Chemical Industries, Inc.). Polysiloxane resin KP-341 (from Shin-Etsu Chemical Co., Ltd.) is also useful as a silicon-containing surface active agent.

Component (E) is used in an amount of 0.0001 to 2% by weight, preferably 0.001 to 1% by weight, based on the total resist composition except a solvent.

The positive resist composition of the present invention is used as dissolved in an appropriate organic solvent. Suitable solvents include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the present invention, it is preferred to use a mixed solvent comprising a solvent having a hydroxyl group in its structure and a solvent containing no hydroxyl group thereby to suppress particle generation during storage of the resist composition.

Solvents containing a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Propylene glycol monomethyl ether and ethyl lactate are preferred of them.

Solvents containing no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Preferred of them are propylene glycol monomethyl ether acetate, ethyl ethoxypropionate, 2-heptanone, γ-butyrolactone, cyclohexanone, and butyl acetate. Propylene glycol monomethyl ether acetate, ethyl ethoxypropionate, and 2-heptanone are particularly preferred.

A mixing weight ratio of the solvent containing a hydroxyl group to the solvent containing no hydroxyl group is usually 1/99 to 99/1, preferably 10/90 to 90/10, still preferably 20/80 to 60/40. A mixed solvent containing at least 50% by weight of the solvent with no hydroxyl group is desirable for achieving coating uniformity.

The positive resist composition of the present invention can further comprise (G) a resin which contains no acid-degradable group and is insoluble in water but soluble in an alkali developing solution thereby to have improved sensitivity. Resins useful as component (G) include novonak resins having molecular weights of about 1,000 to 20,000 and polyhydroxystyrene resins having molecular weights of about 3,000 to 50,000. Because these resins have a large absorption at 250 nm or shorter wavelengths, they are preferably hydrogenated partially, or their amounts are preferably limited to 30% by weight at the most based on the total resin.

A resin having a carboxyl group as an alkali-soluble group can also be used in combination. The carboxyl-containing resin preferably contains a monocyclic or polycyclic alicyclic hydrocarbon group for improving dry etching resistance. Such a carboxyl-containing resin includes methacrylic ester-(meth)acrylic acid copolymers containing an acid-non-degradable alicyclic hydrocarbon structure and (meth) acrylic ester resins containing an alicyclic hydrocarbon group having a carboxyl end group.

The positive resist composition of the present invention can contain various additives according to necessity, such as dyes, plasticizers, surface active agents other than those described above as component (E), photosensitizers, and compounds accelerating dissolution in a developing solution.

The compounds which can be added for the purpose of accelerating dissolution in a developing solution include low-molecular (molecular weight: 1,000 or less) compounds containing two or more phenolic hydroxyl groups or one or more carboxyl groups per molecule. The carboxyl-containing compounds are preferably alicyclic or aliphatic compounds for the same reason as described above.

The compound accelerating dissolution in a developing solution is preferably added in an amount of 2 to 50% by weight, particularly 5 to 30% by weight, based on the resin (B). Where added in amounts exceeding 50% by weight, the development residue deteriorates, and the pattern is deformed during development.

The phenolic compounds having molecular weights of 1,000 or less can easily be synthesized by those skilled in the art by referring to the processes described in JP-A-4-122938, JP-A-2-28531, U.S. Pat. No. 4,916,210, and EP 219294.

The alicyclic or aliphatic compounds having a carboxyl group include, but are not limited to, carboxylic acid derivatives having a steroid structure, such as cholic acid, deoxycholic acid, and lithocholic acid, adamantanecarboxylic acid derivatives, adamantanedicarboxylic acid, cyclohexanecarboxylic acid, and cyclohexanedicarboxylic acid.

In addition to the fluorine- and/or silicon-containing surface active agent as component (E), the resist composition can contain other surface active agents, such as nonionic surface active agents. Suitable nonionic surface active agents include polyoxyethylene alkyl ethers, e.g., polyoxyethylene lauryl ether, polyoxyethylene stearyl ether, polyoxyethylene cetyl ether, and polyoxyethylene oleyl ether; polyoxyethylene alkylaryl ethers, e.g., polyoxyethylene octylphenyl ether and polyoxyethylene nonylphenyl ether; ethylene oxide-propylene oxide block copolymers; sorbitan fatty acid esters, e.g., sorbitan monolaurate, sorbitan monopalmitate, sorbitan monostearate, sorbitan monooleate, sorbitan trioleate, and sorbitan tristearate; polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate. These surface active agents can be used either individually or as a combination thereof.

The positive resist composition of the invention is dissolved in an appropriate solvent, preferably the above-described mixed solvent to prepare a coating composition, which is applied to a substrate. The coating composition is applied to a substrate, such as a silicone substrate with a silicon dioxide coat, by means of an appropriate coating unit, such as a spinner or a coater, to form a resist film. The resist film is exposed to light through a prescribed mask. After post-exposure baking, the resist is developed with an alkali developing solution to remove the exposed area. The light of exposure preferably has a wavelength of 250 nm or shorter, particularly 220 nm or shorter. Suitable light includes KrF excimer laser light (248 nm), ArF excimer laser light (193 nm), $F_2$ excimer laser light (157 nm), X-rays, and an electron beam.

The alkali developing solution includes aqueous alkali solutions. The alkali includes inorganic alkalis, such as sodium hydroxide, potassium hydroxide, sodium carbonate, sodium silicate, sodium metasilicate, and aqueous ammonia; primary amines, such as ethylamine and n-propylamine; secondary amines, such as diethylamine and di-n-butylamine; tertiary amines, such as triethylamine and methyldiethylamine; alcohol amines, such as dimethylethanolamine and triethanolamine; quaternary ammonium salts, such as tetramethylammonium hydroxide and tetraethylammonium hydroxide; and cyclic amines, such as pyrrole and piperidine. The aqueous alkali solution may contain an adequate amount of an alcohol or a surface active agent.

EXAMPLES

The present invention will now be illustrated in greater detail with reference to Examples, but it should be understood that the invention is by no means limited thereto.

Synthesis Example 1

Synthesis of Resin (1) (Side Chain Type):
2-Ethyl-2-adamantyl methacrylate and butyrolactone methacrylate were put into a reaction vessel in a molar ratio of 55/45 and dissolved in a 5/5 (by weight) mixed solvent of methyl ethyl ketone (MEK) and tetrahydrofuran (THF) to prepare 100 ml of a 20 wt % monomer solution.

2,2'-Azobis (2,4-dimethylvaleronitrile) (V-65, available from Wako Pure Chemical Industries, Ltd.) was added as a polymerization initiator in an amount of 2 mol % based on the total monomers. The resulting mixture was added dropwise to 10 ml of MEK heated to 60° C. over 4 hours in a nitrogen atmosphere. After the addition, the reaction mixture was heated for 4 hours. One molar percent of V-65 was added to the reaction system, followed by stirring for 4 hours. After completion of the reaction, the reaction mixture was cooled to room temperature and poured into 3 liters of a 1/1 mixture of distilled water and isopropyl alcohol to precipitate white powder, which was collected to recover resin (1).

As a result of $C^{13}$-NMR analysis, the copolymerization ratio of 2-ethyl-2-adamantyl methacrylate to butyrolactone methacrylate was found to be 46/54. GPC analysis revealed that resin (1) had a polystyrene equivalent weight average molecular weight (Mw) of 10,700.

Resins (2) to (12) were synthesized in the same manner as for resin (1). The copolymerization ratios and the molecular weights of resins (2) to (12) are shown in Table 1 below, in which the order of the repeating units from left to right is the same as that in the structural formula shown below.

TABLE 1
| Resin | 1st Unit (mol %) | 2nd Unit (mol %) | 3rd Unit (mol %) | 4th Unit (mol %) | Mw |
|---|---|---|---|---|---|
| 2 | 53 | 40 | 7 | | 13400 |
| 3 | 42 | 31 | 27 | | 8300 |
| 4 | 42 | 30 | 28 | | 10300 |
| 5 | 39 | 35 | 26 | | 8900 |
| 6 | 46 | 22 | 30 | 2 | 12900 |
| 7 | 38 | 32 | 30 | | 11300 |
| 8 | 38 | 31 | 29 | 2 | 11100 |
| 9 | 35 | 6 | 16 | 43 | 13200 |
| 10 | 46 | 42 | 12 | | 9200 |
| 11 | 38 | 32 | 30 | | 11300 |
| 12 | 42 | 18 | 38 | 2 | 13800 |
The structures of resins (1) to (12) were as shown below.
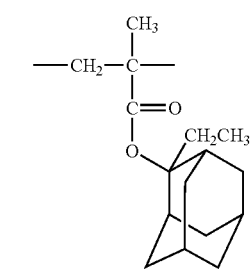
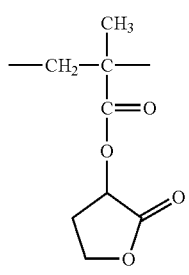
(1)
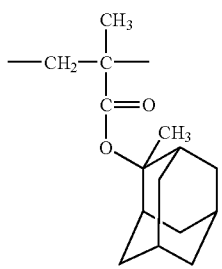
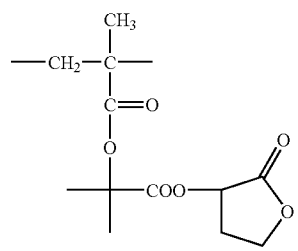
(2)
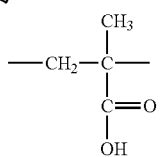
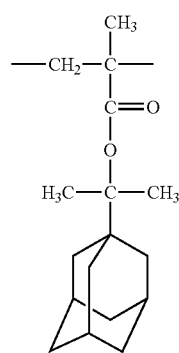
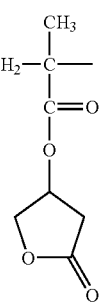
(3)
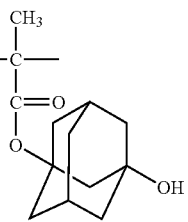
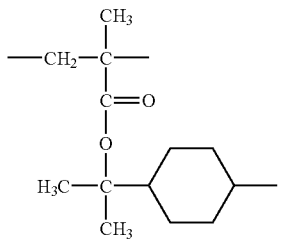
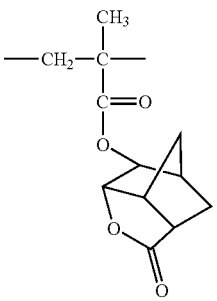
(4)
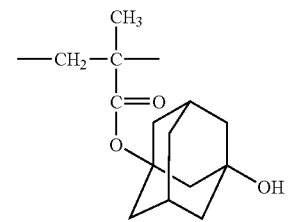
(5)
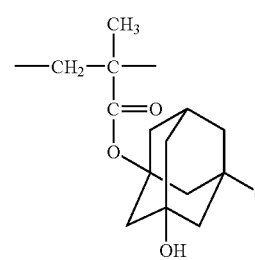
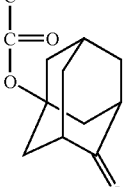
(6)

-continued
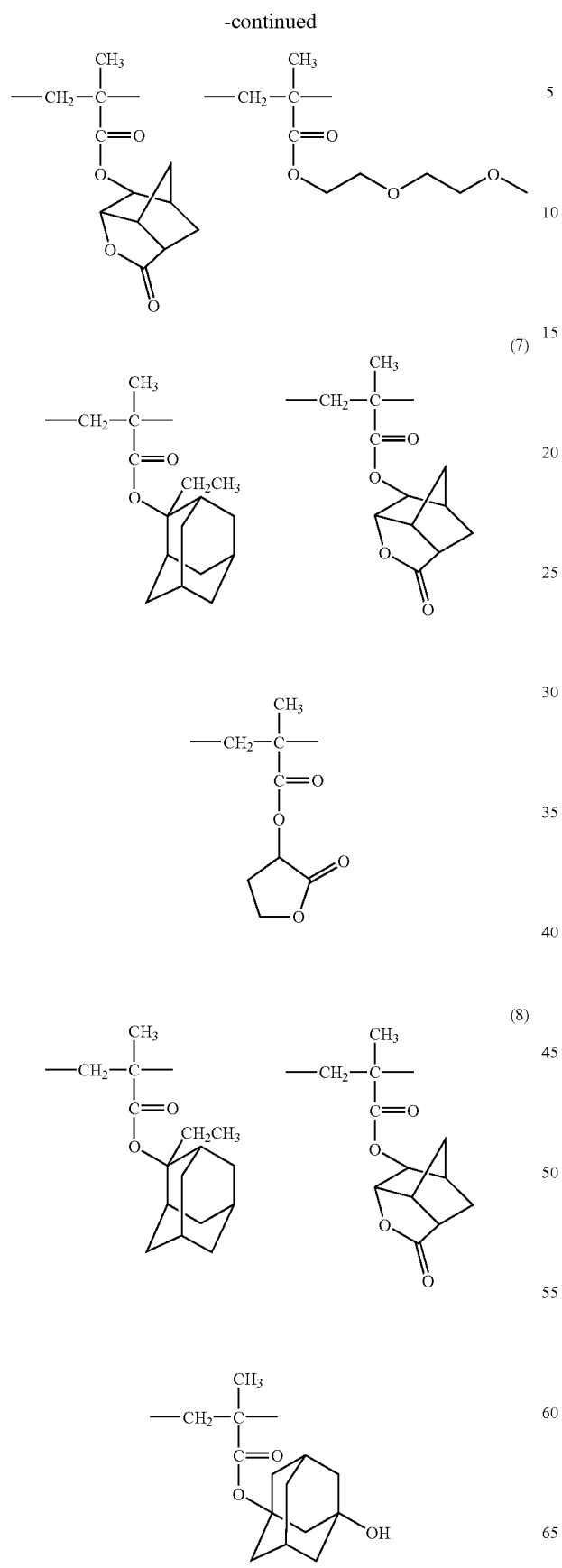
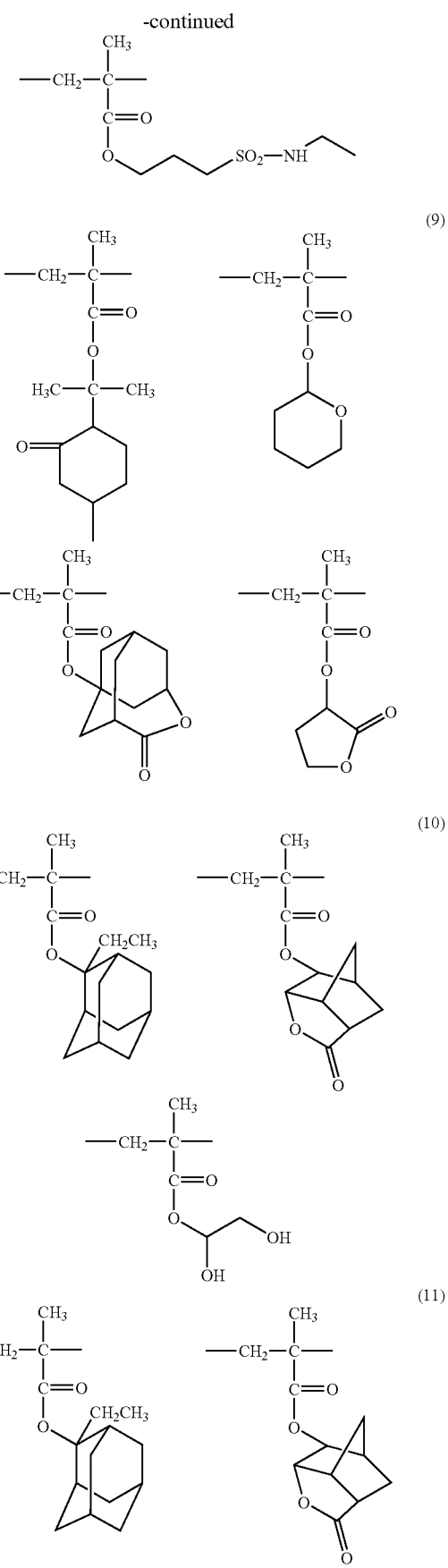

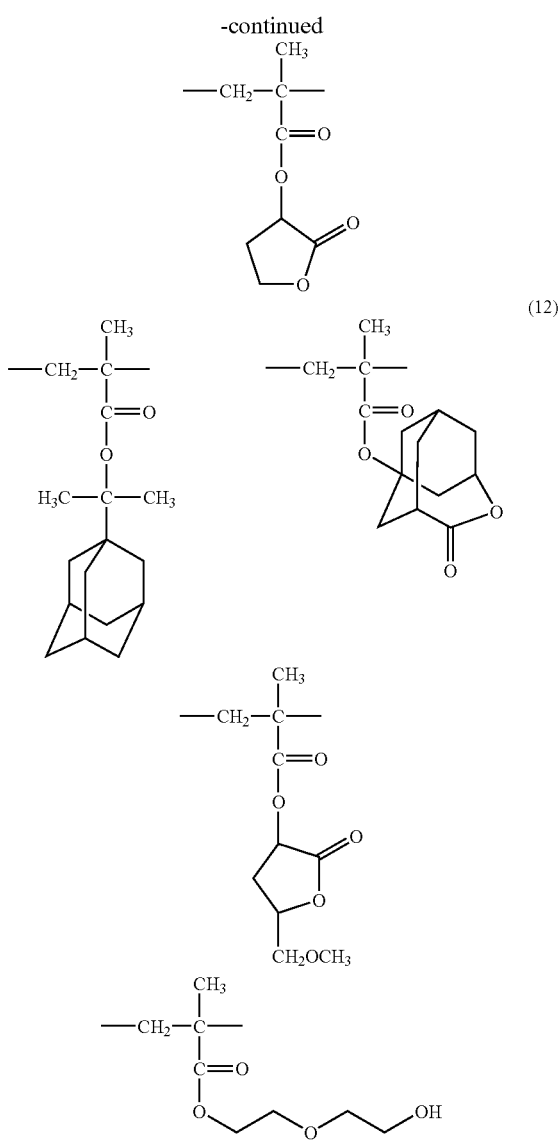

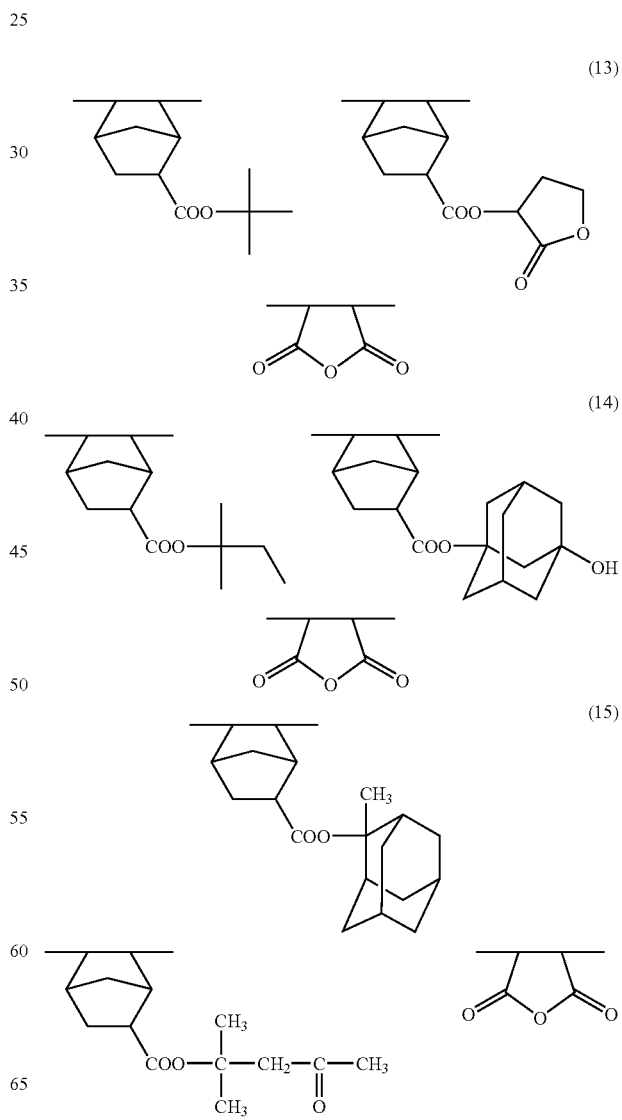

Resins (14) to (17) were synthesized in the same manner as for resin (13). The composition and the molecular weight of resins (14) to (17) are shown in Table 2 below, in which the order of the repeating units from left to right is the same as that in the structural formula.

TABLE 2

| Resin | 1st Unit[*1] (mol %) | 2nd Unit[*2] (mol %) | 3rd Unit[*3] (mol %) | Mw |
|---|---|---|---|---|
| 14 | 35 | 15 | 50 | 8200 |
| 15 | 31 | 19 | 50 | 7900 |
| 16 | 38 | 12 | 50 | 8900 |
| 17 | 40 | 10 | 50 | 9300 |

[*1]: Alicyclic olefin unit
[*2]: Alicyclic olefin unit
[*3]: Maleic anhydride unit The structures of resins (13) to (17) are shown below.

Synthesis Example 2

Synthesis of Resin (13) (Main Chain Type):

t-Butyl norbornenecarboxylate, butyrolactone norbornenecarboxylate, and maleic anhydride (40/10/50 by mole) and THF were put into a separable flask (solids content of the mixture: 60 wt %), and the mixture was heated at 60° C. in a nitrogen stream. When a steady reaction temperature was reached, 2 mol % of a radical initiator V-601 (from Wako Pure Chemical) based on the total monomers was added to commence polymerization. The reaction was continued for 12 hours by heating. The resulting reaction mixture was diluted twice with THF and poured into a 1/1 mixture of hexane/isopropyl alcohol. The precipitated white power was collected by filtration and dried to obtain resin (13).

The polystyrene equivalent weight average molecular weight of resin (13) measured by GPC was 8300. The NMR analysis revealed that the copolymerization ratio of b-butyl norbornenecarboxylate/norbornenecarboxylic acid butyrolactone ester/maleic anhydride was 42/8/50.

-continued

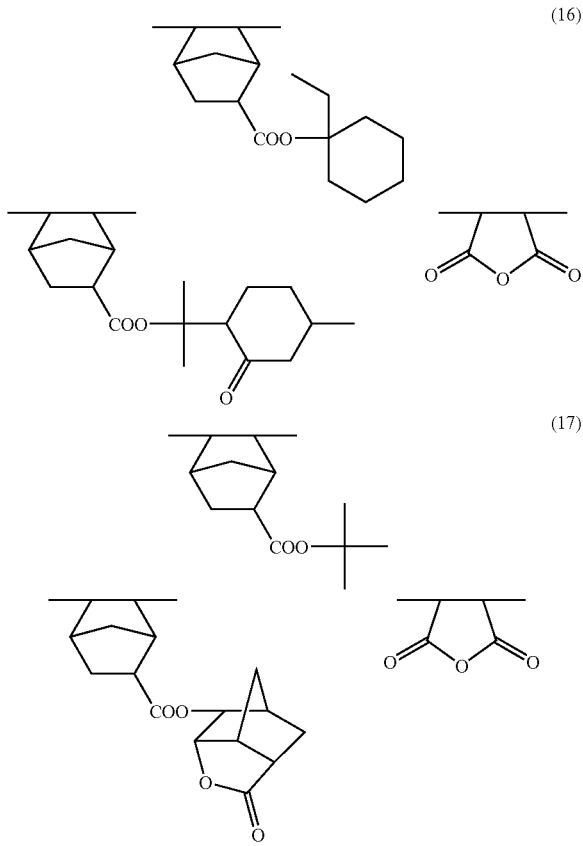

Synthesis Example 3

Synthesis of Resin (18) (Hybrid Type):

Norbornene, maleic anhydride, t-butyl acrylate, and 2-methylcyclohexyl-2-propyl acrylate were put into a reaction vessel at a molar ratio of 35/35/20/10 and dissolved in THF to prepare a 60% monomer solution. The solution was heated to 65° C. in a nitrogen stream. When a steady reaction temperature was reached, 1 mol %, based on the total monomers, of a radical initiator V-601 (from Wako Pure Chemical) was added to commence polymerization. After heating for 8 hours, the reaction mixture was diluted with a 2-fold volume of THF and poured into a 5-fold volume of hexane. The precipitated white powder was collected by filtration, dissolved in MEK, and re-precipitated in a 5-fold volume of a 1/1 mixture of hexane and t-butyl methyl ether. The precipitated white powder was collected by filtration and dried to give resin (18).

As a result of NMR analysis, the copolymerization ratio of norbornene/maleic anhydride/t-butyl acrylate/2-methyl-cyclohexyl-2-propyl acrylate was found to be 32/39/19/10 by mole. GPC analysis revealed that resin (18) had a polystyrene equivalent weight average molecular weight (Mw) of 12100.

Resins (19) to (24) were synthesized in the same manner as for resin (18). The copolymerization ratios and the molecular weights of resins (19) to (24) are shown in Table 3 below.

TABLE 3

| Resin | Norbornene Unit (mol %) | Acid Anhydride Unit (mol %) | (Meth)-acrylate Unit(s) (mol %) | Mw |
|---|---|---|---|---|
| 19 | 16 | 21 | 36/27 | 13900 |
| 20 | 15 | 22 | 34/29 | 12300 |
| 21 | 18 | 24 | 32/26 | 13000 |
| 22 | 15 | 20 | 29/10/26 | 13100 |
| 23 | 20 | 22 | 58 | 14700 |
| 24 | 23 | 28 | 35/14 | 13300 |

The structures of resins (18) to (24) are shown below.

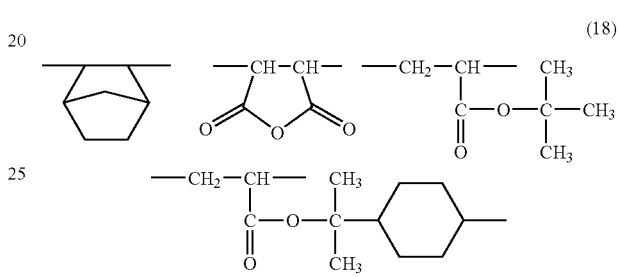

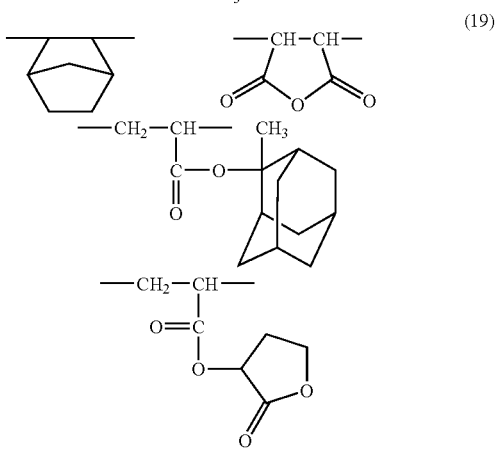

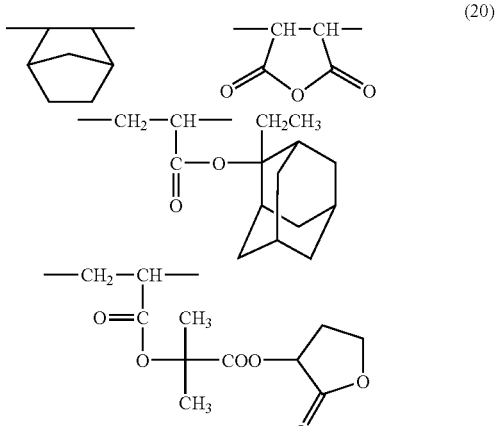

-continued

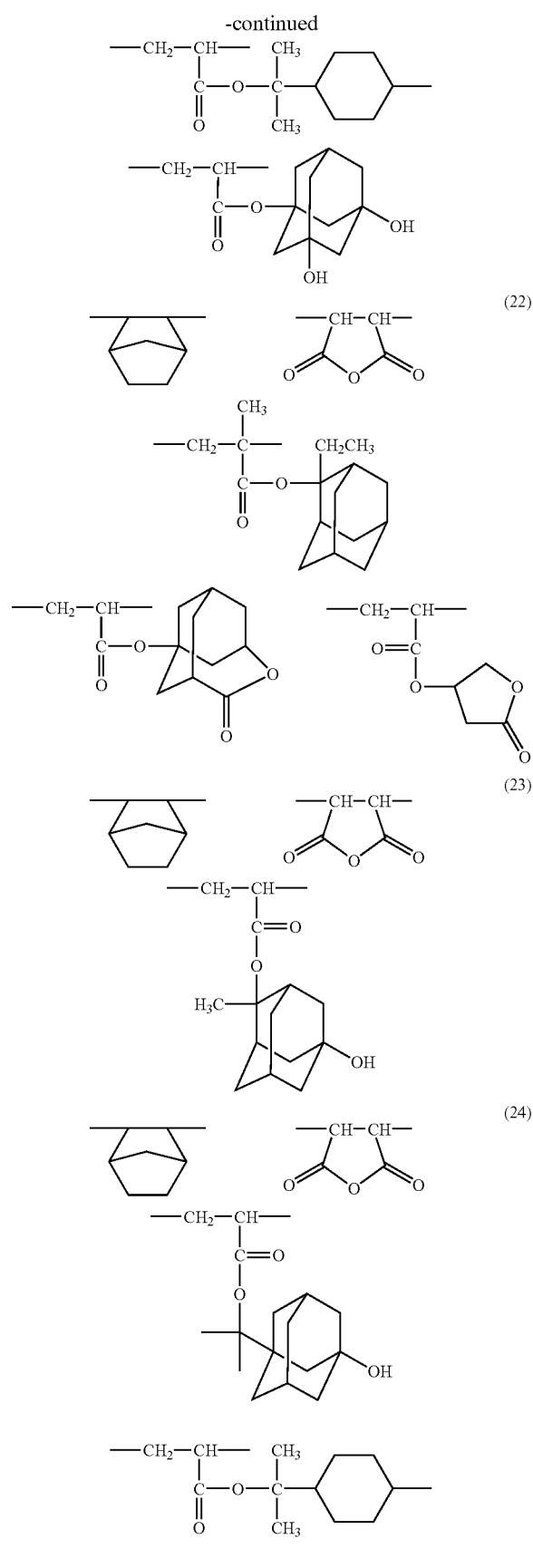

(22)
(23)
(24)

Synthesis Example 4

Synthesis of Resin (25) (Hybrid Type):

t-Butyl norbornenecarboxylate, maleic anhydride, 2-methyl-2-adamantyl acrylate, and norbornene lactone acrylate were put into a reaction vessel at a molar ratio of 20/20/35/25 and dissolved in a 1/1 (by weight) mixed solvent of MEK and THF to prepare a 60% monomer solution. The solution was heated to 65° C. in a nitrogen stream. When a steady reaction temperature was reached, 3 mol %, based on the total monomers, of a radical initiator V-601 (from Wako Pure Chemical) was added to commence polymerization. After heating for 12 hours, the reaction mixture was poured into a 5-fold volume of hexane. The precipitated white powder was again dissolved in a 1/1 (by weight) mixed solvent of MEK/THF, and re-precipitated in a 5-fold volume of a 1/1 mixture of hexane and t-butyl methyl ether. The precipitated white powder was collected by filtration. These purification operations were repeated, and the collected precipitate was dried to obtain resin (25).

As a result of NMR analysis, the copolymerization ratio of norbornene/maleic anhydride/2-methyl-2-adamantyl acrylate/norbornene lactone acrylate was found to be 18/23/34/25 by mole. GPC analysis (RI analysis) revealed that resin (25) had a polystyrene equivalent weight average molecular weight (Mw) of 11600.

Resins (26) to (31) were synthesized in the same manner as for resin (25). The copolymerization ratios and the molecular weights of resins (26) to (31) are shown in Table 4 below.

TABLE 4

| Resin | Norbornene Unit(s) (mol %) | Acid Anhydride Unit (mol %) | Acrylate Unit(s) (mol %) | Mw |
|---|---|---|---|---|
| 26 | 24 | 29 | 31/16 | 12300 |
| 27 | 31 | 35 | 21/13 | 9200 |
| 28 | 30/6 | 42 | 22 | 7700 |
| 29 | 38 | 42 | 15/5 | 9300 |
| 30 | 19 | 24 | 40/17 | 9500 |
| 31 | 29 | 32 | 34/5 | 10400 |

The structures of resins (25) to (31) are shown below.

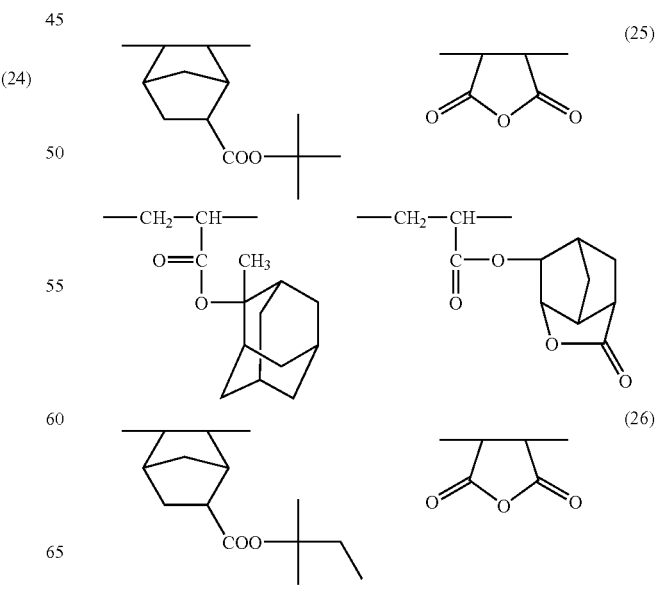

(25)
(26)

-continued

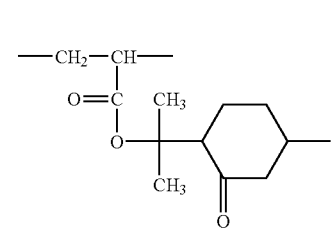
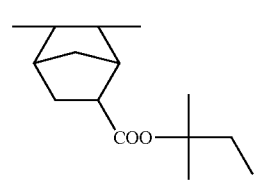
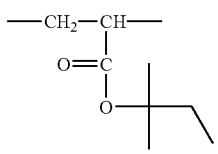

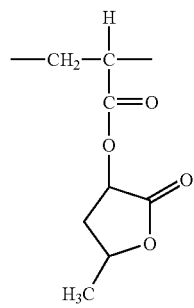
(27)
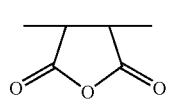
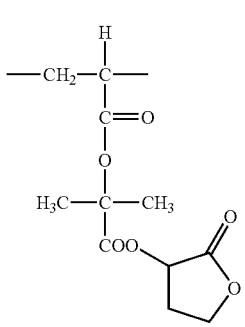
(28)

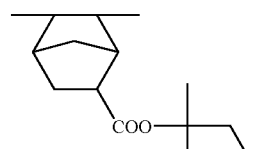
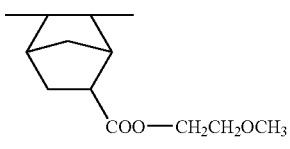
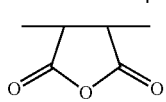
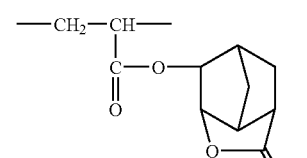
(29)
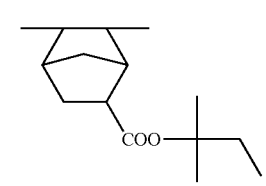
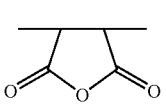
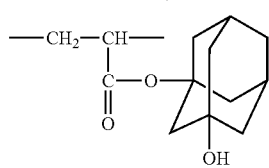
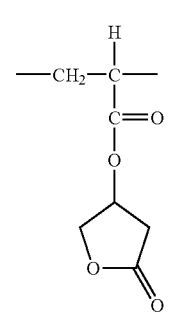

-continued

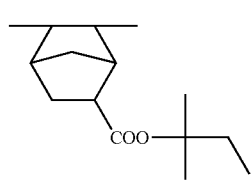
(30)
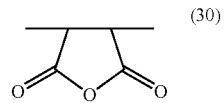
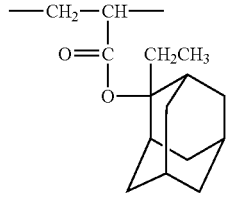
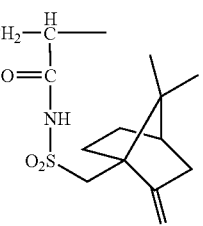

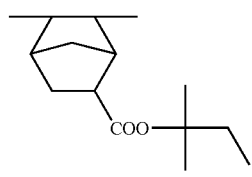
(31)
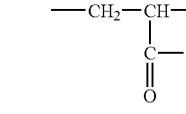
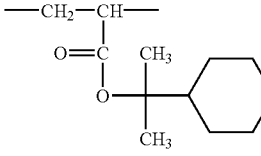
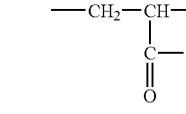
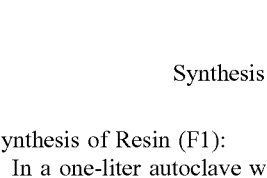

Synthesis Example 5

Synthesis of Resin (F1):

In a one-liter autoclave was charged a solution of 9.4 g (0.10 mol) of norbornene and 19.4 g (0.10 mol) of t-butyl norbornene-2-carboxylate in 150 ml of 1,1,2-trichlorotrifluoroethylene, and the autoclave was pressurized to 200 psi with nitrogen. To the mixture was added 20 g (0.20 mol) of tetrafluoroethylene, and the mixture was heated to 50° C. while stirring. A solution of 1.2 g of di(4-t-butylcyclohexyl) peroxydicarboxylate in 15 ml of 1,1,2-trichlorotrifluoroethylene was added to the reaction mixture over 20 minutes, followed by stirring for an additional 20 hour period. After completion of the reaction, the reaction mixture was poured into 2 liters of methanol with vigorous stirring. The precipitated white resin was collected by filtration and dried in vacuo to give 23.5 g of resin (F1).

As a result of GPC analysis, resin (F1) had a weight average molecular weight (Mw) of 6,200. $C^{13}$-NMR analysis revealed that the composition of resin (F1) was (F-1)/norbornene/(B-16)=45/30/25 by mole.

Synthesis Example 6

Synthesis of Resin (F2):

In 100 ml of MEK were dissolved 14.3 g (0.04 mol) of monomer (a) shown below, 3.9 g (0.04 mol) of maleic anhydride, and 2.6 g (0.02 mol) of t-butyl acrylate, and the solution was heated to 70° C. in a nitrogen stream. A 0.2 g portion of a polymerization initiator V-601 (from Wako Pure Chemical) was added to the mixture, followed by stirring for 3 hours. An additional 0.2 g portion of V-601 was added, and stirring was continued for 4 hours. The reaction mixture was poured into 1 liter of methyl t-butyl ether with vigorous stirring to precipitate a white resin, which was collected by filtration and dried in vacuo to give 12.1 g of resin (F2).

As a result of GPC analysis, resin (F2) had a weight average molecular weight (Mw) of 8,900. $C^{13}$-NMR analysis revealed that the composition of resin (F2) was (F-21)/maleic anhydride/(B-4)=39/38/23 by mole.

Monomer (a):

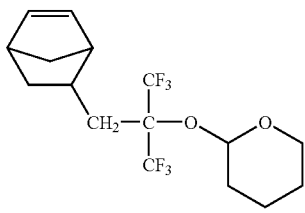

Synthesis Example 7

Synthesis of Resin (F3):

In 30 ml of 1-methoxy-2-propanol were dissolved 6.7 g (0.015 mol) of monomer (b) shown below, 1.4 g (0.006 mol) of 2-methyl-2-adamantyl methacrylate, and 1.8 g (0.009 mol) of mevalonic lactone methacrylate. A solution of 0.1 g of a polymerization initiator V-65 (from Wako Pure Chemical), 15.6 g (0.035 mol) of monomer (b), 3.3 g (0.014 mol) of 2-methyl-2-adamantyl methacrylate, and 4.2 g (0.021 mol) of mevalonic lactonemethacrylate in 70 ml of 1-methoxy-2-propanol was added dropwise to the solution at 70° C. over 2 hours in a nitrogen stream while stirring. After the dropwise addition, additional 0.1 g of the initiator was added to the mixture, followed by stirring for 2 hours. The reaction temperature was raised to 90° C., at which the stirring was continued for an additional 1 hour period. The reaction mixture was allowed to cool and then poured into 1 liter of a 1/1 mixture of ion-exchanged water and methanol with vigorous stirring to precipitate a white resin, which was collected by filtration and dried under reduced pressure to give 15.8 g of resin (F3).

As a result of GPC analysis, resin (F3) had a weight average molecular weight (Mw) of 10,200. $C^{13}$-NMR analysis revealed that resin (F3) had a composition of (F-30)/(B-7)/(B-11)=48/21/31 by mole.

Monomer (b):

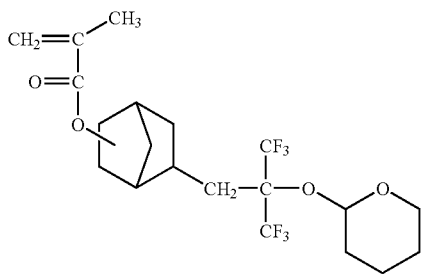

Resins (F4) to (F12) shown in Table 5 below were synthesized in the same manner as in Synthesis Examples 5 to 7.

TABLE 5

| Resin | Composition (units and molar ratio) | Mw |
|---|---|---|
| F4 | (F-1)/(B-20)/(B-23) = 45/25/30 | 5,800 |
| F5 | (F-1)/(F-21)/(B-16) = 48/33/19 | 4,500 |
| F6 | (F-22)/maleic anhydride/(B-8) = 42/39/19 | 8,700 |
| F7 | (F-30)/(F-48)/(B-2) = 42/17/41 | 12,600 |
| F8 | (F-50)/(B-7)/(B-11) = 31/35/34 | 9,200 |
| F9 | (F-55)/maleic anhydride/(B-4) = 40/37/23 | 7,400 |
| F10 | (F-16)/maleic anhydride/(B-8) = 43/34/23 | 6,300 |
| F11 | (F-26)/maleic anhydride/(B-12) = 40/33/27 | 8,900 |
| F12 | (F-31)/(F-42)/(B-8) = 44/18/38 | 11,600 |

Synthesis Example 8

Synthesis of Resin (F13):

In a one-liter autoclave were charged a solution of 9.4 g (0.10 mol) of norbornene and 35.8 g (0.10 mol) of monomer (a) (see Synthesis Example 6) in 150 ml of 1,1,2-trichlorotrifluoroethylene, and the autoclave was pressurized to 200 psi with nitrogen. To the mixture was added 20 g (0.20 mol) of tetrafluoroethylene, and the mixture was heated to 50° C. while stirring. A solution of 1.2 g of di(4-t-butylcyclohexyl) peroxydicarboxylate in 15 ml of 1,1,2-trichlorotrifluoroethylene was added to the reaction mixture over 20 minutes, followed by stirring for 20 hours. After completion of the reaction, the reaction mixture was poured into 2 liters of methanol with vigorous stirring. The precipitated white resin was collected by filtration and dried in vacuo to give 37.4 g of resin (F13).

As a result of GPC analysis, resin (F13) had a weight average molecular weight (Mw) of 8,800. $C^{13}$-NMR analysis revealed that the composition of resin (F13) was (F-1)/I(F-21)/norbornene=48/30/22 by mole.

Synthesis Example 9

Synthesis of Resin (F14):

Resin (F14) weighing 34.1 g was obtained in the same manner as in Synthesis Example 8, except for replacing monomer (a) with 32.2 g (0.04 mol) of monomer (c) shown below.

As a result of GPC analysis, resin (F14) had a weight average molecular weight (Mw) of 7,400. $C^{13}$-NMR analysis revealed that resin (F14) had a composition of (F-1)/I(F-15)/norbornene=49/25/26 by mole.

Monomer (c):

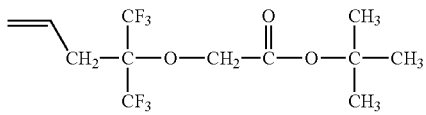

Resins (F15) to (F22) shown in Table 6 were synthesized in the same manner as in Synthesis Examples 8 and 9.

TABLE 6

| Resin | Composition (units and molar ratio) | Mw |
|---|---|---|
| F15 | (F-1)/(F-16)/norbornene = 45/26/29 | 8,700 |
| F16 | (F-1)/(F-20)/(B-4) = 48/30/22 | 9,300 |
| F17 | (F-2)/(F-22)/(B-4) = 42/39/19 | 7,900 |

TABLE 6-continued

| Resin | Composition (units and molar ratio) | Mw |
|---|---|---|
| F18 | (F-7)/(F-20)/norbornene = 35/33/32 | 6,400 |
| F19 | (F-12)/(F-21)/norbornene = 23/38/39 | 5,800 |
| F20 | (F-1)/(F-25)/(B-4) = 48/23/29 | 7,200 |
| F21 | (F-1)/(F-16)/(B-16) = 34/26/40 | 9,500 |
| F22 | (F-1)/(F-15)/(B-16)/norbornene = 38/21/21/20 | 10,900 |

Synthesis Example 10

Synthesis of Resin (F23):

In 100 ml of MEK were dissolved 14.3 g (0.04 mol) of monomer (a) (see Synthesis Example 6), 3.9 g (0.04 mol) of maleic anhydride, and 11.7 g (0.02 mol) of perfluorooctylethyl norbornene-2-carboxylate, and the solution was heated to 70° C. in a nitrogen stream. To the mixture was added 0.2 g of a polymerization initiator V-601 (from Wako Pure Chemical), followed by stirring for 3 hours. To the mixture was further added 0.2 g of V-601, and the stirring was continued for an additional 4 hour period. The reaction mixture was poured into 1 liter of methyl t-butyl ether while vigorously stirring to precipitate a white resin, which was collected by filtration and dried in vacuo to give 16.2 g of resin (F23).

The weight average molecular weight (Mw) of resin (F23) was found to be 8,700 by GPC analysis. As a result of $C^{13}$-NMR analysis, resin (23) was found to have a composition of (F-21)/(F-55)/maleic anhydride=42/18/40 by mole.

Synthesis Example 11

Synthesis of Resin (F24):

In 30 ml of 1-methoxy-2-propanol were dissolved 6.7 g (0.015 mol) of monomer (b) (see Synthesis Example 7), 2.7 g (0.005 mol) of perfluorooctylethyl methacrylate, 1.2 g (0.005 mol) of 2-methyl-2-adamantyl methacrylate, and 1.0 g (0.005 mol) of mevalonic lactone methacrylate. A solution of 0.1 g of a polymerization initiator V-65 (from Wako Pure Chemical), 15.6 g (0.035 mol) of monomer (b), 6.4 g (0.012 mol) of perfluorooctylethyl methacrylate, 2.8 g (0.012 mol) of 2-methyl-2-adamantyl methacrylate, and 2.4 g (0.012 mol) of mevalonic lactone methacrylate in 70 ml of 1-methoxy-2-propanol was added dropwise to the monomer solution at 70° C. over 2 hours in a nitrogen stream while stirring. After the dropwise addition, additional 0.1 g of the initiator was added to the mixture, followed by stirring for 2 hours. The reaction temperature was raised to 90° C., at which the stirring was continued for an additional 1 hour period. The reaction mixture was allowed to cool and then poured into 1 liter of a 1/1 mixture of ion-exchanged water and methanol with vigorous stirring to precipitate a white resin, which was collected by filtration and dried under reduced pressure to give 21.5 g of resin (F24).

As a result of GPC analysis, resin (F24) had a weight average molecular weight (Mw) of 10,500. $C^{13}$-NMR analysis revealed that resin (F24) had a composition of (F-30)/(F-48)/(B-7)/(B-11)=48/15/18/19 by mole.

Resins (F25) to (F32) shown in Table 7 below were synthesized in the same manner as in Synthesis Examples 10 and 11.

TABLE 7

| Resin | Composition (units and molar ratio) | Mw |
|---|---|---|
| F25 | (F-15)/(F-58)/maleic anhydride = 30/24/46 | 9,700 |
| F26 | (F-16)/(F-55)/(B-4)/maleic anhydride = 26/14/22/38 | 10,600 |
| F27 | (F-21)/(F-60)/(B-4)/maleic anhydride = 28/14/21/37 | 8,500 |
| F28 | (F-21)/(F-64)/maleic anhydride = 37/23/40 | 9,400 |
| F29 | (F-25)/(F-55)/(B-4)/maleic anhydride = 21/18/25/36 | 7,800 |
| F30 | (F-30)/(F-50)/(B-2)/(B-12) = 45/16/15/24 | 10,400 |
| F31 | (F-30)/(F-53)/(B-8)/(B-11) = 40/18/25/17 | 9,700 |
| F32 | (F-30)/(F-54)/(B-7)/(B-13) = 38/15/31/16 | 9,900 |

Synthesis Example 12

Synthesis of Resin (F33):

In 100 ml of N,N-dimethylacetamide were dissolved 13.5 g (0.05 mol) of 4-[bis(trifluoromethyl)hydroxymethyl]styrene and 3.4 g (0.05 mol) of methacrylonitrile, and the solution was heated to 70° C. in a nitrogen stream. To the solution was added 0.1 g of a polymerization initiator V-65 (from Wako Pure Chemical), followed by stirring for 3 hours. An additional 0.1 g amount of V-65 was added, followed by stirring for 4 hours. The reaction mixture was poured into 1 liter of methanol/methyl t-butyl ether with vigorous stirring to precipitate a white resin, which was collected by filtration and dried in vacuo. The resin was dissolved in 100 ml of THF, and 2.9 g (0.04 mol) of ethyl vinyl ether was added thereto, and a catalytic amount of p-toluenesulfonic acid was further added thereto. After stirring the mixture at room temperature for 8 hours, twice as much triethylamine as the p-toluenesulfonic acid catalyst was added to the reaction mixture to stop the reaction. The reaction mixture was poured into 3 liters of ultrapure water while vigorously stirring. The precipitated resin was collected by filtration and dried to give 14.1 g of resin (F33).

As a result of GPC analysis, resin (F33) was found to have a weight average molecular weight (Mw) of 10,900. $C^{13}$-NMR analysis revealed that resin (F33) had a composition of (F-39)/(F-42)/(C-10)=16/36/48 by mole.

Resins (F34) to (F40) shown in Table 8 below were synthesized in the same manner as in Synthesis Example 12.

TABLE 8

| Resin | Composition (units and molar ratio) | Mw |
|---|---|---|
| F34 | (F-39)/(F-41)/(C-10) = 14/38/48 | 11,100 |
| F35 | (F-44)/(C-10) = 53/47 | 9,800 |
| F36 | (F-42)/(C-12) = 55/45 | 10,700 |
| F37 | (F-39)/(F-43)/(C-10) = 13/39/48 | 12,600 |
| F38 | (F-1)/(F-21)/(C-5) = 40/35/25 | 6,800 |
| F39 | (F-19)/maleic anhydride/(C-8) = 35/33/32 | 8,300 |
| F40 | (F-1)/(B-4)/(C-8) = 43/34/23 | 7,400 |

Synthesis Example 13

Synthesis of Resin (F42):

In a 100 ml three-necked flask equipped with a reflux condenser and an inlet for nitrogen introduction were charged 4-(2-hydroxyhexanefluoroisopropyl)styrene (available from Central Glass Co., Ltd.) and 4-(1-methoxyethoxy)styrene (available from Tosoh Corp.) at a molar ratio of 50/50, and THF was added thereto to prepare 30 g of a 30 wt % monomer solution. The solution was heated to 65° C. in a nitrogen stream while stirring. A polymerization initiator V-65 (from Wako Pure Chemical) was added thereto in an amount of 5.0 mol % based on the total amount of the monomers, and the monomers were allowed to polymerize for 8 hours in a nitrogen stream while stirring. To the resulting reaction mixture was added 200 ml of hexane, and the precipitated resin was collected to give resin (F42). The copolymerization ratio of resin (F42) was found to be 49/51 by $C^{13}$-NMR analysis.

GPC analysis (in THF) of resin (F42). revealed that the polystyrene equivalent weight average molecular weight (Mw) was 10,200, the molecular weight distribution was 2.20, and the proportion of low-molecular components having Mw of 1000 or smaller was 15 wt %.

Resins (F41) to (F50) shown in Table 9 below were synthesized in the same manner as in Synthesis Example 13.

TABLE 9

| Resin | Composition (units and molar ratio) | Mw |
|---|---|---|
| F41 | (IIa-1)/(A-1) = 48/52 | 8,900 |
| F42 | (IIa-1)/(A-2) = 49/51 | 10,200 |
| F43 | (IIa-1)/(A-3') = 53/47 | 5,800 |
| F44 | (IIa-1)/(A-10) = 61/39 | 9,200 |
| F45 | (IIa-1)/(A-19) = 64/36 | 8,500 |
| F46 | (IIa-1)/(A-34) = 60/40 | 8,600 |
| F47 | (IIa-1)/(A-35) = 51/49 | 8,800 |
| F48 | (IIa-1)/(A-36) = 50/50 | 8,400 |
| F49 | (IIa-1)/(A-19) = 64/36 | 10,100 |
| F50 | (IIa-3)/(A-20) = 61/39 | 9,200 |

Synthesis Example 14

Synthesis of Resin (k-1):

In a flask, 100 g of poly-p-hydroxystyrene (VP15000, available from Nippon Soda Co., Ltd.) was dissolved in 400 g of propylene glycol monomethyl ether acetate (hereinafter, PGMEA), and the solution was distilled under reduced pressure to azeotropically remove water with PGMEA. After confirming that the water content was sufficiently reduced, 25.0 g of ethyl vinyl ether and 0.02 g of p-toluenesulfonic acid were added thereto, followed by stirring at room temperature for 1 hour. To the reaction mixture was added 0.03 g of triethylamine to stop the reaction. Water (400 ml) and ethyl acetate (800 ml) were added for liquid-liquid separation. The organic layer was washed with water and distilled under reduced pressure to remove ethyl acetate, water, and azeotropic PGMEA to give resin (k-1) (the structure is previously shown) in the form of a 30% solution in PGMEA.

Resins (k-2) to (k-15) (the structures are previously shown) were synthesized in the same manner as in Synthesis Example 14. The compositions and molecular weights of resins (k-1) to (k-15) are shown in Table 10 below, in which the order of the units are the same as in the respective structural formulae (left to right).

TABLE 10

| Resin | Mw | Composition |
|---|---|---|
| k-1 | 17,000 | 40/60 |
| k-2 | 17,000 | 27/73 |
| k-3 | 17,000 | 23/77 |
| k-4 | 17,000 | 35/65 |
| k-5 | 17,000 | 20/80 |

TABLE 10-continued

| Resin | Mw | Composition |
|---|---|---|
| k-6 | 17,000 | 35/55/10 |
| k-7 | 17,000 | 27/63/10 |
| k-8 | 17,000 | 18/72/10 |
| k-9 | 17,000 | 30/60/10 |
| k-10 | 17,000 | 20/75/5 |
| k-11 | 12,000 | 70/30 |
| k-12 | 13,000 | 10/60/30 |
| k-13 | 14,000 | 15/60/25 |
| k-14 | 17,000 | 35/65 |
| k-15 | 17,000 | 30/10/60 |

Examples 1 to 49 and Comparative Examples 1 to 10

According to the formulation shown in Tables 11 and 12 below, 1.03 g of a resin (B), an indicated amount of a photo-acid generator (A), 0.05 g of a compound (D), 1.65 mg of an organic basic compound (C), and 100 ppm, based on the total composition, of a surface active agent were compounded and dissolved in a 7/3 (by weight) mixed solvent of propylene glycol monomethyl ether acetate and propylene glycol monomethyl ether to make a 11 wt % solution. The solution was microfiltered through a membrane filter having an opening size of 0.1 µm to prepare a positive resist composition.

TABLE 11

| Example | Resin (B) | Photo-acid Generator (A) (mg) | Compound (D) | Basic Compound (C) | Surfactant |
|---|---|---|---|---|---|
| 1 | 1 | z34 (16) | D-1 | C-1 | W-1 |
| 2 | 2 | z34/z31 (16/32) | D-2 | C-2 | W-2 |
| 3 | 3 | z33 (16) | D-3 | C-3 | W-3 |
| 4 | 4 | z33 (20) | D-4 | C-4 | W-4 |
| 5 | 5 | z34 (16) | D-5 | c-5 | W-1 |
| 6 | 6 | z33/z40 (16/32) | D-6 | C-6 | W-2 |
| 7 | 7 | z14 (20) | D-7 | C-7 | W-3 |
| 8 | 8 | z33/z31 (16/32) | D-1 | C-8 | W-4 |
| 9 | 9 | z33/z31 (16/32) | D-2 | C-9 | W-1 |
| 10 | 10 | z33/z31 (16/32) | D-3 | C-2 | W-2 |
| 11 | 11 | z33/z31 (16/32) | D-4 | C-3 | W-3 |
| 12 | 12 | z33/Z31 (16/32) | D-5 | C-4 | W-4 |
| 13 | 13 | z33/z31 (16/32) | D-6 | C-10 | W-1 |
| 14 | 14 | z33/z31 (16/32) | D-7 | C-6 | W-1 |
| 15 | 15 | z33/z31 (16/32) | D-1 | C-7 | W-2 |
| 16 | 16 | z33/z31 (16/32) | D-2 | C-8 | W-3 |
| 17 | 17 | z13 (16) | D-3 | C-1 | W-4 |
| 18 | 18 | z13 (16) | D-4 | C-2 | W-1 |
| 19 | 19 | z13 (16) | D-5 | C-3 | W-2 |
| 20 | 20 | z13 (16) | D-6 | C-4 | W-3 |
| 21 | 21 | z13/z19 (20/40) | D-7 | C-5 | W-4 |
| 22 | 22 | z13/z29 (16/32) | D-1 | C-6 | W-1 |
| 23 | 23 | z3 (16) | D-2 | C-7 | W-2 |
| 24 | 24 | z13 (16) | D-3 | C-9 | W-1 |
| 25 | 25 | z5 (16) | D-4 | C-1 | W-2 |
| 26 | 26 | z5 (16) | D-5 | C-2 | W-3 |
| 27 | 27 | z5/z22 (16/32) | D-6 | C-3 | W-4 |
| 28 | 28 | z33/z26 (16/32) | D-7 | C-4 | W-1 |
| 29 | 29 | z33/z27 (16/32) | D-1 | C-5 | W-2 |
| 30 | 30 | z13/z27 (16/48) | D-2 | C-10 | W-3 |
| 31 | 31 | z33/z31 (16/32) | D-3 | C-7 | W-4 |
| 32 | l-1 | PAG2-1 (24) | D-1 | C-8 | W-1 |
| 33 | k-2 | PAG2-3 (24) | D-2 | C-1 | W-2 |
| 34 | l-3 | PAG2-4 (24) | D-3 | C-2 | W-3 |
| 35 | k-4 | PAG2-26 (24) | D-4 | C-3 | W-4 |
| 36 | k-5 | PAG2-29 (24) | D-5 | C-4 | W-1 |
| 37 | k-8 | PAG2-3/PAG2-24 (24/12) | D-6 | C-7 | W-2 |

TABLE 11-continued

| Example | Resin (B) | Photo-acid Generator (A) (mg) | Compound (D) | Basic Compound (C) | Surfactant |
|---|---|---|---|---|---|
| 38 | k-9 | PAG2-4/PAG5-3 (24/24) | D-7 | C-8 | W-3 |
| 39 | k-10 | PAG2-18/PAG5-3 (24/24) | D-1 | C-1 | W-4 |
| 40 | k-11 | PAG2-21/PAG6A-1 (24/24) | D-2 | C-2 | W-1 |
| 41 | k-12 | PAG2-23/PAG6A-23 (24/12) | D-3 | C-3 | W-2 |
| 42 | k-13 | PAG2-1/PAG6A-10 (24/24) | D-4 | C-4 | W-3 |
| 43 | F1 | z34/z31 (16/32) | D-1 | C-6 | W-1 |
| 44 | F27 | z33 (20) | D-2 | C-4 | W-2 |
| 45 | F42 | z33/z31 (16/32) | D-3 | C-7 | W-3 |
| 46 | F50 | z13 (16) | D-4 | C-1 | W-4 |
| 47 | F25 | z13/z19 (20/40) | D-5 | C-3 | W-2 |
| 48 | F33 | PAG2-1/PAG2-30 (24/12) | D-6 | C-2 | W-3 |
| 49 | F18 | PAG2-1 (24) | D-7 | C-9 | W-1 |

TABLE 12

| Compara. Example | Resin (B) | Photo-acid Generator (A) (mg) | Compound (D) | Basic Compound (C) | Surfactant |
|---|---|---|---|---|---|
| 1 | 10 | z33/z31 (16/32) | — | C-2 | W-2 |
| 2 | 11 | z33/z31 (16/32) | — | C-3 | W-3 |
| 3 | 12 | z33/z31 (16/32) | — | C-4 | W-4 |
| 4 | 13 | z33/z31 (16/32) | — | C-5 | W-1 |
| 5 | k-1 | PAG2-1 (24) | — | C-8 | W-1 |
| 6 | k-8 | PAG2-3/PAG2-24 (24/6) | — | C-7 | W-2 |
| 7 | k-12 | PAG2-23/PAG6A-23 (24/12) | — | C-3 | W-2 |
| 8 | F1 | z34/z31 (16/32) | — | C-7 | W-3 |
| 9 | F27 | z33 (20) | — | C-1 | W-4 |
| 10 | F42 | PAG2-1 (24) | — | C-3 | W-2 |

The components (D) and (C), and the surfactants used in Examples and Comparative Examples were as follows.

Component (D):
D-1: Threitol
D-2: Sorbitol
D-3: Mannitol
D-4: Deoxyribulose

D-5:

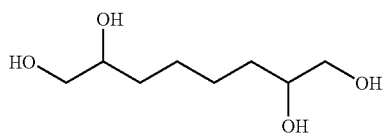

D-6:

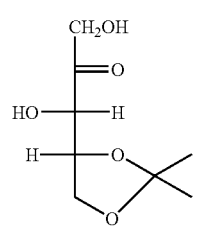

D-7:

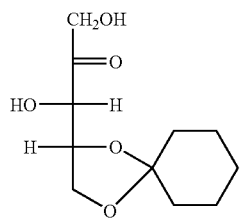

Component (C) (Basic Compound):
C-1: 1,5-Diazabicyclo[4.3.0]-5-nonene
C-2: 1,8-Diazabicyclo[5.4.0]-7-undecene
C-3: 4-Dimethylaminopyridine
C-4: Triphenylimidazole
C-5: Diisopropylaniline
C-6: Tributylamine
C-7: Trioctylamine
C-8: Tridodecylamine
C-9: N,N-Bis(hydroxyethyl)aniline
C-10: 2,2,6,6-Tetramethyl-4-hydroxypiperidine Surface Active Agent:
W-1: Megafac F176 (F-containing surface active agent available from Dainippon Ink & Chemicals Inc.)
W2: Megafac R08 (F- and Si-containing surface active agent from Dainippon Ink & Chemical)
W3: Polysiloxane KP-341 (Si-containing surface active agent from Shin-Etsu Chemical Co., Ltd.)
W4: Troy Sol S-366 (from Troy Chemical Industries, Inc.).

An antireflective coating ARC-25 (available from Brewer Science Ltd.) was applied to a silicon wafer with a spin coater to a coating thickness of 30 nm and dried. The positive resist composition prepared was applied to the antireflective coat and dried at 115° C. for 90 seconds to form a resist film having a thickness of about 0.4 µm.

The resist film on the wafer was exposed to ArF excimer laser light(193 nm) (in Examples 1 to 31 and Comparative Examples 1 to 4), KrF excimer laser light (248 nm) (in Examples 32 to 39 and Comparative Examples 5 and 6), an electron beam (in Examples 40 to 42 and Comparative Example 7), or F2 excimer laser light (157 nm) (in Examples 43 to 49 and Comparative Examples 8 to 10). After post-exposure baking at 115° C. for 90 seconds, the resist film was developed with a 2.38% tetramethylammonium hydroxide developing solution, rinsed with distilled water, and dried to form a resist pattern. The resist pattern profile was evaluated in terms of LER and pattern collapse as follows. The results of evaluation are shown in Table 13.

1) LER

A critical dimension scanning electron microscope (CD-SEM) was used. Irregularity of a single isolated pattern (line width: 0.15 µm) was measured at more than one points within the monitoring area. A variance ($3\sigma$) of the positions was taken as an indication of LER. A smaller $3\sigma$ value means smaller LER.

2) Pattern Collapse

The pattern profile was observed under a scanning electron microscope. A pattern suffering no or little collapse was rated "good", while a pattern suffering collapse was rated "no good".

TABLE 13

| Example | LER (nm) | Pattern Collapse |
|---|---|---|
| 1 | 4.2 | good |
| 2 | 3.9 | good |
| 3 | 4.1 | good |
| 4 | 3.8 | good |
| 5 | 7.1 | good |
| 6 | 4.3 | good |
| 7 | 4.8 | good |
| 8 | 4.2 | good |
| 9 | 3.9 | good |
| 10 | 4.2 | good |
| 11 | 4.4 | good |
| 12 | 7.2 | good |
| 13 | 3.9 | good |
| 14 | 4.2 | good |
| 15 | 4.2 | good |
| 16 | 4.4 | good |
| 17 | 4.1 | good |
| 18 | 4.2 | good |
| 19 | 7.1 | good |
| 20 | 3.9 | good |
| 21 | 3.9 | good |
| 22 | 4.2 | good |
| 23 | 4.3 | good |
| 24 | 4.1 | good |
| 25 | 4.3 | good |
| 26 | 7.1 | good |
| 27 | 4.2 | good |
| 28 | 4.2 | good |
| 29 | 4.4 | good |
| 30 | 4.5 | good |
| 31 | 3.9 | good |
| 32 | 4.2 | good |
| 33 | 4.5 | good |
| 34 | 4.2 | good |
| 35 | 4.4 | good |
| 36 | 7.1 | good |
| 37 | 4.1 | good |
| 38 | 4.3 | good |
| 39 | 4.2 | good |
| 40 | 4.4 | good |
| 41 | 4.1 | good |
| 42 | 4.2 | good |
| 43 | 6.1 | good |
| 44 | 5.9 | good |
| 45 | 6.3 | good |
| 46 | 6.2 | good |
| 47 | 8.2 | good |
| 48 | 5.9 | good |
| 49 | 6.0 | good |
| Comparative Example | | |
| 1 | 13.5 | no good |
| 2 | 14.1 | no good |
| 3 | 13.9 | no good |
| 4 | 14.2 | no good |
| 5 | 13.8 | no good |
| 6 | 14.2 | no good |
| 7 | 14.1 | no good |
| 8 | 15.2 | no good |
| 9 | 14.9 | no good |
| 10 | 15.3 | no good |

As is apparent from the results in Table 13, the positive resist compositions of the present invention are excellent in providing a resist profile with reduced LER and reduced pattern collapse.

The present invention provides a positive resist composition which forms a resist pattern with reduced LER and reduced pattern collapse.

This application is based on Japanese Patent application JP 2002-74565, filed Mar. 18, 2002, the entire content of which is hereby incorporated by reference, the same as if set forth at length.

What is claimed is:

1. A positive resist composition comprising:
   (A) a compound capable of generating an acid on exposure to active light rays or a radiation;
   (B) a resin which is insoluble or sparingly soluble in an alkali and becomes alkali-soluble by an action of an acid; and
   (D) an acyclic saccharide derivative having at least three groups selected from a hydroxyl group and a hydroxyl group substituted with an acid decomposable group;
   wherein the resin (B) has a structure represented by formula (pA)

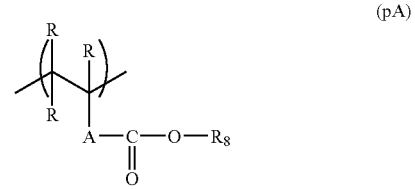

(pA)

wherein a plurality of R groups, which may be the same or different, each represents a hydrogen atom, a halogen atom or a substituted or un-substituted straight-chain or branched alkyl group having 1 to 4 carbon atoms; A represents a single bond or one of, or a combination of two or more of, an alkylene group, a substituted alkylene group, an ether group, a thioether group, a carbonyl group, an ester group, an amide group, a sulfonamide group, a urethane group, and a urea group; and Ra represents any one of the structures represented by formula (pI) to (pVI):

(pI)

(pII)

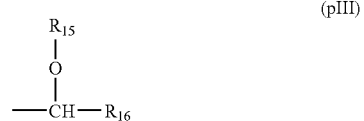

(pIII)

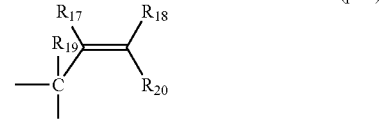

(pIV)

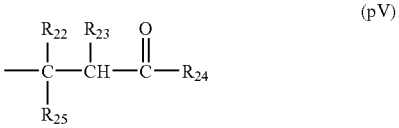

(pV)

-continued

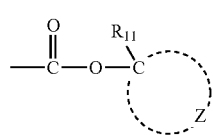

(pVI)

wherein $R_{11}$ represents a methyl group, an ethyl group, an n-propyl group, an isopropyl group, an n-butyl group, an isobutyl group or a sec-butyl group; Z represents an atomic group necessary to form an alicyclic hydrocarbon group together with the adjacent carbon atom; $R_{12}$, $R_{13}$, $R_{14}$, $R_{15}$, and $R_{16}$ each represents a straight-chain or branched alkyl group having 1 to 4 carbon atoms or an alicyclic hydrocarbon group, provided that at least one of $R_{12}$, $R_{13}$, and $R_{14}$ and at least one of $R_{15}$ and $R_{16}$ represents an alicyclic hydrocarbon group; $R_{17}$, $R_{18}$, $R_{19}$, $R_{20}$, and $R_{21}$ each represents a hydrogen atom, a straight-chain or branched alkyl group having 1 to 4 carbon atoms or an alicyclic hydrocarbon group, provided that at least one of $R_{17}$, $R_{18}$, $R_{19}$, $R_{20}$, and $R_{21}$ represents an alicyclic hydrocarbon group and that at least one of $R_{19}$ and $R_{21}$ represents a straight-chain or branched alkyl group having 1 to 4 carbon atoms or an alicyclic hydrocarbon group; and $R_{22}$, $R_{23}$, $R_{24}$, and $R_{25}$ each represents a straight-chain or branched alkyl group having 1 to 4 carbon atoms or an alicyclic hydrocarbon group, provided that at least one of $R_{22}$, $R_{23}$, $R_{24}$, and $R_{25}$ represents an alicyclic hydrocarbon group; and $R_{23}$, and $R_{24}$ may be connected together to form a ring.

2. The positive resist composition according to claim 1, wherein the resin (B) has a structure comprising a fluorine atom substituting at least one of a main chain and a side chain of a polymer skeleton and decomposes by an action of an acid to increase its solubility in an alkali developing solution.

3. The positive resist composition according to claim 1, which further comprises (C) a basic compound.

4. The positive resist composition according to claim 1, which further comprises (E) a surface active agent comprising at least one of fluorine and silicon.

5. The positive resist composition according to claim 1, which further comprises (F) a mixed solvent comprising a solvent having a hydroxyl group and a solvent free from a hydroxyl group.

6. The positive resist composition according to claim 1, wherein the acid decomposable group is selected from the group consisting of an acetal group, isopropylidene group and a cyclohexylidene group.

7. The positive resist composition according to claim 1, wherein the acid decomposable group is selected from the group consisting of an isopropylidene group and a cyclohexylidene group.

8. A positive resist composition comprising:
(A) a compound capable of generating an acid on exposure to active light rays or a radiation;
(B) a resin which is insoluble or sparingly soluble in an alkali and becomes alkali-soluble by an action of an acid, said resin having a structure comprising a fluorine atom substituting at least one of a main chain and a side chain of a polymer skeleton and decomposing by an action of an acid to increase its solubility in an alkali developing solution; and
(D) an acyclic saccharide derivative having at least three groups selected from a hydroxyl group and a hydroxyl group substituted with an acid decomposable group.

9. The positive resist composition according to claim 8, which further comprises (C) a basic compound.

10. The positive resist composition according to claim 8, which further comprises (E) a surface active agent comprising at least one of fluorine and silicon.

11. The positive resist composition according to claim 8, which further comprises (F) a mixed solvent comprising a solvent having a hydroxyl group and a solvent free from a hydroxyl group.

12. The positive resist composition according to claim 8, wherein the acid decomposable group is selected from the group consisting of an acetal group, isopropylidene group and a cyclohexylidene group.

13. The positive resist composition according to claim 8, wherein the acid decomposable group is selected from the group consisting of an isopropylidene group and a cyclohexylidene group.

* * * * *